(12) United States Patent
Kamigaki et al.

(10) Patent No.: US 6,894,344 B2
(45) Date of Patent: May 17, 2005

(54) SEMICONDUCTOR INTEGRATED CIRCUIT HAVING TWO SWITCH TRANSISTORS FORMED BETWEEN TWO DIFFUSION-LAYER LINES

(75) Inventors: Yoshiaki Kamigaki, Tokorozawa (JP); Shinichi Minami, Kodaira (JP); Kozo Katayama, Kokubunji (JP); Masataka Kato, Koganei (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/663,779

(22) Filed: Sep. 17, 2003

(65) Prior Publication Data

US 2004/0070026 A1 Apr. 15, 2004

Related U.S. Application Data

(63) Continuation of application No. 10/377,785, filed on Mar. 4, 2003, now Pat. No. 6,674,122, which is a continuation of application No. 09/660,923, filed on Sep. 13, 2000, now Pat. No. 6,531,735.

(30) Foreign Application Priority Data

Sep. 17, 1999 (JP) .......................................... 11-263154
Sep. 17, 1999 (JP) .......................................... 11-263155
Mar. 21, 2000 (JP) ........................................ 2000-83246

(51) Int. Cl.⁷ .................................................. H01L 29/792
(52) U.S. Cl. ...................................... 257/324; 257/314
(58) Field of Search .................................. 257/314, 315, 257/316, 317, 318, 319, 320, 321, 322, 323, 324, 325, 32

(56) References Cited

U.S. PATENT DOCUMENTS

| | | | |
|---|---|---|---|
| 4,185,318 A | | 1/1980 | Engeler et al. |
| 4,527,259 A | * | 7/1985 | Watanabe |
| 4,554,643 A | | 11/1985 | Kuo |
| 4,868,632 A | * | 9/1989 | Hayashi et al. |
| 5,357,134 A | | 10/1994 | Shimoji |
| 5,408,115 A | | 4/1995 | Chang |
| 5,467,308 A | | 11/1995 | Chang et al. |
| 5,763,308 A | | 6/1998 | Choi |
| 5,768,192 A | | 6/1998 | Eitan |
| 5,859,459 A | | 1/1999 | Ikeda |
| 5,877,523 A | | 3/1999 | Liang et al. |
| 5,923,978 A | | 7/1999 | Hisamune |
| 6,348,387 B1 | | 2/2002 | Yu |
| 6,563,151 B1 | | 5/2003 | Shin et al. |

FOREIGN PATENT DOCUMENTS

EP 0 464664 1/1992

OTHER PUBLICATIONS

International Conference on Solid State Devices and Materials, Tokyo, 1999, pp. 522–523.
IEEE Transactions on Components, Packaging, and Manufacturing Technology—Part A, vol. 20, No. 2, Jun. 1997, pp. 182–189.
IEEE Electron Device Letters, vol. 19, No. 7, Jul. 1998, pp. 253–255.
IEDM 94, pp. 57–60.

* cited by examiner

*Primary Examiner*—Nathan J. Flynn
*Assistant Examiner*—Kevin Quinto
(74) *Attorney, Agent, or Firm*—Mattingly, Stanger, Malur & Brundidge, P.C.

(57) ABSTRACT

A multi-storage nonvolatile memory of high density, high speed and high reliability has a memory transistor and switch transistors disposed on both the sides of the memory transistor. The memory transistor includes a gate insulating film having discrete traps and a memory gate electrode, whereas the switch transistors include switch gate electrodes. The gate insulating film has the discrete traps for storing information charge, can locally inject carriers, and one memory cell constitutes a multi-storage cell for storing at least information of 2 bits. The switch transistors having the switch gate electrodes realize source side injection. The memory transistor is formed together with the switch transistors in self-aligned diffusion. The memory gate electrode of the memory transistor is connected to a word line so as to perform word-line erase.

6 Claims, 68 Drawing Sheets

(A)

(D)

FIG. 53
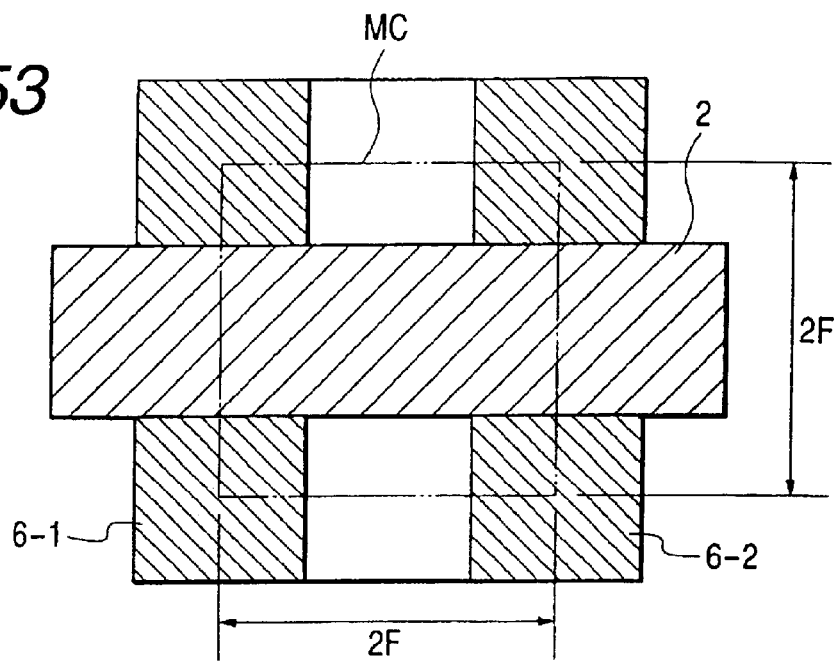
FIG. 54 ERASE (PAGE)
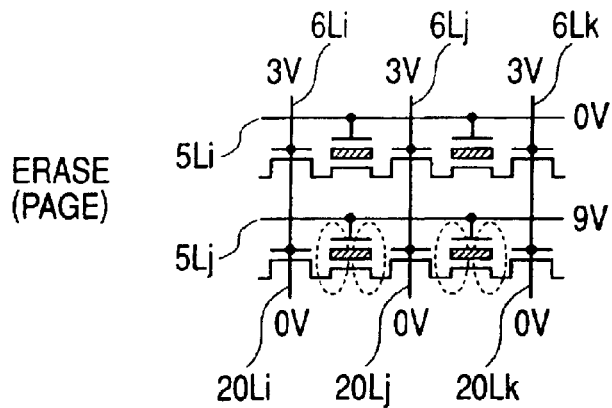
FIG. 55 ERASE (CHIP)
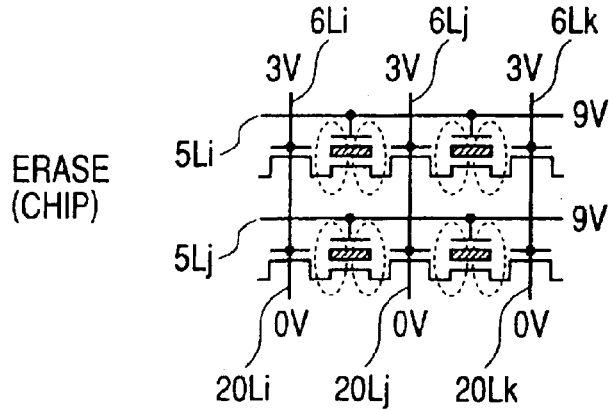

WRITE

READ (A)

(A)

(B)

(C)

(C)

(D)

ERASE (PAGE)

ERASE (CHIP)

SSI-WRITE

SSI-READ

DSI-WRITE

DSI-READ (A)

(A)

(B)

(C)

(D)

(A&B)

(A&B)

(C&D)

(C&D)

SEMICONDUCTOR INTEGRATED CIRCUIT HAVING TWO SWITCH TRANSISTORS FORMED BETWEEN TWO DIFFUSION-LAYER LINES

This is a continuation of application U.S. Ser. No. 10/377,785, filed Mar. 4, 2003 now U.S. Pat. No. 6,674,122 (now allowed) which is a continuation of U.S. Ser. No. 09/660,923, filed Sep. 13, 2000 (now U.S. Pat. No. 6,531,735).

BACKGROUND OF THE INVENTION

The present invention relates to a nonvolatile semiconductor memory device having multi-storage nonvolatile memory cells in which one memory cell transistor can store information of at least two bits, and further to a semiconductor integrated circuit such as a microcomputer and the like containing the nonvolatile semiconductor memory device.

A typical nonvolatile semiconductor memory device having nonvolatile memory cells is an EEPROM (electrically erasable and programmable read only memory), which can electrically perform program in a byte unit, or a block electrically erasable flash memory.

Any of the nonvolatile semiconductor memory devices is utilized in memory cards which can be easily carried and in devices which can be operated from a remote site, and the like because they can hold memory information without the supply of power, and they act as a data storage, a program storage and the like to store information in a nonvolatile fashion as the initial setting of the operation of the device.

While nonvolatile semiconductor memory devices have been widely used in the filed of computers, communication equipment, controllers, OA (office automation) equipment, consumer equipment and so on, recently, they are particularly applied to portable communication equipment, IC cards used as bank terminals, image storing mediums of camera and the like. As the markets for them are expanded and the systems therefor are developed, a higher programming speed, high density, and high multi-function are required to the nonvolatile semiconductor memory devices.

A conventional nonvolatile semiconductor memory device, that is, a conventional EEPROM and a conventional flash memory will be compared with each other.

Since the memory cell of the EEPROM often includes of two transistors, that is, a memory transistor such as a MNOS and the like and a switch transistor, it is suitable for multi-function while it is not suitable for high density. In contrast, since the memory cell of the flash memory includes only one transistor, it is suitable for high density while it is not suitable for multi-function. Thus, it can be said that the EEPROM and the flash memory are separately used in a field in which they can be advantageously used from the structure thereof.

As to a programming speed, both the EEPROM and the flash memory conventionally require about milliseconds because both of them employ any of a tunnel programming method and a hot-carrier programming method. The programming speed is incommensurably long as compared with a processing time of about nanoseconds required by CPUs (central processing units).

Since a memory cell, which aims at the same direction as the gist of the present invention, has been proposed, the structure of a memory cell which corresponds to the structure of the above memory cell will be shown in FIGS. 3 to 5 and an operation bias of a memory cell array is shown in FIGS. 6 to 9, prior to the description of the memory cell which will be provided by the inventors. While the structure of the memory cell shown in FIGS. 3 to 5 was presented by Dr. Nissan-Cohen in the invited talk of "Semiconductor Interface Specialist Conference: SISC, San Diego", in December 1998, it is not recorded as a document at present. The overall structure of the memory cell was clarified to the attendants by Dr. Boaz Eitan in the invited talk of "International Conference on Solid State Devices and Materials: SSDM, Tokyo", in September 1999 and the memory cell is called a NROM.

To describe the principle and operation of the memory, the memory includes one transistor type nonvolatile semiconductor memory including a gate insulating film having discrete traps, program is locally performed to the discrete traps by so-called hot carrier injection at a drain edge and read is performed utilizing charge trapped by the program as the source side of a transistor. That is, program and read are carried out by reversing a direction in which a current flows to the memory transistor (reverse read) as shown in FIG. 3. More specifically, in the operation of the memory transistor, the function of a source line is interchanged with the function of a bit line between program and read. Further, since program is locally performed to the discrete traps as shown in FIG. 4, it is possible to provide another edge in the channel of the memory transistor with a memory function in the same way. That is, another information is stored by completely reversing the operating direction of the memory transistor, whereby a so-called two bits/one transistor type high density memory cell can be realized. At present, a silicon nitride film is utilized as a material of the gate insulating film having the discrete traps. As shown in FIG. 5, when a technology feature size is represented by F, a size of a cell including the memory transistors may be regarded as $2F^2$ per bit while the size is $4F^2$ per transistor. It can be said that a dramatically high density is realized thereby when it is compared with a conventional flash memory which is said to be suitable for high density while it has a size per bit of $6F^2$ to $10F^2$.

Further, FIGS. 6 to 9 show a memory cell array and the erase, program and read operation biases thereof.

As to the erase, FIG. 6 shows word-line page erase and FIG. 7 shows block-area chip erase. The erase is performed in such a manner that a high voltage of 8 V is applied to a bit line diffusion layer, thereby. causing so-called band-to-band tunneling and injecting holes. While FIGS. 6 and 7 show that only one of the edges of a channel is erased, it is possible to simultaneously erase both the edges of the channel.

FIG. 8 shows programming. Carriers (electrons), which have been made hot in the channel, are injected in a gate direction at a drain edge and are captured by the discrete traps in a gate insulating film. At this time, since the electrons are injected only into a very small region, charge for detection is approximately one-hundredth that of a conventional flash memory having a conductive poly silicon floating gate in a gate insulation layer as a charge storing section, which leads to reduction of a programming time. Accordingly, even if hot carriers are injected, high speed programming can be realized. Further, the insulating film is less degraded by program by the reduced amount of the injected charge. Furthermore, even if the insulating film is degraded, the charge only leaks from the spatial discrete traps of the portion of the insulating film where the degradation occurs and an amount of stored charge is not influenced thereby. Therefore, it is difficult for data retention characteristics to be subjected to attenuation by programming, whereby the reliability of a nonvolatile memory can be more improved.

Next, FIG. 9 shows a read operation. While read is carried out by detecting an amount of a channel current which depends on whether program is performed or not, an amount of the channel current of a transistor is regulated at a source edge. After all, whether program is carried out or not can be most sensitively detected when read is performed utilizing a side to be detected as a source edge. Therefore, it is preferable to employ reverse read in which a current direction in read is reversed from that during program.

Note that when information of 2 bits is stored in a one transistor type nonvolatile semiconductor memory and the presence or absence of program at both the edges of a channel is detected by reversing the operating direction of the memory each other, there arises a problem in a read margin for identifying a signal for two bits. In read, it cannot be avoided that a current-detection method of determining "1" and "0" of the signal by a magnitude of a current is employed and that a signal detection margin is narrowed because information of one of the bits affects a detected current. A report on analysis of the margin is found in Martino Lorenzini et al., "A Dual Gate Flash EEPROM Cell with Two-Bit Storage Capacity", IEEE Transactions on Components, Packaging, and Manufacturing Technology Part A, vol. 20, p 182–189, (1997).

As to program, while the method of injecting charge into the discrete traps in the gate insulating film of a drain side by channel hot electrons was described in FIG. 8, a method of injecting charge to the discrete traps in the gate insulating film of a source side will be described below as another method. An example, in which carrier charge is programmed to the discrete traps in a silicon nitride film by source side injection (SSI), is found in Kuo-Tung Chang et al., "A New SONOS Memory Using Source-Side Injection for Programming", IEEE Electron Device Letters, vol 19, p 253–255 (1998). FIG. 10 shows a cross section of the device.

The structure of the device is such that a memory transistor is formed on the gate electrode side of a selection transistor by a side wall gate technology. Hot carriers, which have been generated by being accelerated by a drain voltage 5 V in the channel of the selection transistor, behave such that at the moment the hot carriers are injected into the channel of a memory transistor, the hot carriers sense a high electric field (12 V) toward the gate direction at the source side of the memory transistor, are injected in a direction of the gate electrode and are captured by the discrete traps in a gate insulating film. At this time, a gate potential of the selection transistor is set slightly higher (1 V) than a threshold voltage and a channel current is in the saturated region of a low current. The hot carriers generated from a low current are effectively captured by the discrete traps in the gate insulating film. When the source side injection is compared with drain side injection by channel hot electrons as to an amount of channel current necessary to program, an amount of the channel current necessary to program in the source side injection is about one-thirtieth that in the drain side injection whereby reliability can be improved by the reduction of a programming time and an increase in the number of programming so that a programming system by the source side injection is effective. While the selection transistor (switch transistor) must be assembled in a memory cell in the source side injection, a problem resides in that how an increase in cell area can be suppressed.

An example of a memory cell of high density, in which a selection transistor (switch transistor) is assembled in a memory cell, will be described in relation to the present invention. There will be described the 2-bit/cell type high density nonvolatile semiconductor memory device shown in FIG. 11 in which it is possible for one cell to have information of two bits by a dual way operation and one cell has two memory transistors, one switch transistor, and two diffusion-layer lines. The structure of the memory cell (DSG cell) exemplified in FIG. 11 was made distinct by Yale Ma et al., "A Dual-Bit Split-Gate EEPROM (DSG) Cell in Contactless Array for Single-Vcc High Density Flash Memories", IEDM 94, pp 57–60, the proceeding of "International Electron Device Meeting (IEDM)", 1994.

The 2-bit/cell type high density nonvolatile semiconductor memory device (DSG cell) shown in FIG. 11 is arranged such that two memory cell transistors having poly-silicon floating gate electrodes 2'-1 and 2'-2 and control gate electrodes 3-1 and 3-2 are formed on a silicon substrate 1, diffusion layers 4-1 and 4-2, which are connected to a source line/bit line, are formed externally of the memory transistors, and a switch transistor, which has a switch gate electrode 8 to be connected to a word line 5, is formed between the two memory transistors. The two memory transistors share the one switch transistor that is formed therebetween by self-aligned diffusion, whereby it is taken into consideration not to increase the area thereof. Since the 2-bit/cell has such a structure that contact holes for metal lines are not formed in a memory cell array, the 2-bit/cell realizes high density with a 1.5 transistor per bit arranged by the self-aligned diffusion.

When the 2-bit/cell type high density nonvolatile semiconductor memory device (DSG cell) carries out program and read to the 2-bit memory in the one cell of FIG. 11, a direction of a current flowing in a channel for one bit is reversed with respect to that for the other bit. Memory information of 2 bits is stored in the different memory transistors. That is, operations for storing 2 bits in one cell are carried out in opposite directions symmetrically. While program is carried out by a hot carrier programming method, a high electric field can be realized also in a gate direction in addition to a conventional channel direction by the action of the switch transistor, whereby high speed can be realized by program performed by so-called source-side injection.

Further, the 2-bit/cell type high density nonvolatile semiconductor memory device (DSG cell) performs erase by a method of drawing out electrons from floating gate electrodes 2'-1 and 2'-2 by a high electric field applied between the diffusion layers 4-1 and 4-2 for the bit line and the source line that run in parallel with the gate electrodes 3-1 and 3-2 of FIG. 11. As a result, in the memory cell shown in FIG. 11, all the memory cells are erased along the bit line. This state is apparent from FIG. 12 that shows a bias relationship between a selected cell and an unselected cell in the memory cell array. That is, all the memory transistors (A1, C1, B1, and D1) disposed along both the sides of one column of bit lines are simultaneously erased so that programming cannot be carried out in a bit unit or a byte unit and erase is carried out in block-area.

SUMMARY OF THE INVENTION

A dramatically high degree of density is proposed by the memory cell (NROM) shown in FIGS. 3 to 5. In the memory cell, while necessary charge for program is reduced to about one-hundredth conventional one because the discrete traps in an insulating film are utilized. However, since program is carried out by channel hot carrier injection, a necessary program current is about 30 times source side injection.

Further, disturb is applied to an unselected cell as read is accumulated, whereby a signal margin is liable to be deteriorated. Furthermore, as can be understood from a bias relationship in a memory cell array shown in FIGS. 6 to 9, since a virtual ground system, in which operation is carried out by interchanging a source line and a bit line, is employed, there is a possibility that even a surface current which is transmitted on the surface of a semiconductor is detected in addition to a channel current detected through a predetermined channel particularly during read.

FIG. 10 shows a memory transistor employing source side injection in which discrete traps in a gate insulating film are utilized. While the figure shows up to that a one-way operation method is employed with a source/drain fixed, it is not clarified how an actual memory cell array is organized.

In the memory cell (DSG) shown in FIGS. 11 and 12, since the gate electrode of a memory transistor runs in parallel with a source line/bit line as described in Description of Prior Art, it is impossible to perform word-line erse. Further, the conductive floating gate electrodes 2'-1 and 2'-2 serving as store areas include electrodes which are arranged independently of other memory cells.

Furthermore, in the memory cell of FIG. 11, the gate electrode 3-1 and 3-2 of the memory 5 transistor are lined so as to cover the floating gate electrodes 2'-1 and 2'-2. As a result, a word line 5 which is across on the gate electrodes and the floating gate electrodes 2'-1 and 2'-2 cannot be subjected to stacked film processing utilizing self-aligned diffusion. Thus, the word line 5 must be stacked on the floating gate electrodes 2'-1 and 2'-2 by means of process alignment, whereby an area is increased by an alignment accuracy. It is reported that when a technology feature size is represented by "F", a cell area per bit of the memory cell of FIG. 11 is $5.4F^2$ as a result of an increase in area due to the alignment accuracy. While the memory cell of FIG. 11 realizes high density, its area is increased by 35% as compared with a memory cell having an area of $4F^2$ because it requires no alignment in processing.

Accordingly, it is an object of the present invention to provide a semiconductor integrated circuit having a nonvolatile memory which has less possibility of detecting a surface current other than a channel current detected through a predetermined channel.

Another object of the present invention present invention is to make it possible to carry out word-line erase in multi-storage nonvolatile memory cells.

Still another object of the present invention is to provide a semiconductor integrated circuit capable of realizing multi-storage nonvolatile memory cells while suppressing an increase in chip area.

The present invention intends to provide a semiconductor integrated circuit having a nonvolatile semiconductor memory of high density, high speed and high reliability.

These and other objects and novel features of the present invention will become more apparent from following description of the specification taken in conjunction with the accompanying drawings.

The embodiments of the present invention disclosed in this application mainly have the following features.

That is, since a gate insulating film having discrete traps is used, a multi-storage cell is organized such that one memory transistor can store information of at least two bits by local programming, whereby stored charge for detection can be dramatically reduced as compared with that of conductive floating gate electrodes.

Since program is performed utilizing at least source side injection, a programming efficiency is increased as compared with that of channel hot electron drain side injection, a channel current necessary to program is reduced, and the number of programmable bits is increased, whereby a chip program time is reduced and the programmable number of times is increased.

A switch transistor, which is necessary to realize the source side injection, is formed in a memory cell together with a memory transistor by self-aligned diffusion, thereby suppressing an increase in area. Further, the line of the switch transistor is devised to shut off the flow of a surface current, which is flown due to a virtual ground, to a source line/bit line.

At least word-line program is permitted by connecting the gate electrode of the memory transistor to a word line.

In a memory cell including the memory transistor and the switch transistor, there is employed a method of drawing out stored charge to the memory gate electrode side of the memory transistor, that is, to the word line side as a method of securing the data retention characteristics of stored charge which is programmed by the source side injection and allowing erase. For this purpose, as to thicknesses of silicon oxide films disposed above and below the gate insulating film having the discrete traps, that is, a silicon nitride film, a thickness of the lower (bottom) oxide film is made thicker than that of the upper (top) oxide film.

The structures of several types of memory cells according to the embodiments of the present invention will be exemplified here. A first memory cell structure is such that each of memory cells includes one memory transistor, two switch transistors and two diffusion-layer lines. The memory transistor includes a gate insulating film having discrete traps and a memory gate electrode connected to a word line, the two diffusion-layer lines constitute a source line and a bit line, and the switch gate electrodes of the two switch transistors are extended along the source line and the bit line.

A second memory cell structure is such that each of memory cells includes one memory transistor, two switch transistors and two transistor inversion-layer lines. The memory transistor includes a gate insulating film having discrete traps and a memory gate electrode connected to a word line, the two transistor inversion-layer lines constitute a source line and a bit line, and the two switch transistors and the two transistor inversion-layer lines constituting the source line and the bit line share the memory gate electrode, respectively.

A third memory cell structure is such that each of memory cells includes one memory transistor, one switch transistor, one transistor inversion-layer line and one diffusion-layer line. The memory transistor includes a gate insulating film having discrete traps and a memory gate electrode connected to a word line, the one transistor inversion-layer line constitutes a source line, the one diffusion-layer line constitutes a bit line, and the one switch transistor and the one transistor inversion-layer line constituting the source line share the transistor gate electrode, respectively.

A fourth memory cell structure is such that each of memory cells includes two memory transistors, one switch transistor and two diffusion-layer lines. Each of the memory transistors includes a gate insulating film having discrete traps and a transistor gate electrode connected to a word line, the two diffusion-layer lines constitute a source line and a bit line, and the switch gate electrode of the one switch transistor is extended along the source line and the bit line.

BRIEF DESCRIPTION OF THE DRAWINGS

FIG. 53 shows a layout pattern showing a nonvolatile memory cell of the third embodiment according to the present invention;

FIG. 54 is a circuit diagram showing bias conditions of a page erase operation of the memory cells of the third embodiment;

FIG. 55 is a circuit diagram showing bias conditions of a chip erase operation of the memory cells of the third embodiment;

DESCRIPTION OF THE EMBODIMENTS

Figure 1:
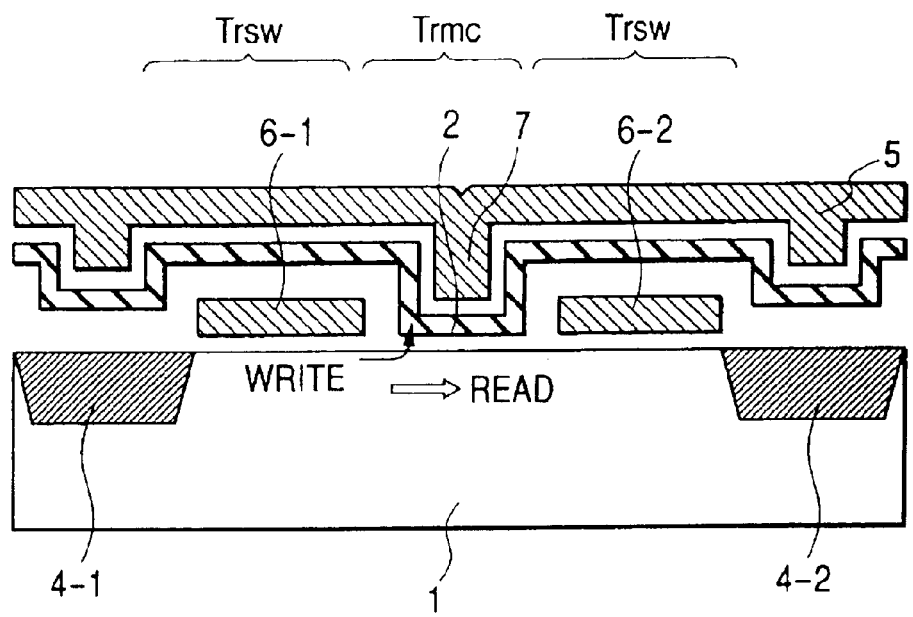
FIG. 1 is a sectional view exemplifying a nonvolatile memory cell including one memory cell transistor and two switch transistors which is a basic arrangement of a nonvolatile memory cell employed by a semiconductor integrated circuit according to an embodiment of the present invention.

A basic arrangement of a nonvolatile memory cell employed by a semiconductor integrated circuit according to the present invention is exemplified in FIG. 1, wherein the nonvolatile memory cell includes a memory transistor Trmc and selection transistors (switch transistors) Trsw disposed on both the side of the memory transistor Trmc. The memory transistor Trmc includes a gate insulating film 2 having discrete traps and a memory gate electrode (also referred to as a control gate electrode) 7, whereas the selection transistors Trsw include switch gate electrodes 6-1 and 6-2. The memory cell performs local program to the gate insulating film 2 having the discrete traps, which serves as a store area for storing charge, and is arranged as a multi-storage cell in which one memory cell stores information of at least 2 bits. The memory cell includes the switch transistors Trsw having the switch gate electrodes 6-1 and 6-2 for realizing source side injection, and the memory transistor Trmc is formed together with the selection transistors Trsw by self-aligned diffusion. The memory gate electrode of the memory transistor Trmc is connected to a word line 5.

Figure 2:
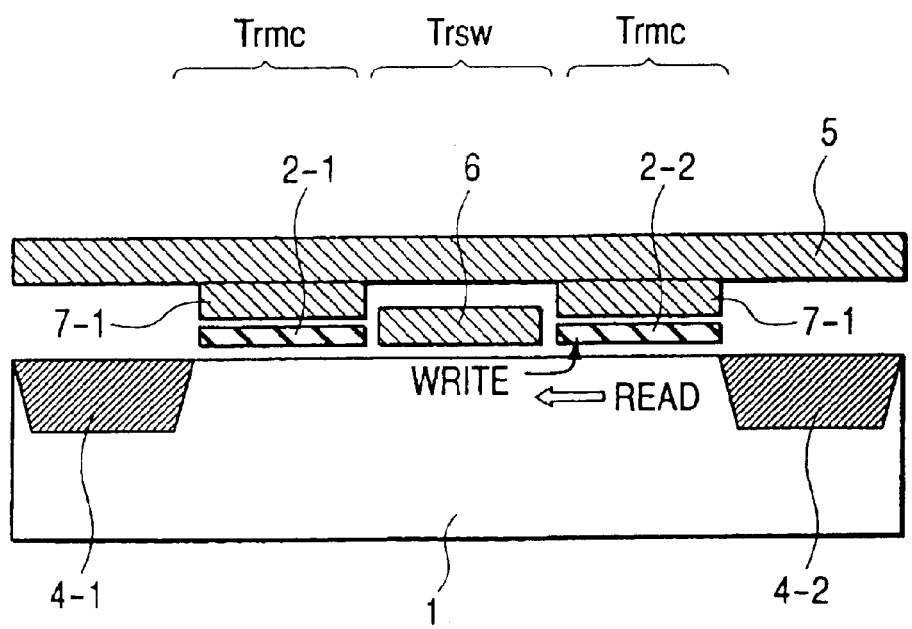
FIG. 2 is a sectional view exemplifying a nonvolatile memory cell including two memory cell transistors and one switch transistor which is a basic arrangement of a nonvolatile memory cell employed by a semiconductor integrated circuit according to an embodiment of the present invention.

FIG. 2 shows another basic arrangement of a nonvolatile memory cell employed by the semiconductor integrated circuit. The memory cell having the structure exemplified in FIG. 2 is arranged such that a selection transistor (switch transistor) Trsw having a switch gate 6 is formed on a substrate 1, memory transistors Trmc including gate insulating films 2-1 and 2-2 each having discrete traps and memory gate electrodes 7-1 and 7-2 are disposed on both the sides of the switch transistor Trsw, and diffusion layers 4-1 and 4-2, which are connected to a source line/bit line, are formed externally of the memory transistors Trmc. In the above structure, it is possible to perform word line program by connecting at least the memory gate electrodes 7-1 and 7-2 of the memory transistor Trmc to a word line 5.

The above-mentioned structures are the basic arrangement of the present invention and examples will be described below as embodiments of the present invention. It should be noted that the nonvolatile semiconductor memories provided by the present invention are conveniently referred to as an SEEPROM ("super" EEPROM) and a plurality of examples of the basic model, improved model, expanded model and modified model thereof will be identified by applying numbers and additional characters thereto in the embodiments of the present invention.

<Nonvolatile Semiconductor Memory Device>

Figure 13:
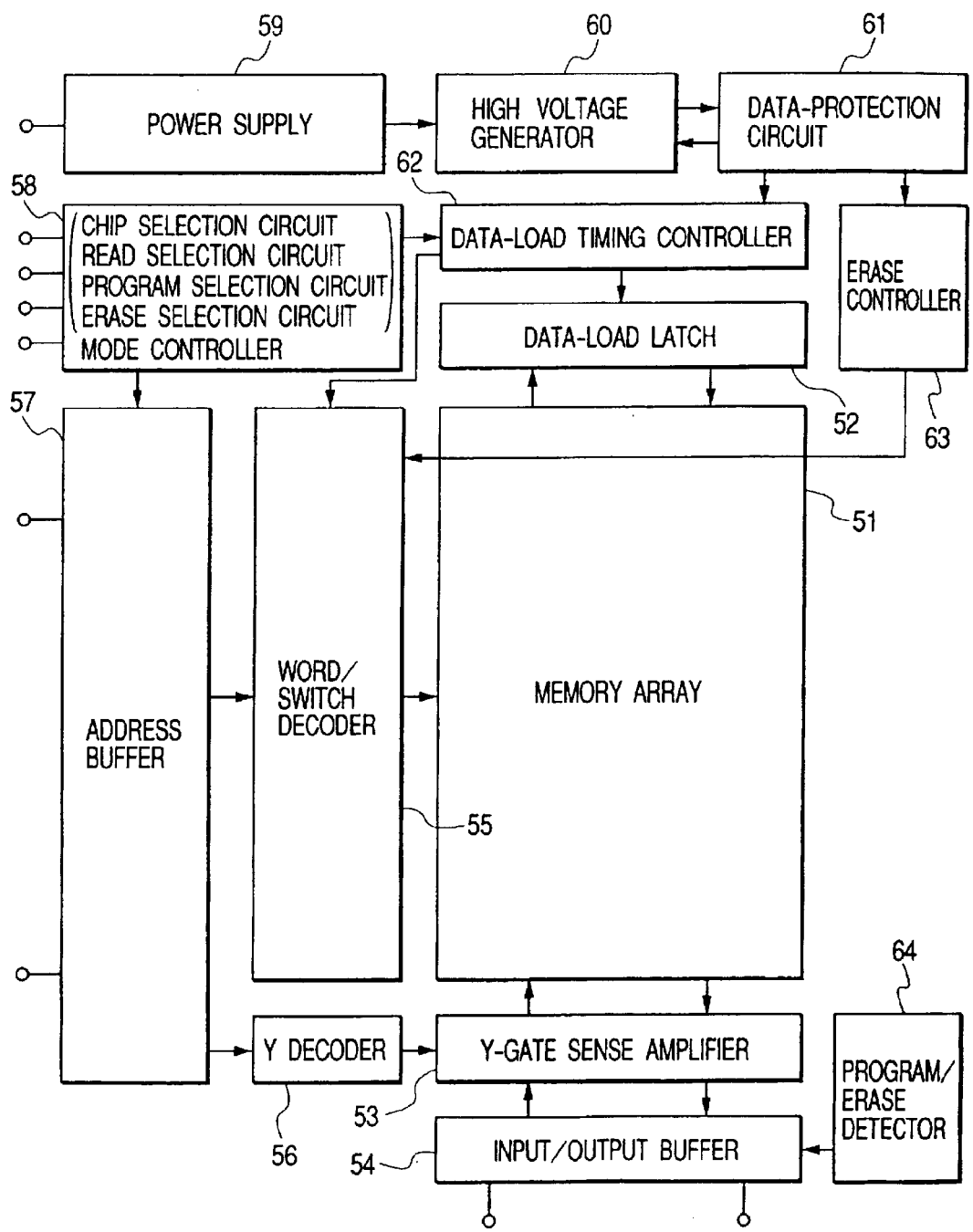
FIG. 13 is a block diagram showing an example of a nonvolatile semiconductor memory device.

A block arrangement of a nonvolatile semiconductor memory device will be described with reference to FIG. 13. The nonvolatile semiconductor memory device includes a memory cell array 51 in which memory cells are disposed in matrix. The memory cells disposed in the memory cell array 51 are arranged, for example, such that each column of source electrodes and drain electrodes is connected to a data line, each column of switch gate electrodes is disposed to a switch gate control line, and each row of memory gate electrodes is connected to a word line. The data lines of the memory cell array 51 are connected to a data load latch circuit 52 on one hand and to a Y-gate sense amplifier 53 on the other hand. The Y-gate sense amplifier 53 is arranged such that a Y address (column address) received by an address buffer 57 is decoded by a Y decoder 56 and the data line of the Y-gate sense amplifier 53 is selected in response to a selection signal formed by the decoded Y address, whereby data can be input and output between a selected data line and an input/output buffer circuit 54. Further, the word lines and the switch gate control lines are connected to a word/switch decoder 55. The word/switch decoder 55 decodes an address supplied from an address buffer 57 and creates a word line and switch control line selection signal. Further, a mode controller 58 controls a chip selection mode, read mode, program mode, and erase mode in accordance with an external command or a state of a strobe signal. At this time, in the program or erase mode, a high voltage, which is necessary for a program for programming and erasing, is generated from a power supply 59 through a high voltage generator 60. A high voltage, which is necessary to a data load timing controller 62 and an erase controller 63, is applied thereto through a data-protection circuit 61 so that data is not broken by a high voltage which may be generated by an accidental signal such as noise and the like. The erase controller 63 starts an erase operation in response to an instruction for selecting erase issued by the mode controller 58. Program data is latched by the data load latch circuit 52 from the input/output buffer circuit 54 and supplied from the data latch circuit 52 to the memory cell array 51 in synchronism with a timing of program controlled by the data load timing controller 62. The data load timing controller 62 interchanges a bit line and a source line in response to an internal timing. A time necessary to the program for the programming and erasing is incommensurably larger than the clock frequency of a microcomputer (also referred to as a micon). In such as case, the micon is isolated from a bus in the nonvolatile semiconductor memory device, and the completion of the program and erase operation, which is carried out by the control in the interior of a nonvolatile semiconductor memory, is applied to the outside by a program/erase detector 64 so that a control operation other than the control operation to the nonvolatile semiconductor memory can be permitted to the micon. In short, a ready/busy signal can be output to the outside. It is sufficient for the micon to perform access when the nonvolatile semiconductor memory is in a ready state in response to the ready/busy signal.

<First Embodiment of Memory Cell>

A memory cell structure, in which switch transistors Trsw are disposed on both the sides of a memory transistor Memory transistor Trmc, is employed as a first embodiment of a multi-storage nonvolatile memory cell in order to solve the problems of an increase in programming speed in program, read disturb during read, and an expansion of a dual-way signal read margin. While a certain amount of reduction of a degree of density cannot help being sacrificed by the provision of the switch transistors Trsw on both the sides of the memory transistor Trmc, FIGS. 14 to 16 exemplify a structure in which a reduction of the degree of density is suppressed utilizing self-aligning diffusion. It should be understood that the term "transistor" used in the specification is an expression conveniently used to make it easy to understand the structure of the multi-storage nonvolatile memory cell according to the present invention and does not mean a perfect transistor, and it is only an expression with an attention paid to a gate structure.

Figure 14:
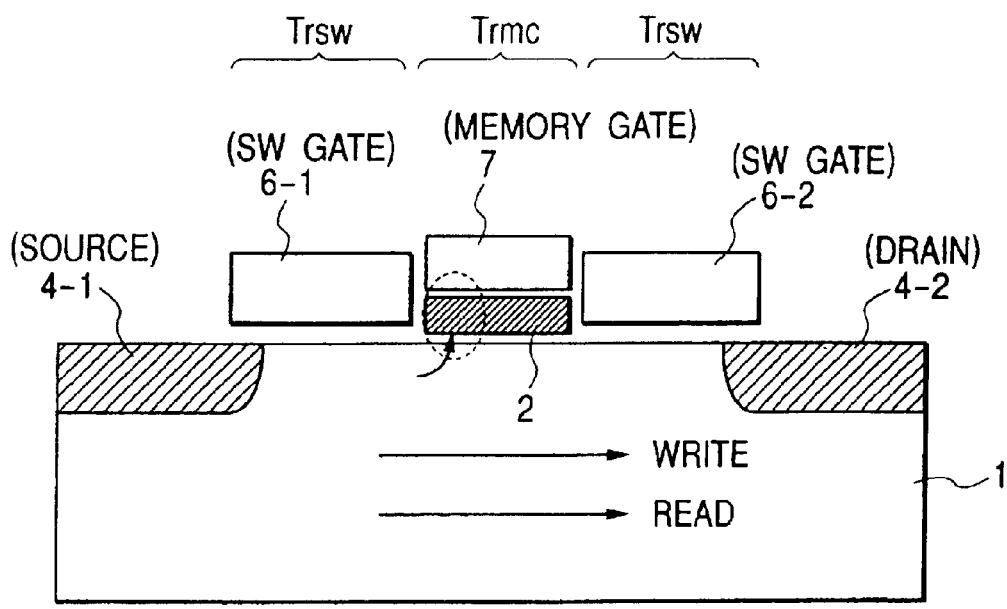
FIG. 14 is a sectional view showing a nonvolatile memory cell of a first embodiment according to the present invention with an attention paid to the first program and read method.
Figure 15:
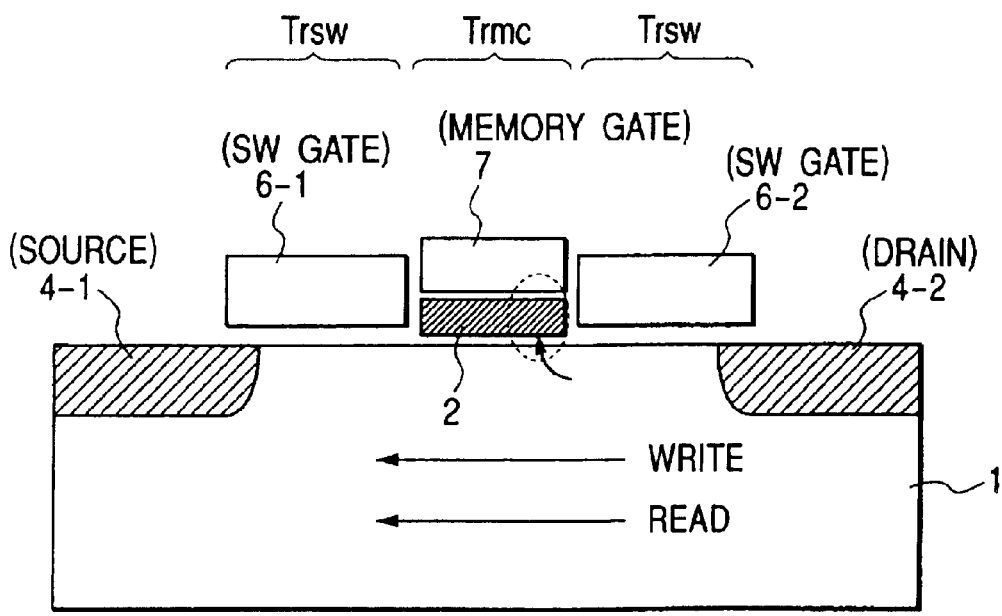
FIG. 15 is a sectional view showing the nonvolatile memory cell of a first embodiment according to the present invention with an attention paid to the second program and read method.
Figure 16:
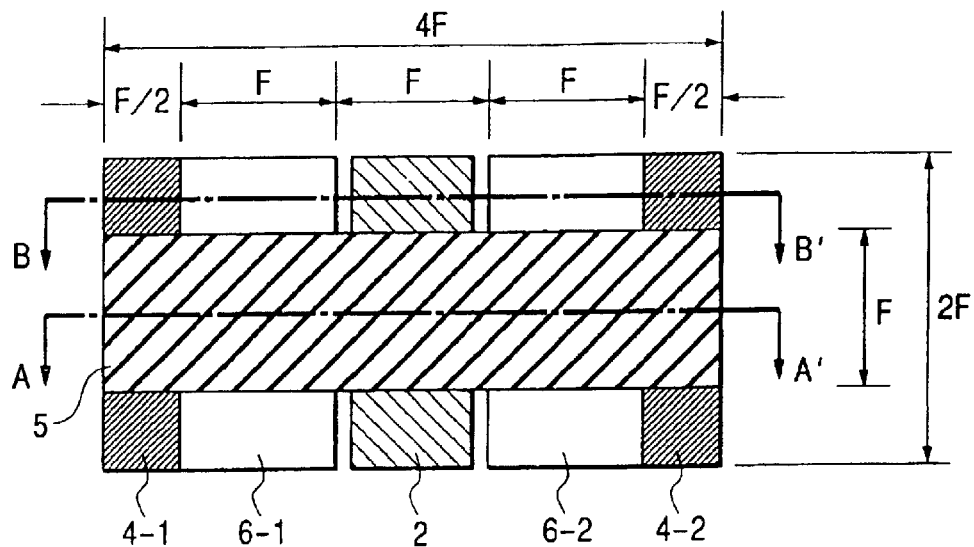
FIG. 16 shows a layout pattern of the memory cell of FIGS. 14 and 15.

The memory cell shown in FIGS. 14 to 16 includes a memory transistor Trmc that is formed on a substrate 1 and includes a gate insulating film 2 having discrete traps and a memory gate electrode 7. The gate insulating film 2 having the discrete traps may include, for example, a silicon nitride film. Switch transistors Trsw, Trsw, which include switch gate electrodes 6-1 and 6-2, are formed on both the sides of the memory transistor Trmc, and diffusion layers 4-1 and 4-2, which are connected to a source line/bit line, are formed externally of the switch transistors Trsw. That is, the memory cell is arranged such that the memory transistor Trmc is buried between the switch transistors Trsw, Trsw on both the sides thereof, and the diffusion layers 4-1 and 4-2, which constitute bit line/source line are formed externally thereof. In the memory cell structure, the memory cell shares the bit line/source line with a neighboring memory cell. From the above structure, while one memory cell has an area of $8F^2$, an area for 1 bit thereof can be regarded as $4F^2$ because information of 2 bits is stored in the memory cell. Since an area of the smallest memory structure of conventional EEPROMs and flash memories is about $6F^2$, the size of the memory cell exemplified in FIGS. 14 to 16 is reduced as compared with the smallest memory structure.

To describe a program operation, a programming speed is greatly increased to the order of microseconds ($\mu$sec) by the employment of a so-called source side injection. A reason why the speed is increased resides in that, for program, carriers are accelerated when they pass through the narrowed channel of the initial one of the switch transistors Trsw and the energy thereof is increased. Subsequently, the carriers injected into the channel of the memory transistor Trmc further sense a high bias applied to the memory transistor Trmc in a direction of the memory gate electrode and rapidly are injected into the gate insulating film 2 having the discrete traps and are captured by the discrete traps. It is contemplated that the source side injection is carried out in a very narrow region in a channel direction. However, when flied charge is captured by discrete traps and fixed at the positions of the traps, a position where the source side injection is carried out is changed steadily by the self-induced potential of the captured charge, and finally the charge is stored in the source region of the memory transistor while distributing in a certain degree of area. Further, an important point resulting from the great increase in programming speed resides not only in an advantage in application but also in that degradation during program due to hot carrier program is suppressed in proportion to the time of the program.

Figure 3:
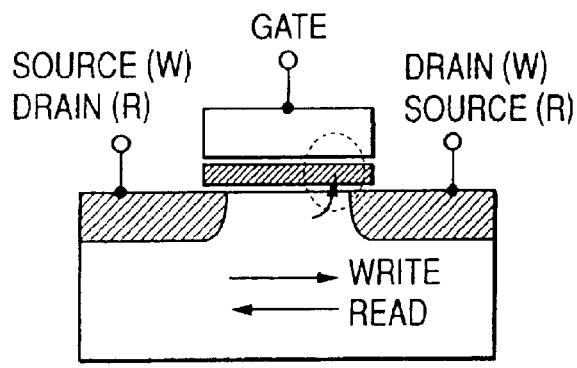
FIG. 3 is a view explaining a first program and read method of an NROM memory cell previously examined by the inventors.
Figure 4:
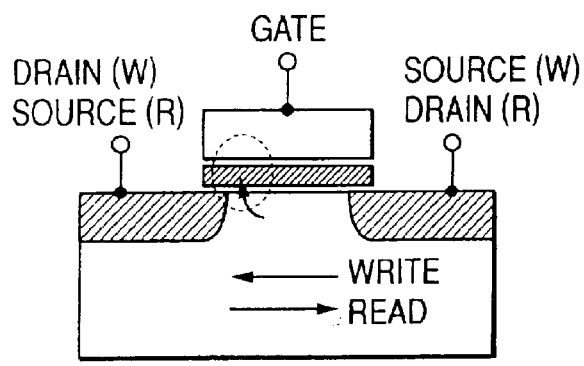
FIG. 4 is a view explaining a second program and read method of the NROM memory cell previously examined by the inventors.
Figure 5:
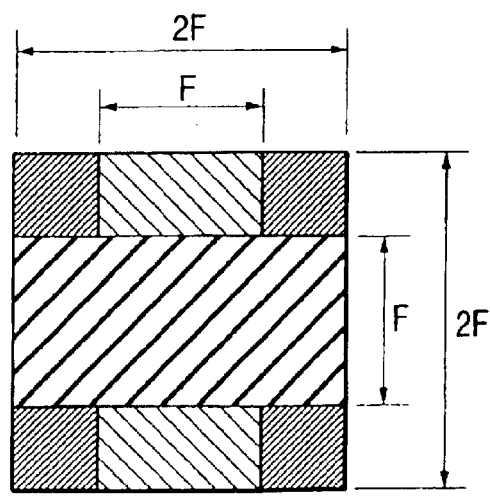
FIG. 5 is a plan view showing a layout of the NROM memory cell.
Figure 6:
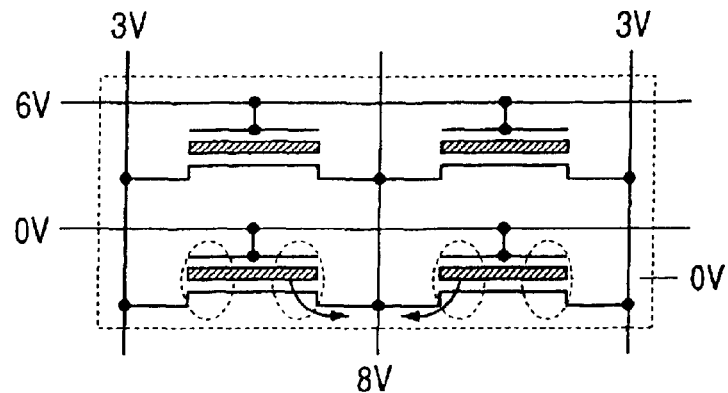
FIG. 6 is a view explaining a page erase operation of the NROM.
Figure 7:
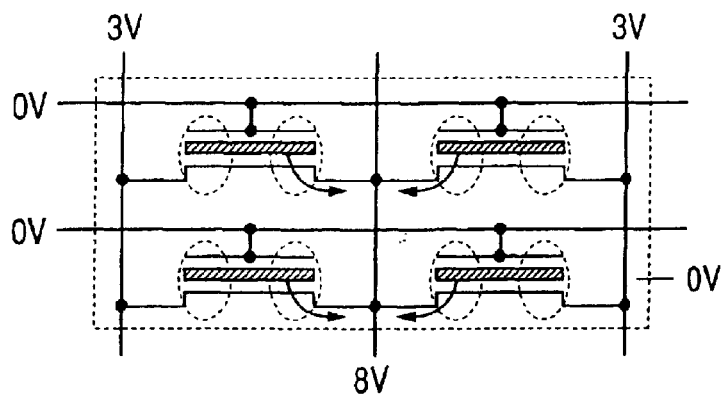
FIG. 7 is a view explaining a chip erase operation of the NROM.
Figure 8:
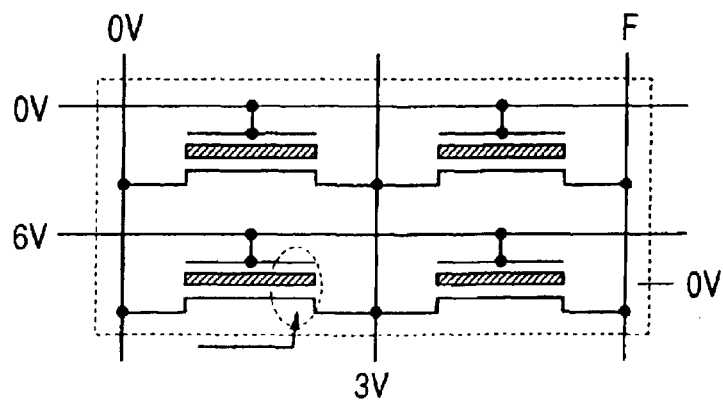
FIG. 8 is a view explaining a program operation of the NROM.
Figure 9:
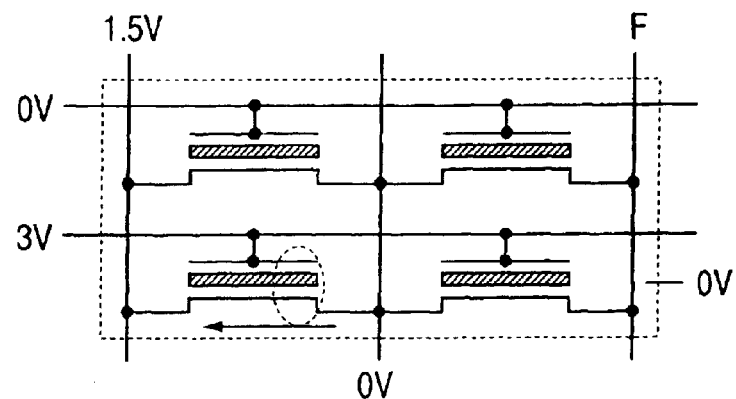
FIG. 9 is a view explaining a read operation of the NROM.
Figure 10:
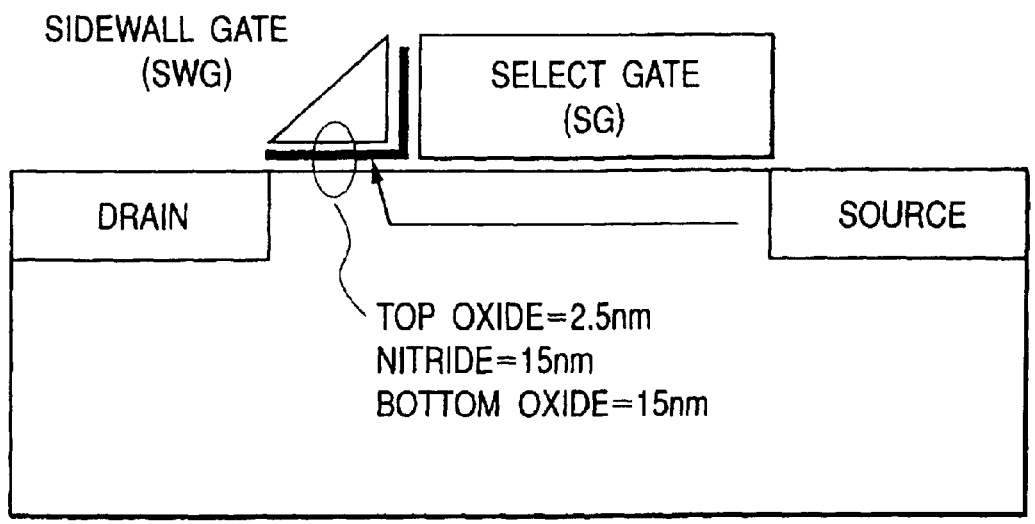
FIG. 10 is a view explaining another cell previously examined by the inventors.

For reading, the switch transistors Trsw, Trsw of a half-select memory cell carry out an action for avoiding read disturb by eliminating an influence of read voltage. Further, it is possible to expand a signal detection margin by increasing a voltage of the switch gate electrode of the switch transistor Trsw on a read side. Note that while a direction of the channel current in the memory transistor is reversed each other in program and read in the one transistor type non-volatile semiconductor memory shown in FIGS. 3 to 5, a direction of the channel current is unchanged also during read in the memory structure provided in FIGS. 14 to 16 because program is carried out on the source side.

FIGS. 17 to 20 show a first example of an operation bias when a cell array is made of memory cells provided by the present invention of FIGS. 14 to 16, and FIGS. 21 to 24 show a second embodiment of the operation bias. In any of the operation biases, the memory gate electrode 7 of the memory transistor Trmc is connected to word lines 5Li and 5Lj which are shown typically. Bit line/source lines 4Li, 4Lj and 41k, which are typically shown, are disposed so as to intersect the word lines 5Li and 5Lj. Further, switch control lines 6Li to 6Ll, which are typically shown and connected to the switch gate electrodes 6-1, 6-2 of the switch transistors Trsw on both the sides of the memory transistor Trmc, also intersect the word lines 5Li and 5Lj.

Figure 17:
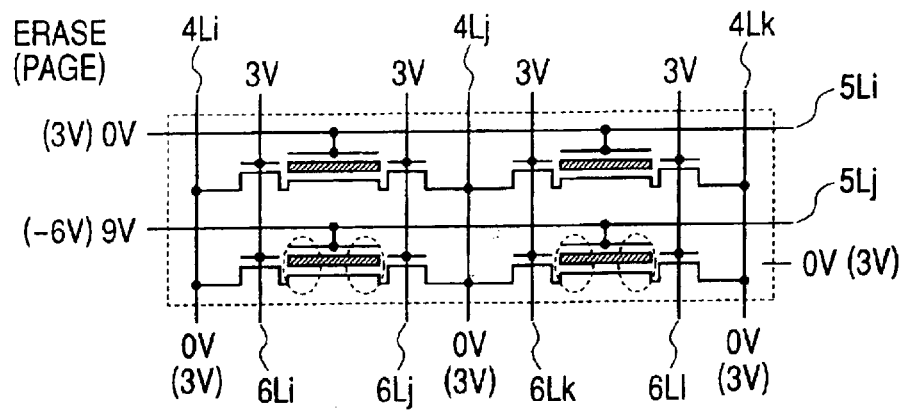
FIG. 17 is a circuit diagram showing bias conditions of a first page erase operation of the memory cells of the first embodiment.
Figure 18:
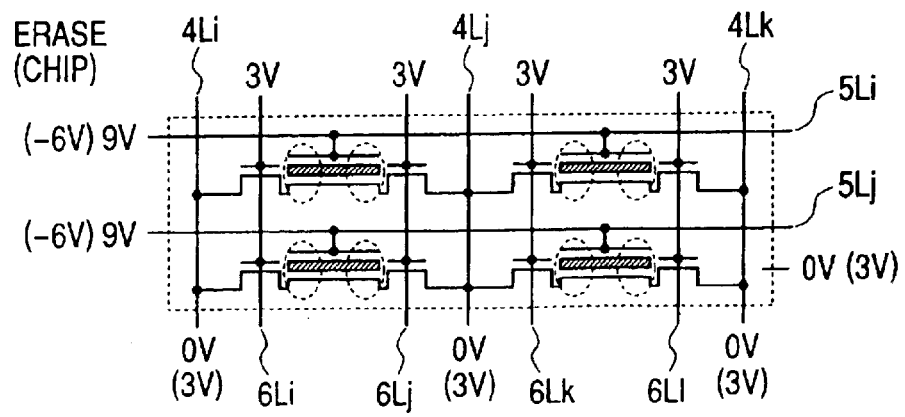
FIG. 18 is a circuit diagram showing bias conditions of a first chip erase operation of the memory cells of the first embodiment.

FIG. 17 shows a bias relationship in page mode erase. A relatively large bias of 9 V is applied to only the selected word line 5Lj and a 0 V is applied to all the other word lines. In the erase of a selected memory transistor, trapped electrons are drawn out to a memory gate electrode side by a large positive bias supplied from a memory gate side. The operation in FIG. 18 is carried out by imposing a positive bias of 9 V on all the word lines 5Li and 5Lj. That is, erase can be carried out in two types of erase, that is, in word-line erase (page erase) and in all the chips erase. FIG. 17 shows the word-line erase and FIG. 18 shows the chip erase.

Figure 19:
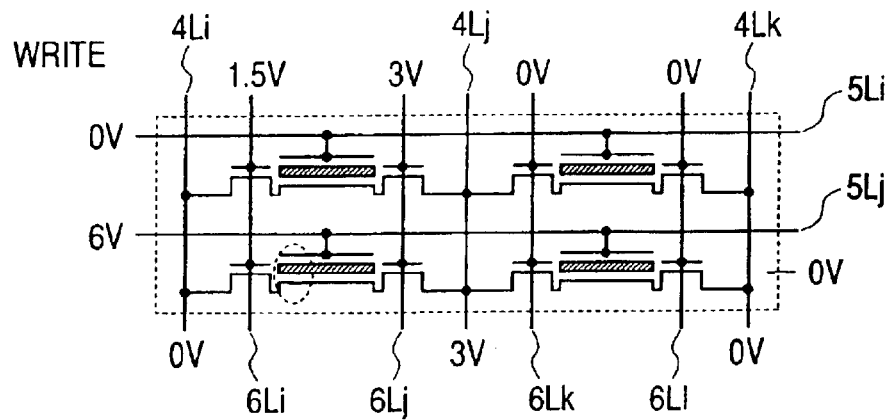
FIG. 19 is a circuit diagram showing bias conditions of a first program operation of the memory cells of the first embodiment.

FIG. 19 shows a program operation. A switch gate voltage on the source side of a memory cell to be selected is set to 1.5 V through the switching control line 6Li, a switch gate voltage on the source side thereof is set to 3 V through the control line 6Lj, and a voltage of the memory gate electrode of the memory transistor Trmc is set to 6 V through the word line 5Lj, whereby the program is carried out.

Figure 20:
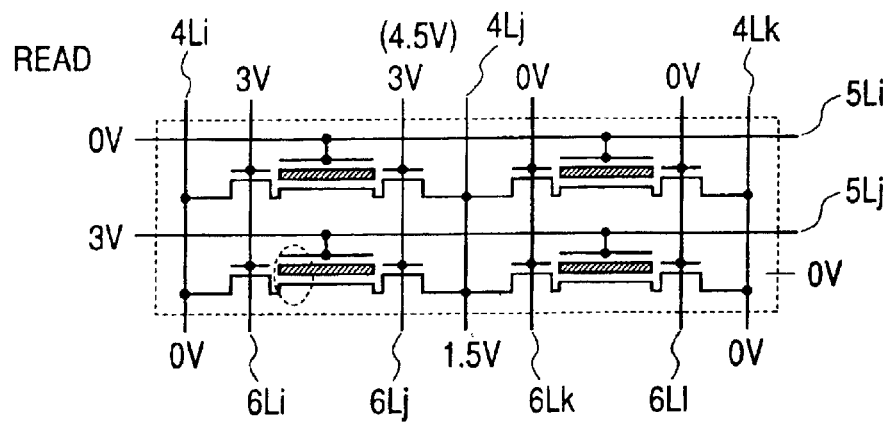
FIG. 20 is a circuit diagram showing bias conditions of a first read operation of the memory cells of the first embodiment.
Figure 21:
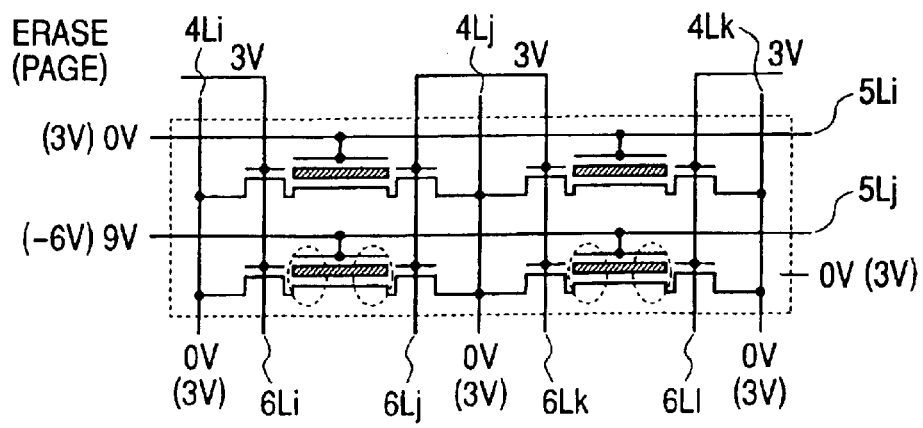
FIG. 21 is a circuit diagram showing bias conditions of a second page erase operation of the memory cells of the first embodiment.
Figure 22:
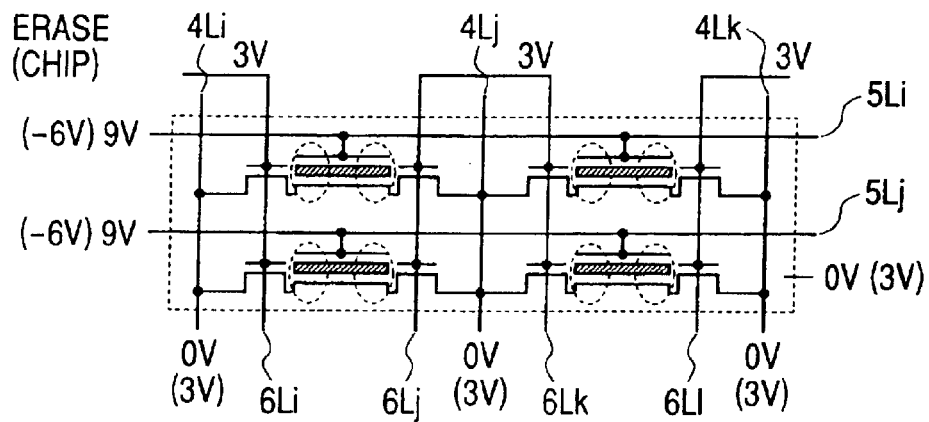
FIG. 22 is a circuit diagram showing bias conditions of a second chip erase operation of the memory cells of the first embodiment.
Figure 23:
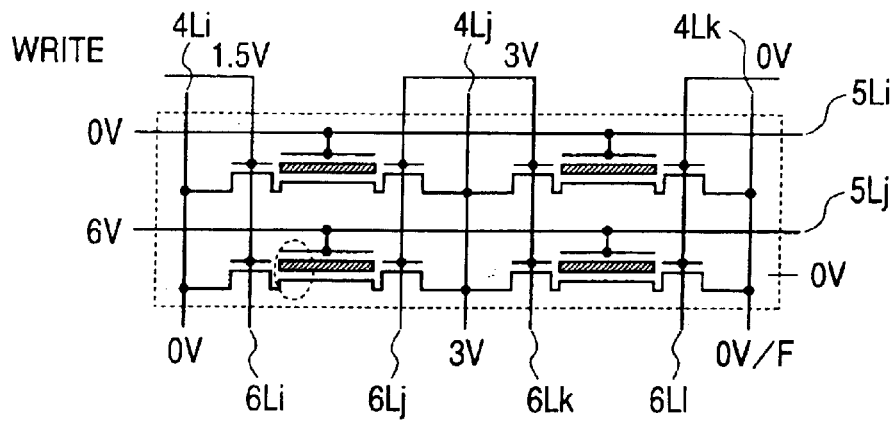
FIG. 23 is a circuit diagram showing bias conditions of a second program operation of the memory cells of the first embodiment.

FIG. 20 shows a read operation. A 3 V is applied to the memory gate electrode of a memory cell to be selected through the word line 5Lj, a 3 V also is applied to the switch gate electrodes of the switch transistors on both the sides through the control lines 6Li and 6Lj, and a 1.5 V is applied to the bit line/source line 4Lj connected to the drain electrode thereof, whereby the read is carried out. Otherwise, in the read, the read margin of the 2 bit/cell can be expanded by applying 3 V as a gate voltage of the switch transistor to the source electrode side through the control line 6Li and by applying 4.5 V to the gate electrode of the switch transistor on the drain side through the control line 6Lj.

Figure 24:
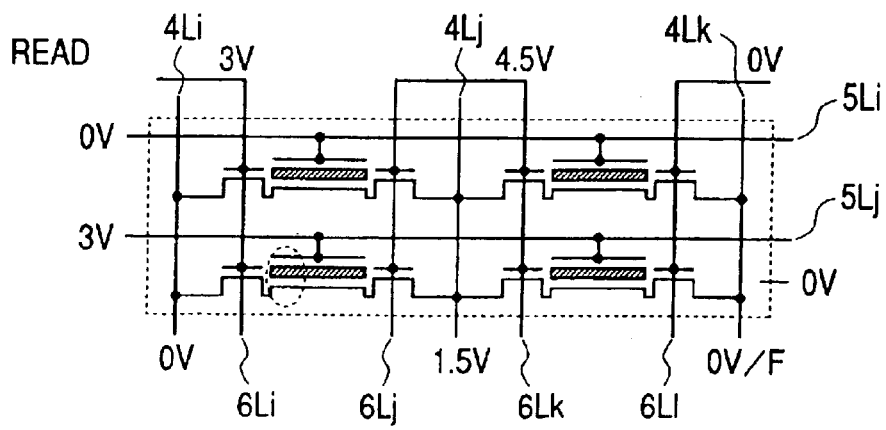
FIG. 24 is a circuit diagram showing bias conditions of a second read operation of the memory cells of the first embodiment.

In the method shown in FIG. 21 to FIG. 24, the switch gate electrodes of the switch transistors Trsw of neighboring memory cells are short circuited. Erase, program and read operations are possible as shown in FIGS. 21 to 24. A definitive advantage of this method resides in that when the switch transistor has a side wall gate structure which is formed to have a size smaller than a minimum light-processing figure size, the switch transistor can be easily connected to a peripheral circuit, while this will be described later with reference to FIG. 44. In the read of FIG. 24, a gate voltage of the switch transistor on the bit line side is increased to 4.5 V in order to expand a read margin. Further, there exist program half-select memory cells (memory cells connected to the lines 5Lj, 6Lk and 6L1) shown in FIG. 23 by short circuiting the switch gate electrodes of the switch transistors Trsw of the neighboring memory cells. While the program half-select memory cells are subjected to disturb as apparent from FIG. 23, it can be said that the influence of the disturb is very small due to the increased program speed realized by the source side injection.

It should be noted that the voltages which are shown in FIGS. 17, 18, 21, and 22 in correspondence to the memory gate electrodes and the bit line/source lines, in particular, the values of the voltages in the parentheses are set assuming that a gate oxide film between the substrate and the gate insulating film having the discrete traps has a thickness of 1.8 nm and erase is carried out by drawing out charge to the substrate side and that the values of the voltages outside the parentheses are set assuming that the gate oxide film between the substrate and the gate insulating film having the discrete traps has a thickness of 5 nm and erase is carried out by drawing out charge to the word lines (gate electrodes) side.

The description made with reference to FIGS. 17 to 24 exemplifies the program carried out to the memory transistor Trmc by the source side injection applied to one of the sources. However, it is needless to say that the program can be carried out by applying the source side injection to the opposite side by interchanging the source electrode and the drain electrode of the memory transistor Trmc on the right and left sides thereof by interchanging the bias conditions on right and left sides. The terms "Source" and "Drain" added to the diffusion layers 4-1 and 4-2 of FIGS. 14 and 15 are relative names of electrodes when the bias conditions are interchanged between the source electrode and the drain electrode.

As to the erase, program and read described with reference to FIGS. 17 to 24, an operation procedure for creating the bias relationship in the memory cell array will be described.

Figure 25:
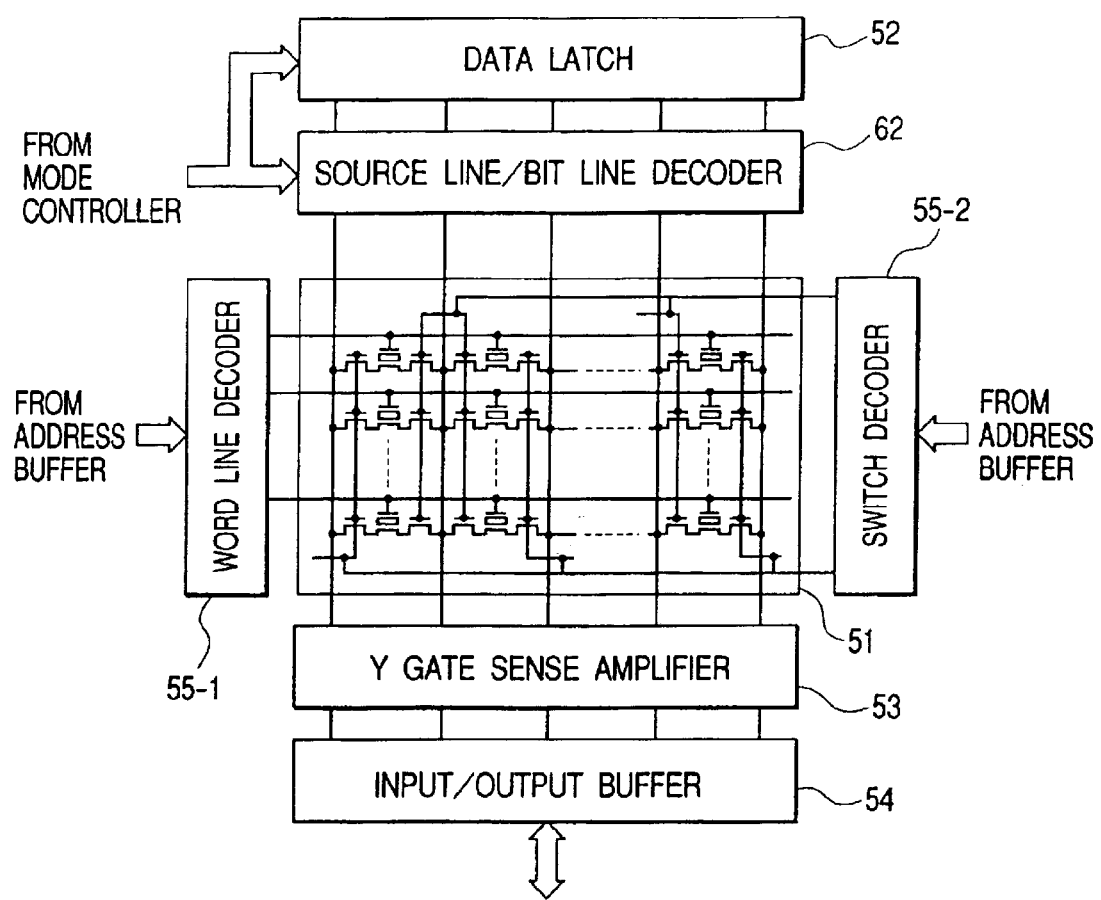
FIG. 25 is a block diagram showing an example of a memory cell array and a peripheral circuit.
Figure 26:
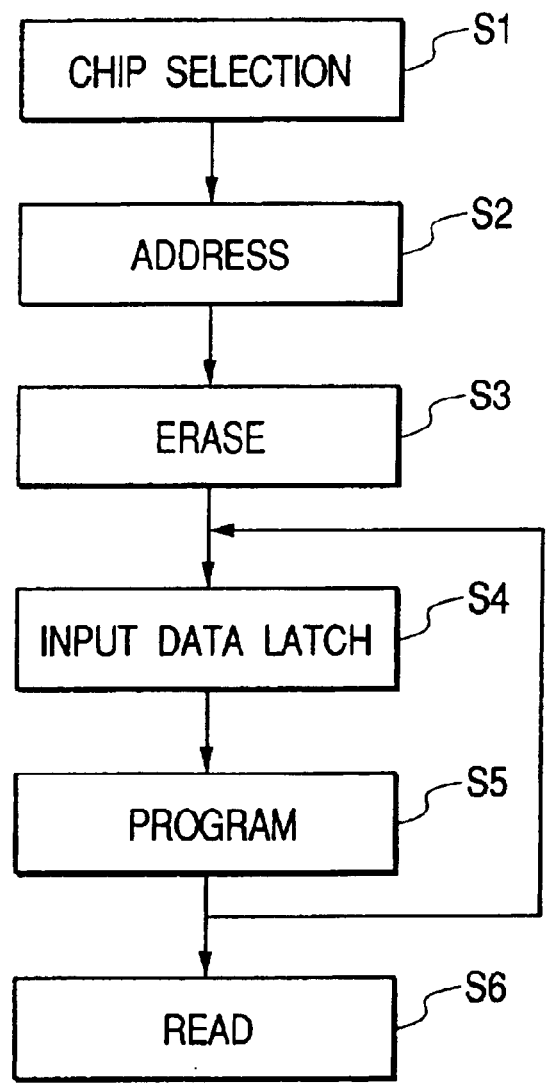
FIG. 26 is a typical flowchart of a memory operation.

FIG. 25 specifically shows a detailed example of the memory cell array 51 and its peripheral circuit, and FIG. 26 schematically shows the operation procedure.

In FIG. 25, a word line decoder 55-1 is a circuit for forming a selection signal for word lines 5L, and a switch decoder 55-2 is a circuit for forming a selection signal for switch control lines 6L. The word line decoder 55-1 and the switch decoder 55-2 are included in the word/switch decoder 55 of FIG. 13. It should be understood that a data latch circuit 52 is the same as the data load latch 52 of FIG. 13 and that a source line/bit line decoder 62 is the same as the data load timing controller 62 of FIG. 13.

As exemplified in FIG. 26, an access operation procedure is first started from step of selecting a memory chip in a data processing system or a memory system (S1). Next, in the access, a signal of whether program is instructed or read is instructed is input and a signal for specifying an address in the chip is inputted (S2). When old data stored in the specified address is changed to new data, the old data must be erased (S3). When a word is selected for the data to be changed, only the word data may be erased before program. Otherwise, there is a case in which program is carried out when a memory of a block-area is previously erased. In this case, erase just before the program is not necessary. Next, new input data to be programmed is latched (S4) and a memory cell program operation is performed (S5). When the old data is to be partly left, the old data may be saved in the data latch circuit 52 before it is erased and partly replaced with the new data in the data latch 52 and program may be carried out to the memory of the specified address. Since the program ordinarily requires a time longer than a clock time of a microprocessor, a memory chip has the above ready/busy signal for indicating that program is being carried out. When it is detected by the ready/busy signal that the program has been completed, the microprocessor accesses the memory chip and permits the programmed nonvolatile data to be read (S6).

The above-mentioned is a usual operation in the operation of an ordinary nonvolatile semiconductor memory chip. However, since the memory cell provided by the present invention is a multi-storage memory cell in which information of 2 bits is stored in one memory cell, program or read of the one memory cell is carried out twice at one time. In this case, the interchange of the source line/bit line and the interchange of the gate voltages of the two switch transistors Trsw are necessary and further the operation of the peripheral circuit must be changed accordingly. These operations are controlled in response to an address signal.

Figure 119:
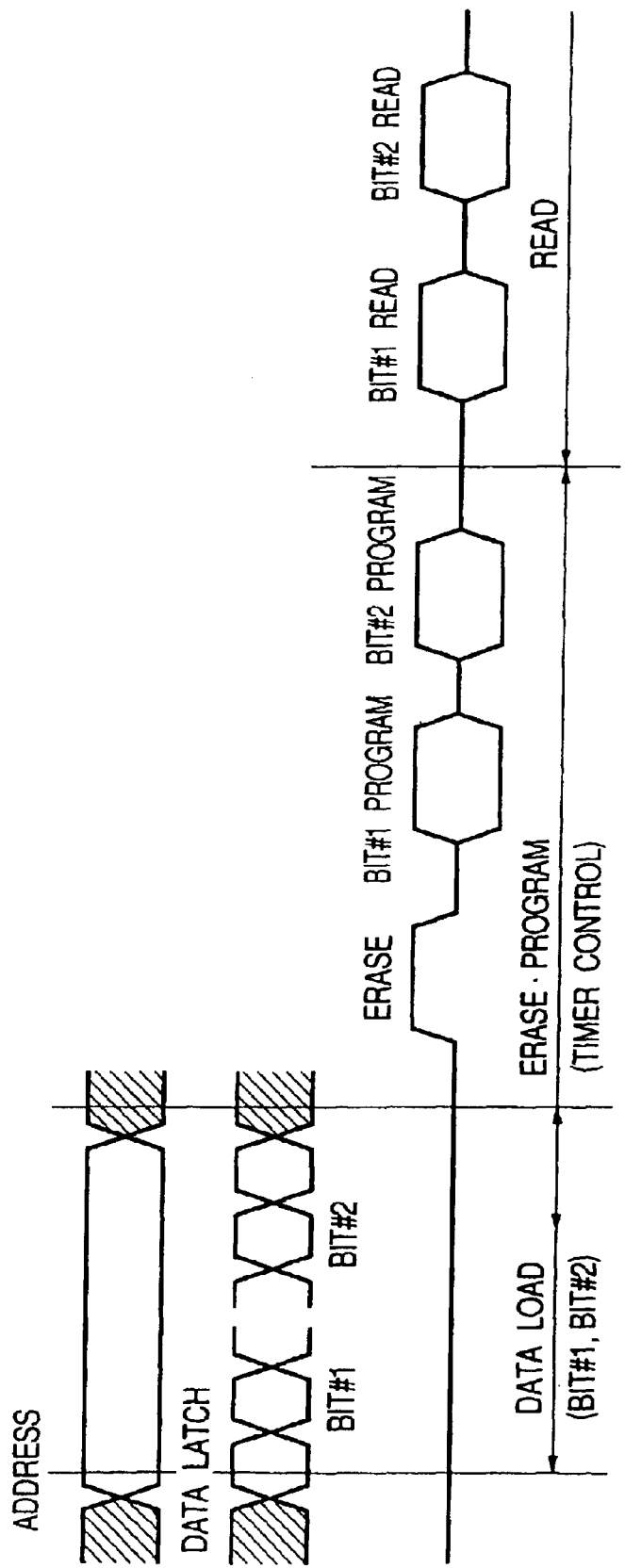
FIG. 119 is a first timing chart of erase, program and read operations of the memory cells of the first, second and third embodiments.
Figure 120:
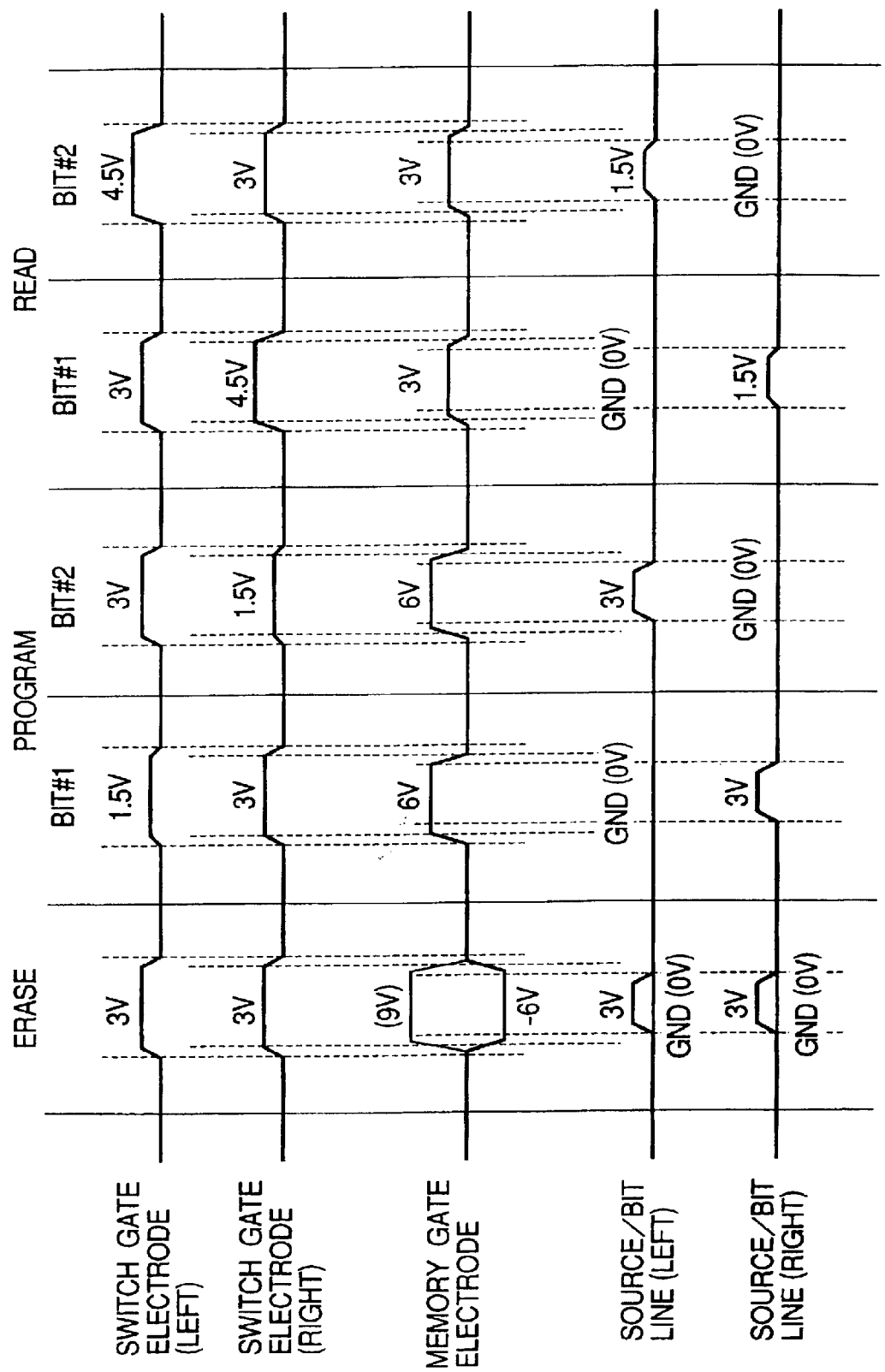
FIG. 120 is a second timing chart of the erase, program and read operations of the memory cells of the first, second and third embodiments.

FIGS. 119 and 120 show timing charts of operations which are carried out when information of 2 bits is stored in one memory cell. In the respective figures, bit #1 and bit #2 mean information of 2 bits in one memory cell. As exemplified in FIG. 119, one memory cell is specified by one address, and data of 2 bits, that is, data bit #1 and data bit #2 are latched by the data latch 52 with respect to the one memory cell. After erase, data bit #1 is programmed to one of the source sides and data bit #2 also is programmed to the other of the source sides while interchanging bias voltage conditions to the source electrode and the drain electrode of the memory cell. During read, the programmed side is operated as the source. How the source line and the bit line are interchanged is explicitly shown in FIG. 120. In FIG. 120, when the oxide film between the substrate and the gate insulating film having the discrete traps such as the silicon nitride film has the thickness of 1.8 nm, erase is carried out by drawing out electrons to the substrate side while setting a gate bias voltage to −6 V and imposing 3 V on the substrate. When the oxide film has the thickness of 5 nm, the erase is carried out by drawing out electrons to the gate side while setting the gate bias voltage to 9 V and imposing 0 V on the substrate.

Figure 116:
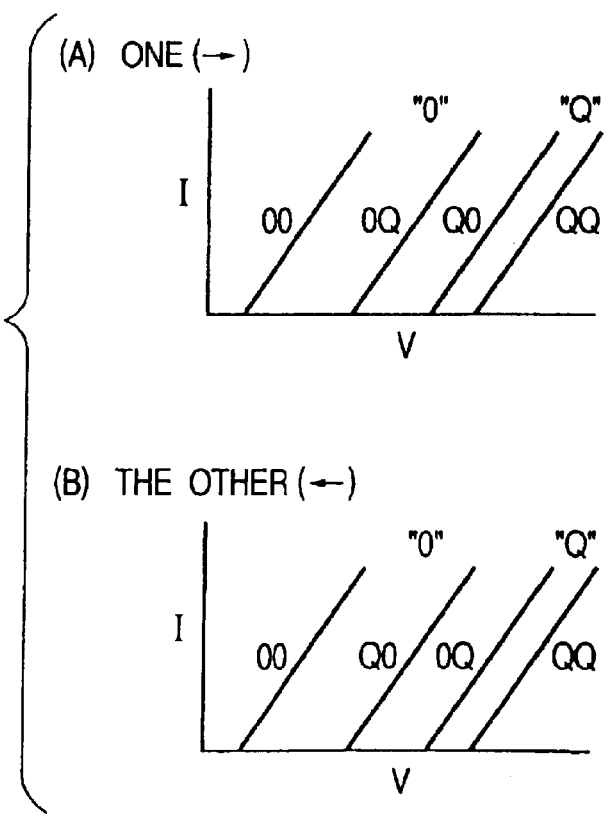
FIG. 116 is a characteristic view showing a relationship between a read memory current and a memory gate voltage of the memory cells of the first, second and third embodiments.

When the information of 2 bits is stored in one memory cell as described above and the information of any one of the 2 bits is read, even if a reading direction is interchanged, the information of one of the bits influences the information of the other of the bits when the information of the other of the bits is read. FIG. 116 exemplifies a relationship between a memory current and a memory gate current during read so that the influence can be understood. It is a principle to carry out read using a side where program is carried out as the source side. FIG. 116(A) shows current-voltage characteristics in the right-direction read shown in FIG. 14, whereas FIG. 116(B) shows current-voltage characteristics in the left-direction read shown in FIG. 15. In FIGS. 116(A) and (B), "0" means an erased state, "Q" means a programmed state, the left side bits of "00", "0Q", "Q0", and QQ" mean a trap state at the left side of the gate insulating film having the discrete traps, and the right side bits thereof mean a trap state at the right side of the gate insulating film having the discrete traps. As apparent from the figures, while the information of one of the 2 bits influences the information of the other of the 2 bits in the multi-storage memory cell, the four types of states in FIGS. 116(A) and (B) can be explicitly identified by appropriately determining a word line voltage and a sensitivity of a current detection type sense amplifier.

FIGS. 27 to 34 exemplify various types of arrangement of the memory cell arrays 51. The arrangement is roughly divided into 4 types (A) to (D) and the layouts and equivalent circuits thereof are illustrated.

Each memory cell array 51 has 2 sets of 8 word lines and 8 memory gates as a minimum unit of the memory cell array and the two sets of them are disposed side by side. The active regions of the memory cell array is denoted by reference numeral 8, the gate lines of switch transistors are denoted by reference numeral 6La, the word lines thereof are denoted by reference numerals 5L, and the source/bit line diffusion layers thereof are denoted by reference numerals 4. The gate lines 6La of the switch transistors are bundled to each of switch gate electrode lines 6L for every 8 word lines 5L through contact holes 6C, and the source/bit line diffusion layers 4 are connected to source lines/bit lines 4L through contact holes 4C. Symbol MC denotes one memory cell.

Figure 27:
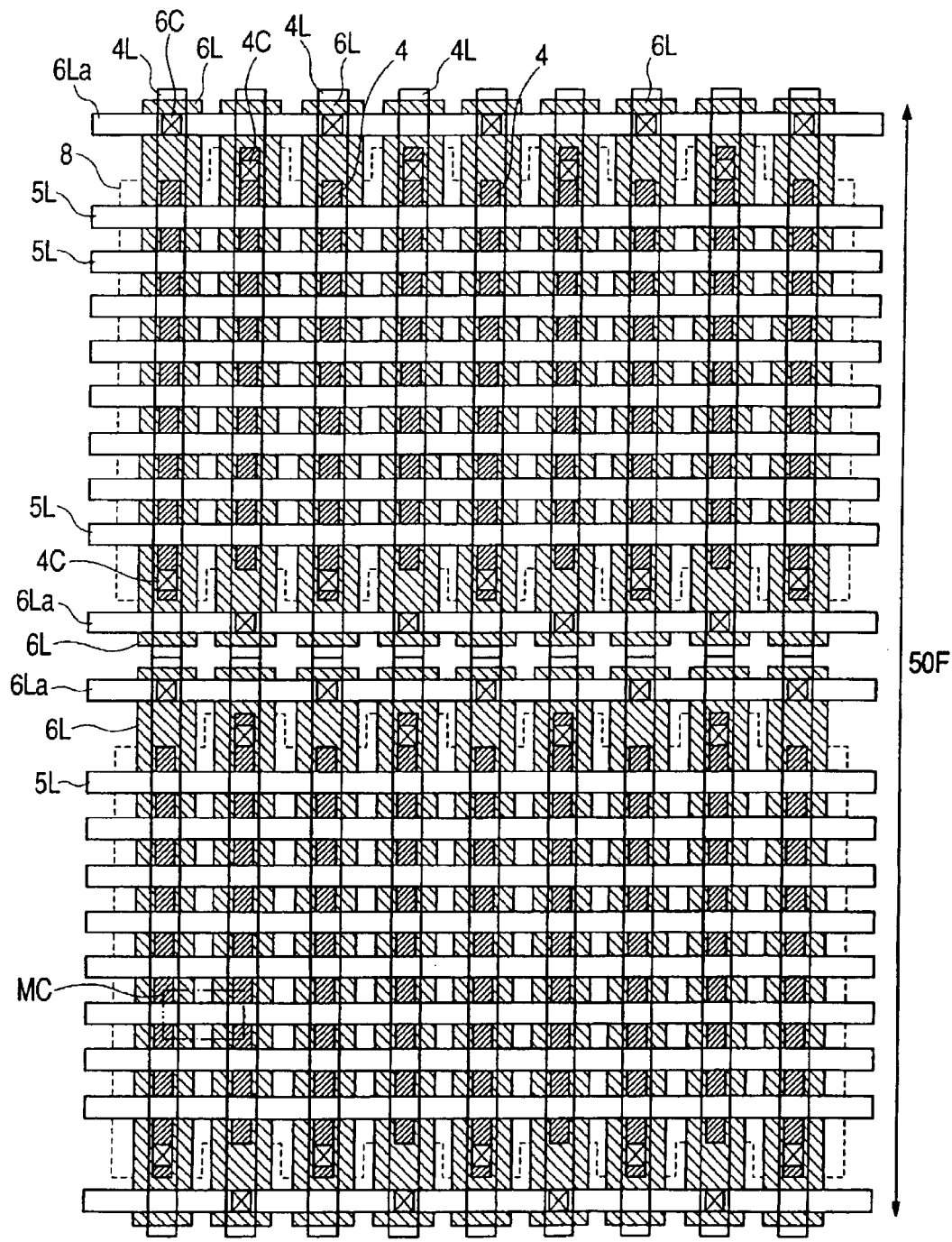
FIG. 27 shows a layout pattern showing a first arrangement example (A) of the memory cell array including the memory cells of the first embodiment.
Figure 28:
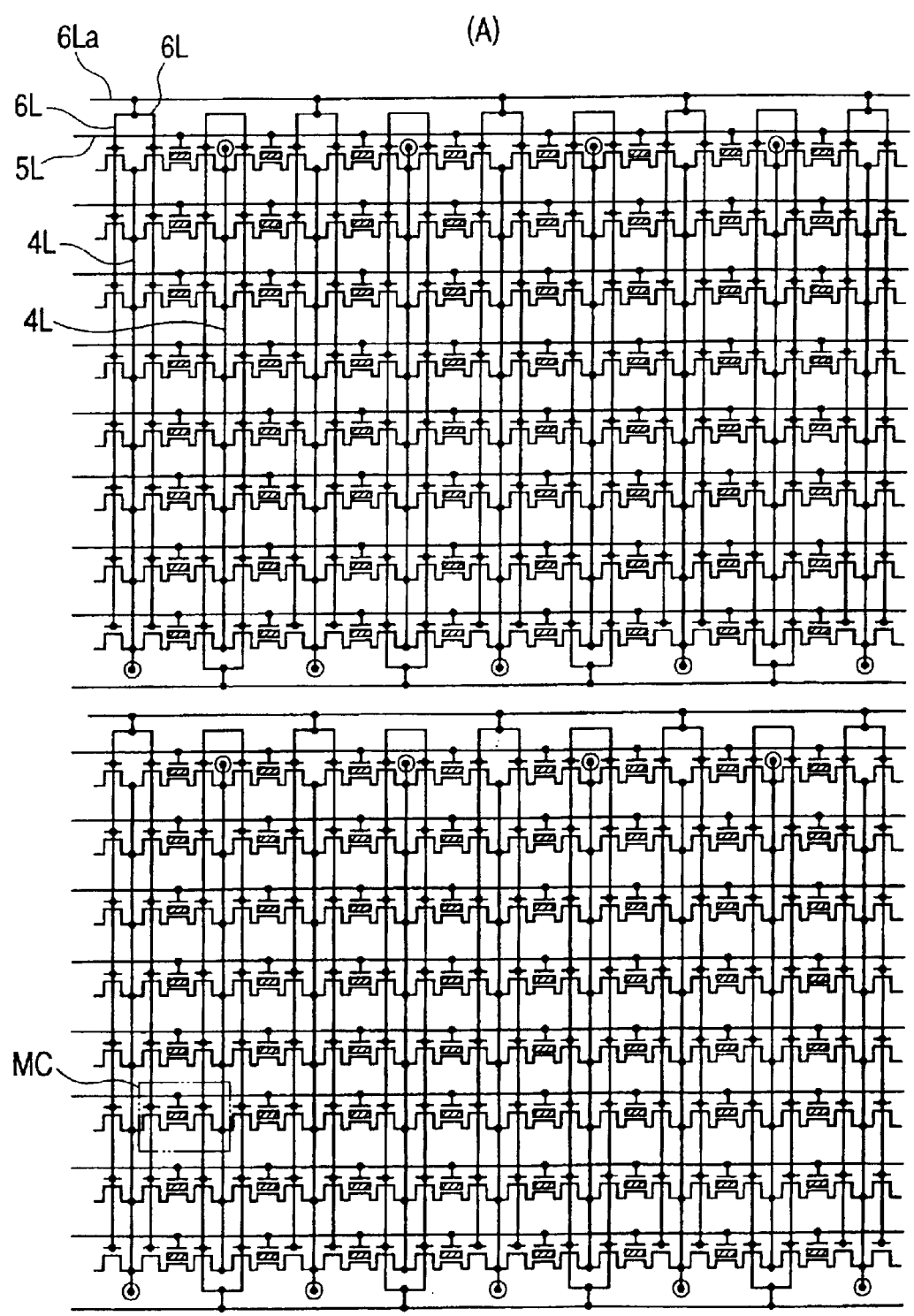
FIG. 28 is a circuit diagram showing the first arrangement example (A) of the memory cell array including the memory cells of the first embodiment.

In the memory cell array shown in FIGS. 27 and 28, the switch transistors of neighboring memory cells share a gate electrode line 6L, and the switch gate lines 6La are disposed above and below each 8 word lines 5L so that the switch gate lines of the switch transistors Trsw in the same memory cell is independently provided, respectively. In the short-circuited gate lines of the switch transistors Trsw, since a same potential is applied to the gate electrodes of the memory transistors and the switch transistors of neighboring memory cells, the operations of the neighboring memory cells are discriminated by how a potential is applied to the source/bit line diffusion layers 4. That is, a memory cell to be accessed is activated in such a manner that the source line of the memory cell to be accessed is maintained at a ground potential and the supply of a potential to the source line of a neighboring memory cell, which is not accessed, is turned off. As the memory cells are operated, the source lines/bit lines 4L are inter-changed, and such a line connection is referred to as virtual ground.

When the virtual ground is employed, since the source lines/bit lines 4L are set to a floating voltage, floating charge in the memory cell array is unintentionally made to a transient current, whereby read error may be caused. To prevent the flow of the transit current, in the memory cell array (B) shown in FIGS. 29 and 30, each two switch gate lines 6La are disposed above and below 8 word lines 5L, respectively, and the switch gate electrodes 6L of switch transistors Trsw are alternately connected to a different switch gate electrode 6L in order to that the gate potentials of the switch transistors of one of most neighboring memory cells are completely turned off. While the number of the switch gate lines 6La of the switch transistors Trsw is doubled as compared with that of the arrangement shown in FIGS. 27 and 28, it is possible to reduce the occurrence of read error due to a transient current caused by floating charge transferred from neighboring memory cells.

Figure 29:
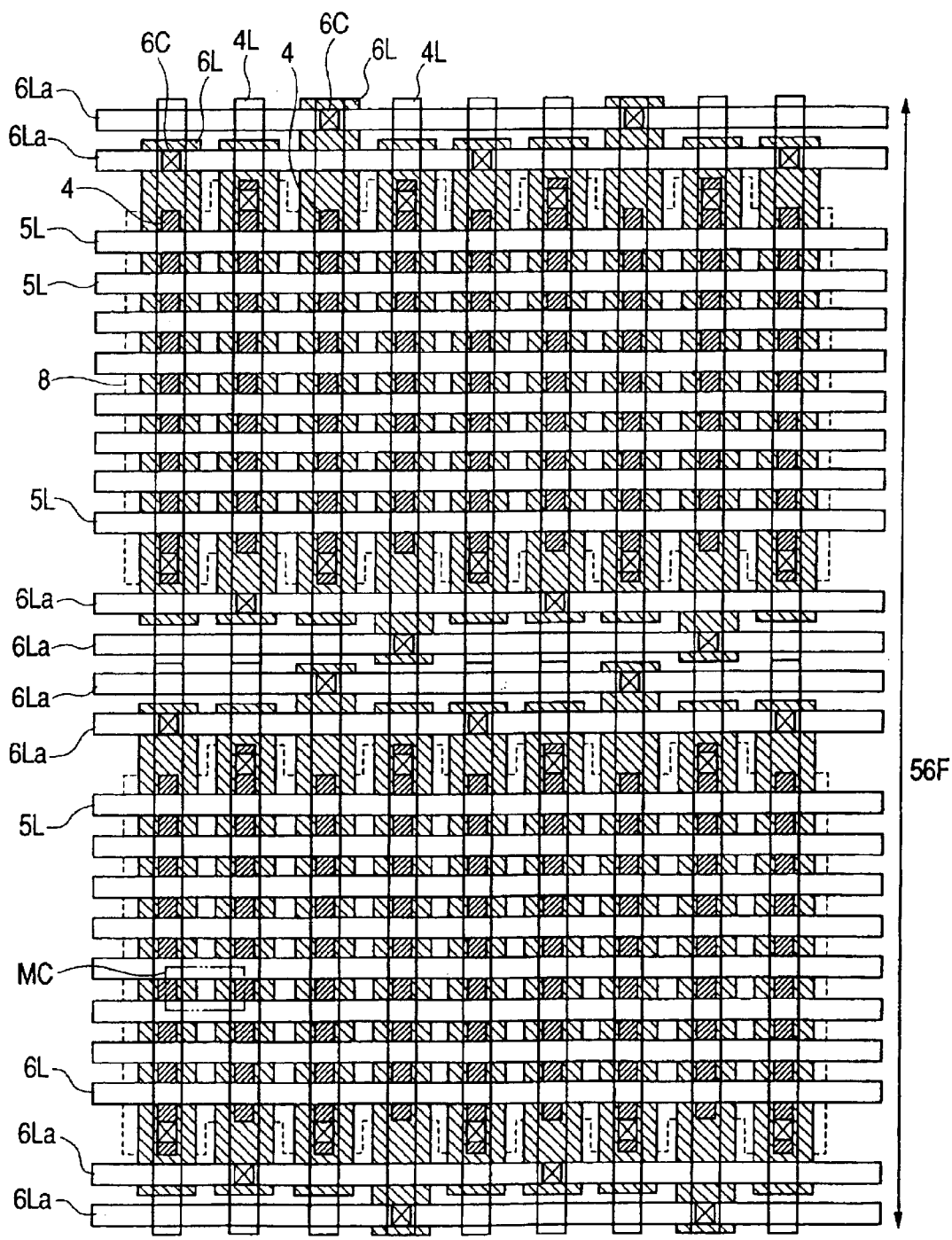
FIG. 29 shows a layout pattern showing a second arrangement example (B) of the memory cell array including the memory cells of the first embodiment.
Figure 30:
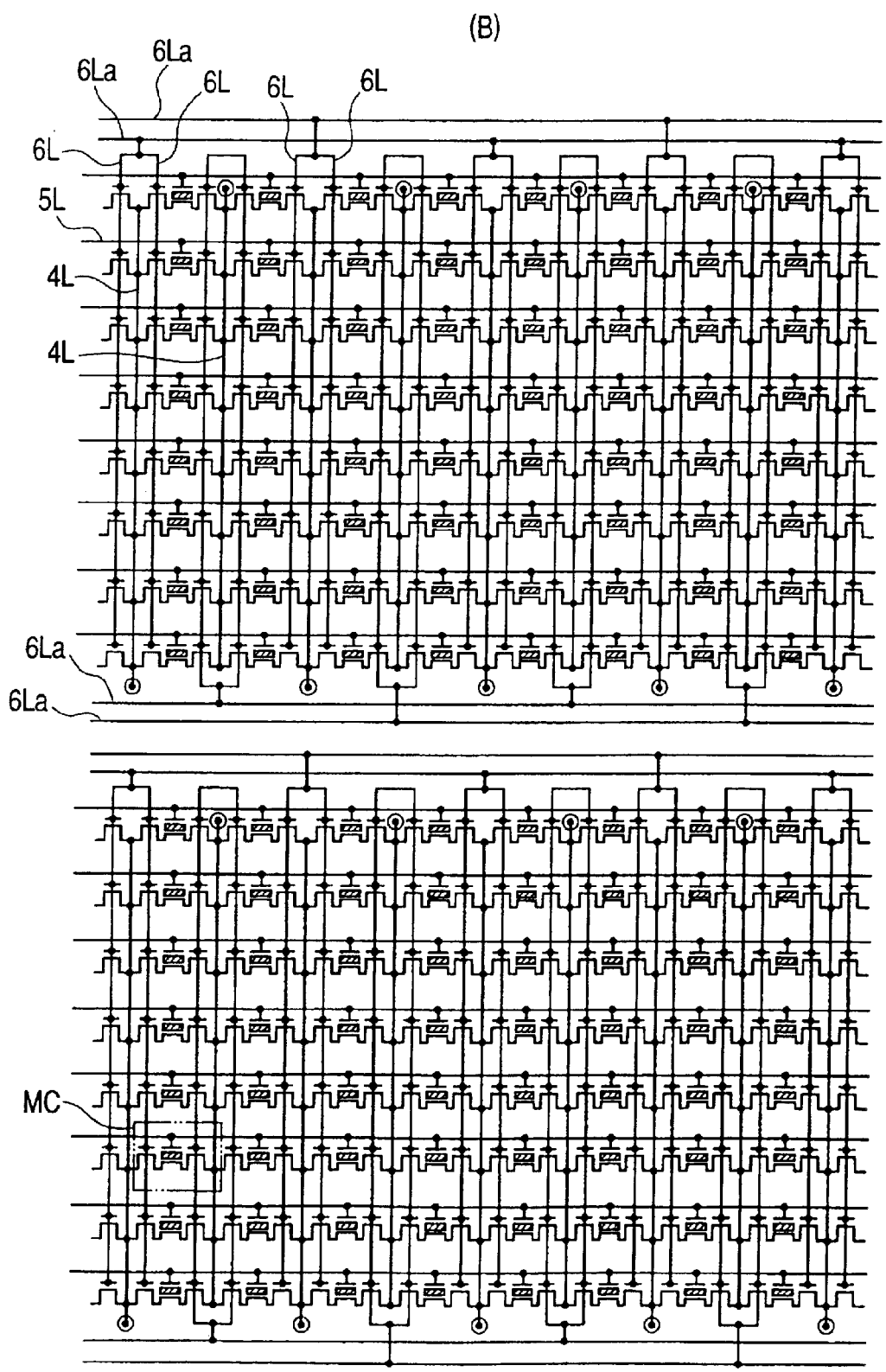
FIG. 30 shows a circuit showing the second arrangement example (B) of the memory cell array including the memory cells of the first embodiment.
Figure 31:
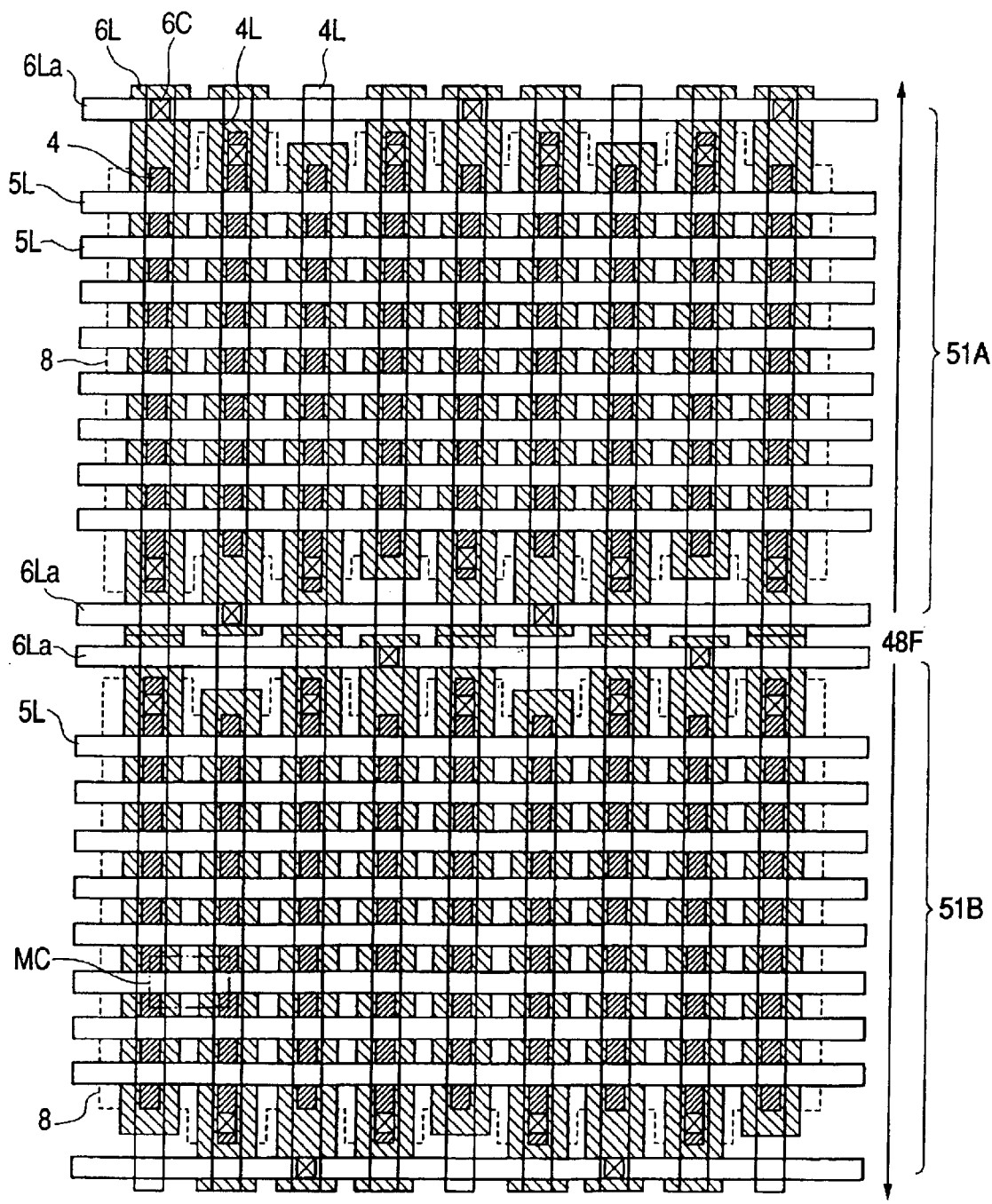
FIG. 31 shows a layout pattern showing a third arrangement example (C) of the memory cell array including the memory cells of the first embodiment.
Figure 32:
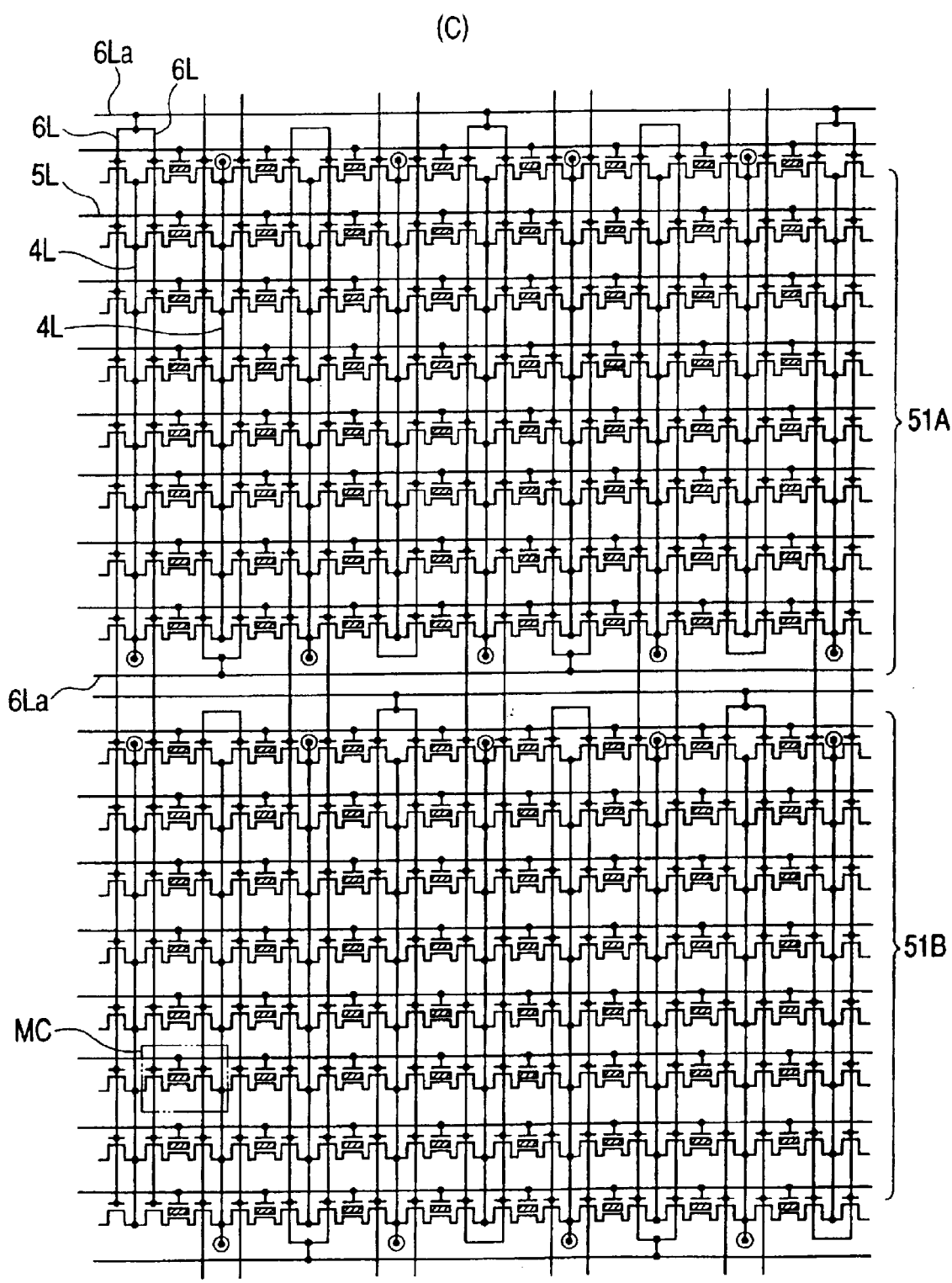
FIG. 32 shows a circuit showing the third arrangement example (C) of the memory cell array including the memory cells of the first embodiment.
Figure 33:
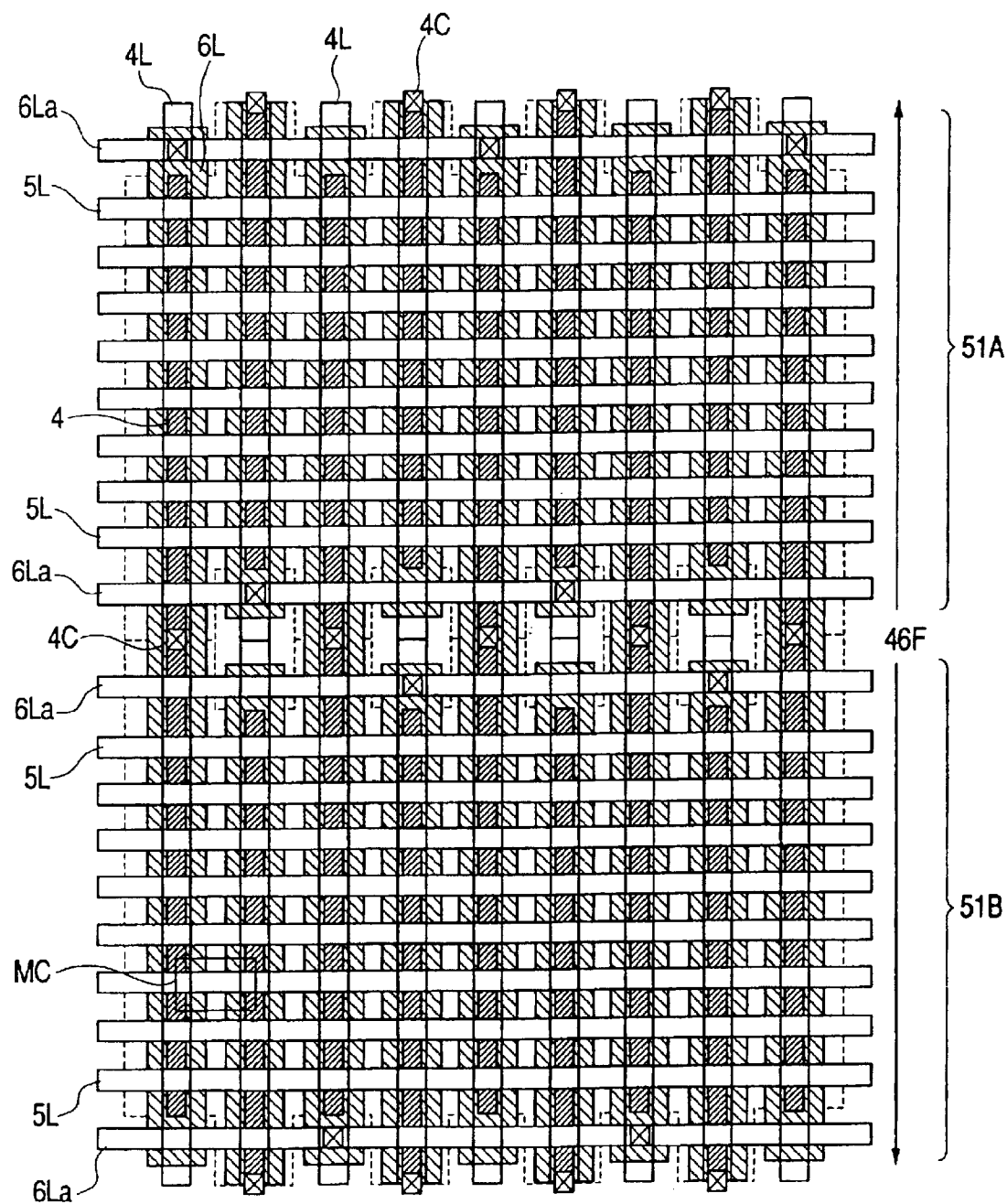
FIG. 33 shows a layout pattern showing a fourth arrangement example (D) of the memory cell array including the memory cells of the first embodiment.
Figure 34:
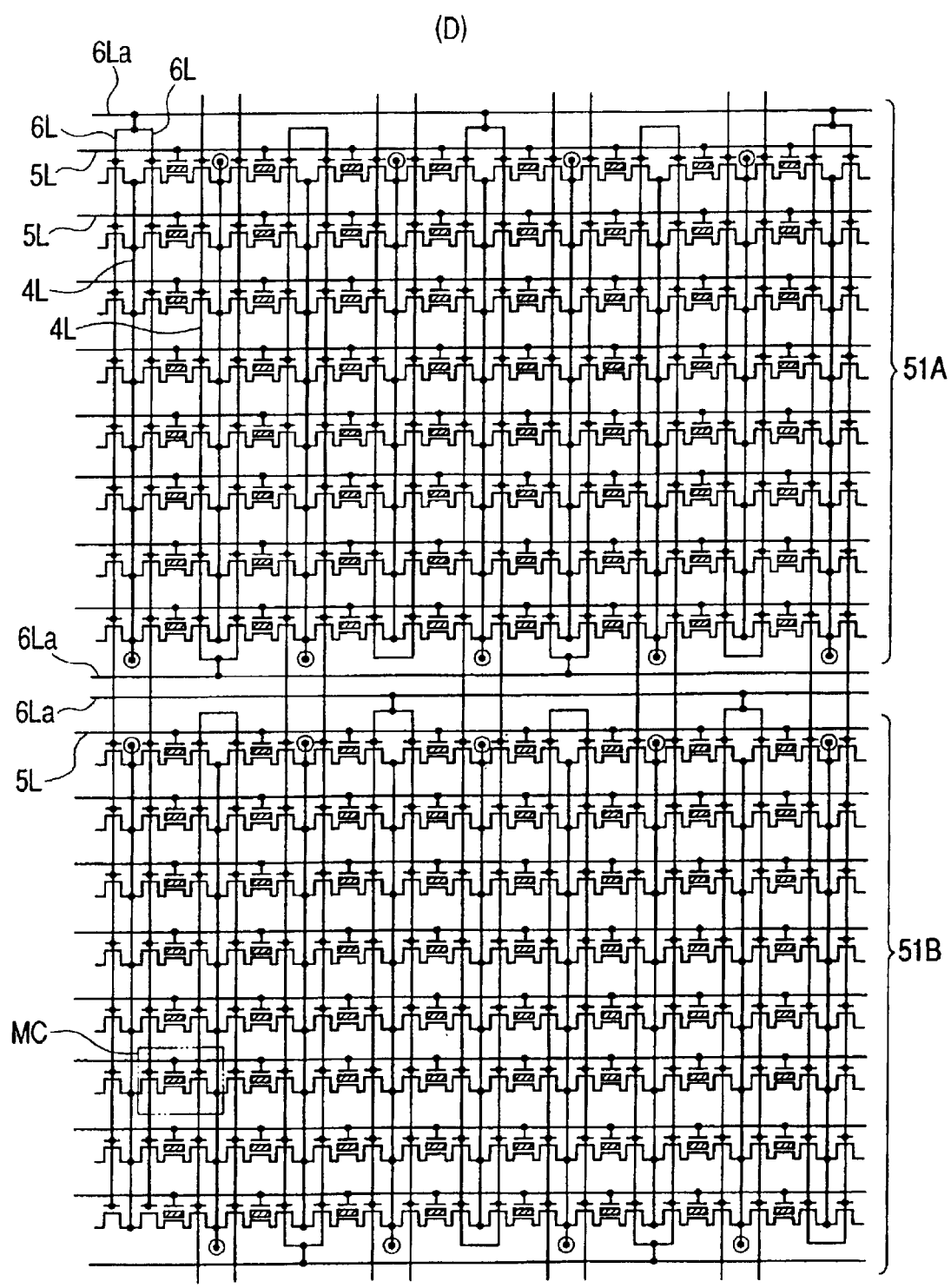
FIG. 34 shows a circuit showing the fourth arrangement example (D) of the memory cell array including the memory cells of the first embodiment.

When the switch gate electrode lines 6L, 6L of the switch transistors Trsw are alternately short-circuited to the different switch gate line 6La as shown in FIGS. 29 and 30, the number of the switch gate lines 6La is increased and the area of a memory cell array 51 is increased thereby. To prevent an increase in the area, the memory cell array (C) shown in FIGS. 31 and 32 may be employed. In the arrangement shown in FIGS. 31 and 32, the switch gate electrode lines 6L of switch transistors Trsw are shared between memory cell array sections 51A and 51B as a minimum unit which extend in a direction of source lines/bit lines 4L and disposed adjacent to each other. Each half of the shared lines is allotted to the neighboring upper and lower memory cell arrays, respectively. This arrangement of the lines is inevitable to make a flat layout. However, since the switch gate electrode lines 6L of the switch transistors Trsw are shared, the area of the memory cell array can be reduced.

In the memory cell array sections 51A and 51B, which are located on both the sides of the direction in which the source lines/bit lines 4L extend, it is also possible to share source/bit line diffusion layers 4. In the memory cell array (D) shown in FIGS. 33 and 34, it is possible to dispose the contact holes 4C, which are connected from the diffusion layers 4 of source lines/bit lines 4L to the source lines/bit lines 4L, between the switch gate lines 6La. The employment of the memory cell array arranged as described above also can reduce the area thereof. However, a maximum advantage of the employment thereof resides in that the number of the contact holes can be reduced by half. A load on fabrication process can be decreased by the reduction of the number of the contact holes 4C to be processed, whereby failures in processing less occur so that reliability and productivity can be improved thereby.

FIGS. 35 to 40 schematically show the sectional structures of a device at stages in a manufacturing process of memory cell described with reference to FIGS. 14 to 16.

Figure 35:
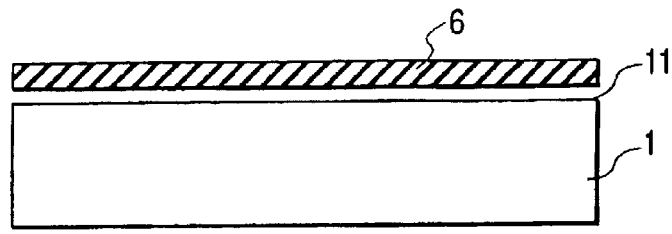
FIGS. 35 to 40 are sectional views of a device at respective stages in a manufacturing process of memory cells of the first embodiment.

FIG. 35 shows up to a step at which the gate insulating film 11 for the switch transistors Trsw and further the material for the switch gate electrodes 6 are deposited on the silicon semiconductor substrate 1. While a thermal silicon dioxide thin film, which is formed by subjecting the silicon semiconductor substrate 1 to high-temperature thermal oxidation and has a thickness of 20 nm is, used as the gate insulating film 11 here, any other insulating film such as an oxynitride film and the like may be used. A poly-silicon thin film having a thickness of 150 nm is used as the material of the switch gate electrodes 6.

Figure 36:
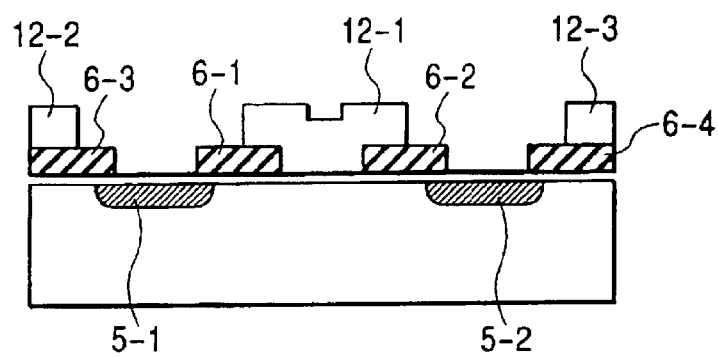

FIG. 36 shows up to a step at which the switch gate electrodes 6-1, 6-2, 6-3, and 6-4 of the switch transistors Trsw are formed by processing the switch gate electrode 6 material, and high density impurity diffusion layers 4-1 and 4-2 are formed in a bit line section by doping arsenic (As) and phosphorus (P) to the bit line section by ion implantation while masking the bit line section with resists 12-1, 12-2, and 12-3.

Figure 37:
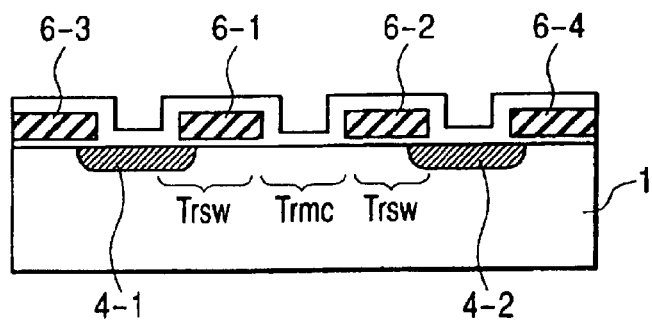

FIG. 37 shows up to a step at which the resist mask used in the ion implantation is removed and wet thermal oxidation is applied at a relatively low temperature of 700° C. While the thermal dioxide film formed at the time selectively has a thickness of about 100 nm with respect to the switch gate electrodes 6-1, 6-2, 6-3, and 6-4, which include the poly-silicon thin film, of the switch transistors Trsw and to the bit line sections 4-1 and 4-2 subjected to the ion implantation of high density arsenic (As) and phosphorus (P), the thermal dioxide film directly formed on the silicon semiconductor substrate 1 has a thickness as thin as about 20 nm. The difference of the thickness of the thus formed thermal dioxide film depends upon the crystallinity of silicon to be oxidized.

Figure 38:
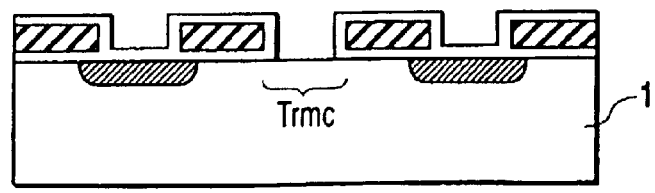

FIG. 38 shows up to a step at which the thermal dioxide film, which is as thin as about 20 nm and directly formed on the silicon semiconductor substrate 1, is removed so that the surface of the silicon semiconductor substrate 1 is exposed to the memory transistor Trmc.

Figure 39:
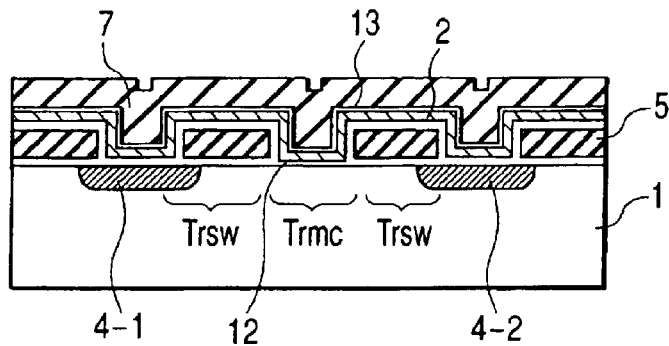

FIG. 39 shows up to a step at which a tunnel oxide film 12 having a thickness of 1.8 nm or 5 nm is formed on the surface of the silicon semiconductor of the memory transistor, subsequently the silicon nitride film 2 having the discrete traps is deposited to a thickness of 15 nm, further an oxide film 13 is formed, and furthermore the electrode material of the memory gate electrode 7 is deposited. At the time, the oxide film 13 is formed of a CVD thermal oxide film deposited to a thickness of 3 nm by means of CVD while it may be formed by oxidizing the surface of the silicon nitride thin film at high temperature. A doped poly-silicon thin film having a thickness of 300 nm is used as the material of the memory gate electrode 7. Since the electrode material of the memory gate electrode 7 of the memory transistor also serves as the word lines of the memory cell array, the electrode material preferably has a low resistance. Thus, a metal electrode including tungsten W or the like is used as the electrode material.

Figure 40:
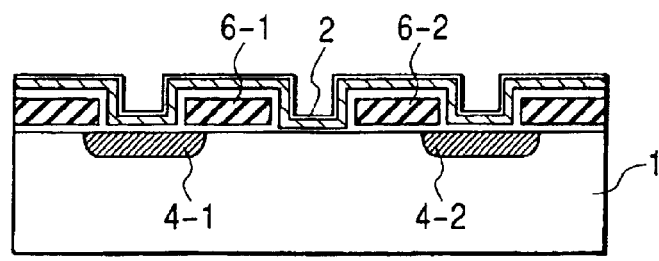

Note that FIG. 39 shows the cross section of electrode material of the memory gate electrode 7 after it is processed to the word lines 5, that is, the cross section taken along line A–A' of FIG. 16. FIG. 40 shows the cross section of the areas between the word lines 5, that is, the cross section taken along line B–B' of FIG. 16. Only the gate electrode material is removed in the areas between the word lines 5, and the silicon nitride film having the discrete traps is left therein. This is because that the charge stored under the memory gate is not transferred laterally. After the structures shown in FIGS. 39 and 40 are formed, interlayer insulating films, the metal lines of upper layers, and the like are formed according to an ordinary semiconductor LSI manufacturing method.

<Second Embodiment of Memory Cell>

Figure 41:
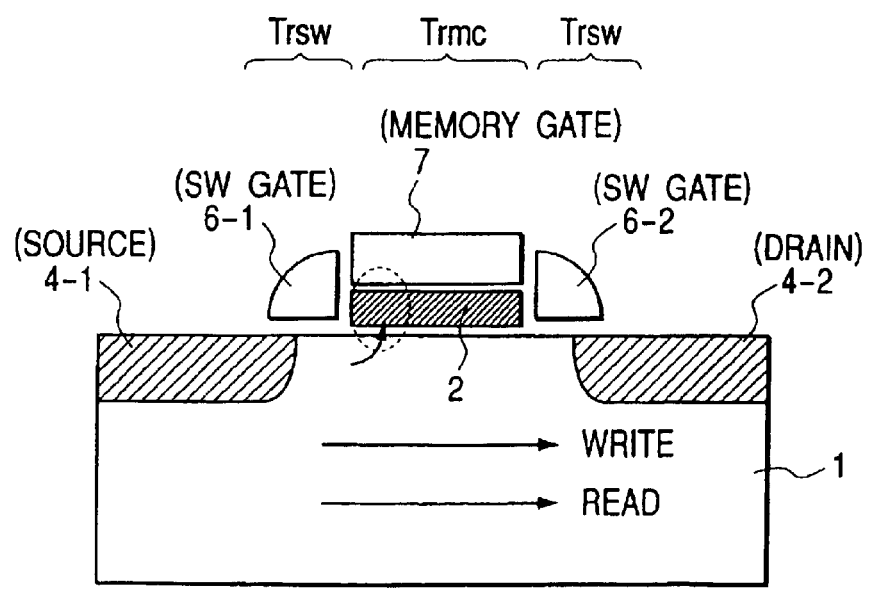
FIG. 41 is a sectional view showing a nonvolatile memory cell of a second embodiment according to the present invention with an attention paid to the first program and read method.
Figure 42:
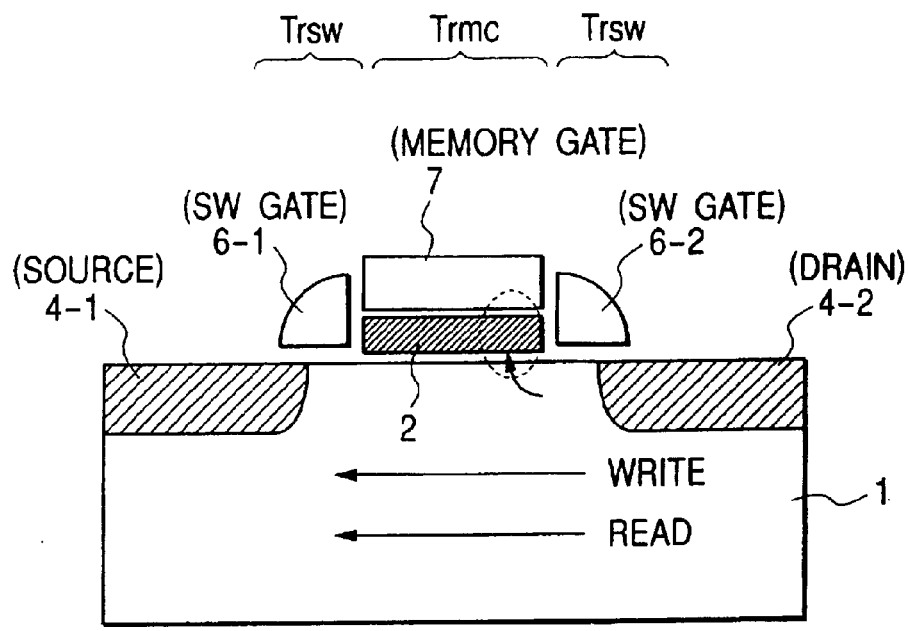
FIG. 42 is a sectional view showing the nonvolatile memory cell of the second embodiment according to the present invention with an attention paid to the second program and read method.
Figure 43:
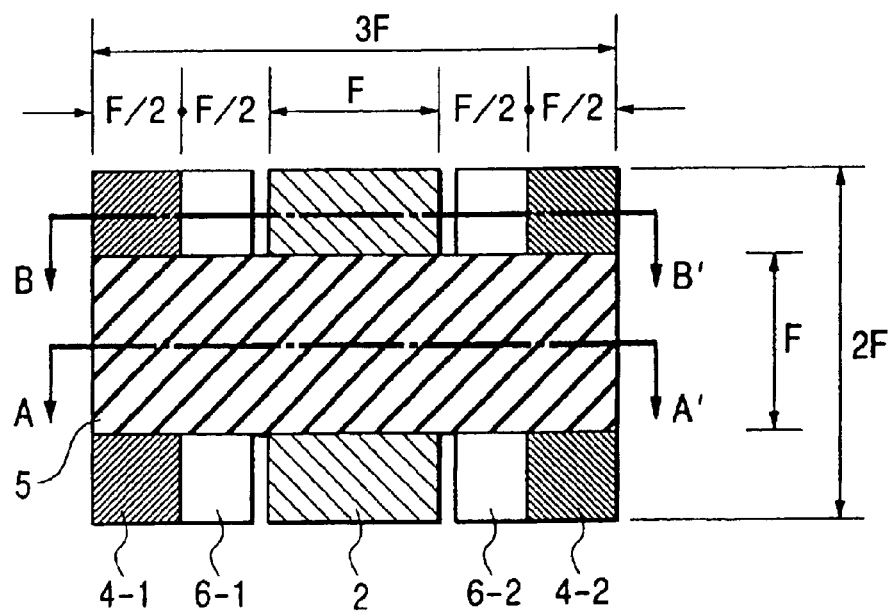
FIG. 43 shows a layout pattern of the nonvolatile memory cell of the second embodiment.

FIGS. 41 to 43 exemplify a second embodiment of a memory cell. The memory cell shown in the figures has such a structure that switch transistors Trsw are formed on both the sides of a memory transistor Trmc by diffusion using a self-aligned side-wall gate processing technology. In this case, a gate length of each switch transistor Trsw can be processed to about one half a technology feature size F. Accordingly, as apparent from FIG. 43, a size of the memory cell per one bit can be regarded as $3F^2$ while a size of the memory cell is $6F^2$, and thus a cell size, which is about one half a conventional cell size, is realized, whereby high density can be achieved. Since the transistors in the memory cell are disposed and lined entirely similarly to those of the memory cell provided according to FIGS. 14 to 16, it is possible to carry out program at high speed, to reduce deterioration of program, to avoid read disturb, and to expand a signal detection margin.

Figure 44:
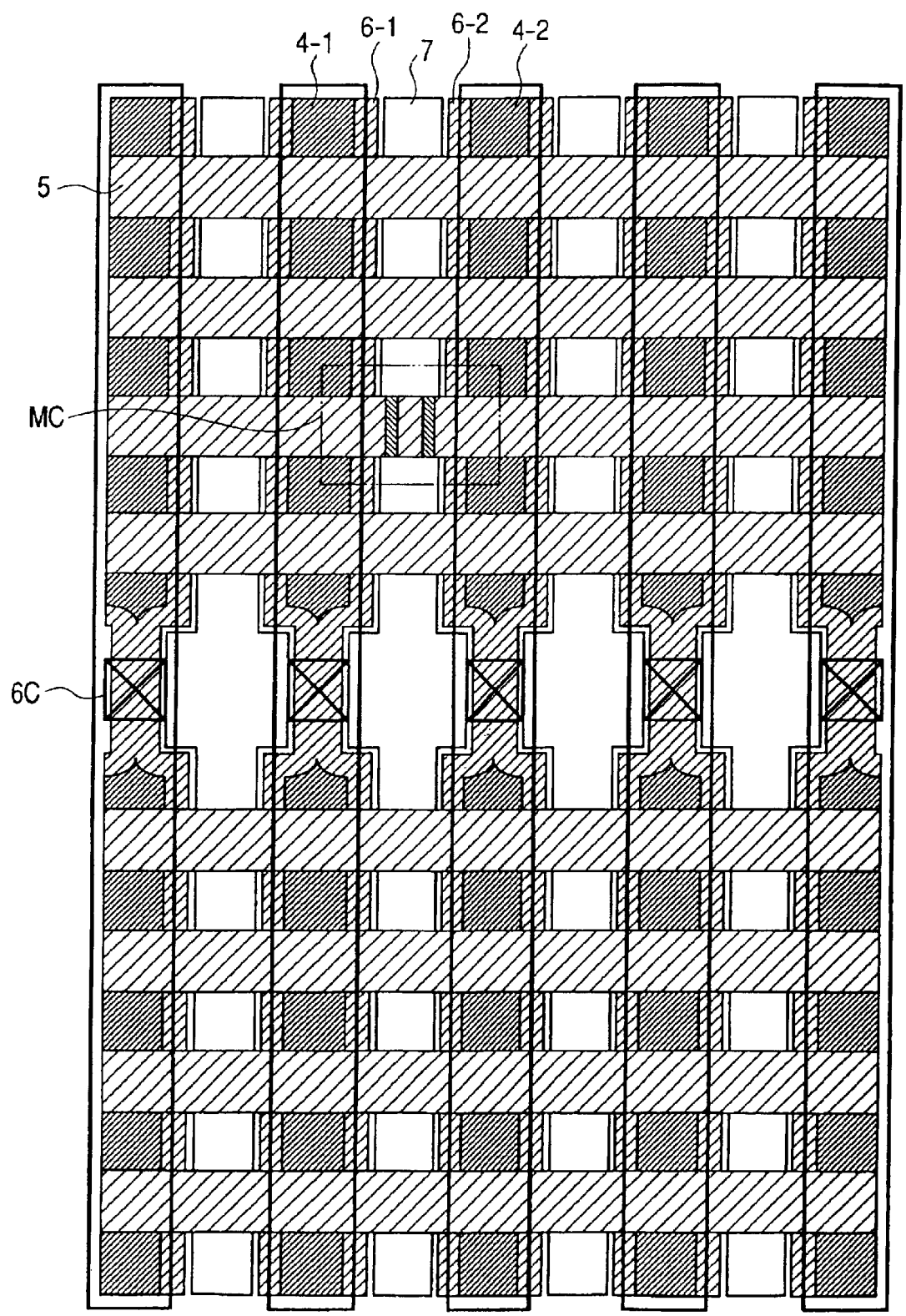
FIG. 44 shows a layout pattern of a memory cell array using the nonvolatile memory cells of the second embodiment.

FIG. 44 exemplifies how the switch transistors Trsw having side wall gates 6-1 and 6-2, which are formed in a size smaller than the technology feature size, are connected to a peripheral circuit in the memory cell having the structure shown in FIGS. 41 to 43. The side wall gates 6-1 and 6-2 are formed making use of a portion of an electrode material which is left when the electrode material is formed thickly on the side wall of a memory gate electrode 7 and uniformly etched vertically. When grooves each having a width, which is at most about twice a width of side wall gate electrodes, are formed, an electrode material buried therein can be formed to have a thickness larger than a thickness of a film deposited on a flat portion. Accordingly, when vertical anisotropic etch is carried out, the electrode material is left between the grooves. Moreover, since the electrode material is formed along the shape of the grooves, it is formed in self-aligned diffusion and can be easily connected to the side wall gates 6-1 and 6-2. FIG. 44 shows a structure in which shunts are disposed midway through contact holes 6C to prevent an increase in electric resistance due to an increased line length of the side wall gate electrodes 6-1 and 6-2 in a memory cell array. The structure can be applied to the layout of other circuits.

FIGS. 45 to 51 schematically show the sectional structures of a device at stages in a manufacturing process of memory cells described with reference to FIGS. 41 to 43.

The structure of the memory cell is such that the switch transistors Trsw are formed on both the sides of the memory transistor Trmc using the side-wall gate technology. Accordingly, the memory transistor Trmc is formed first.

Figure 45:
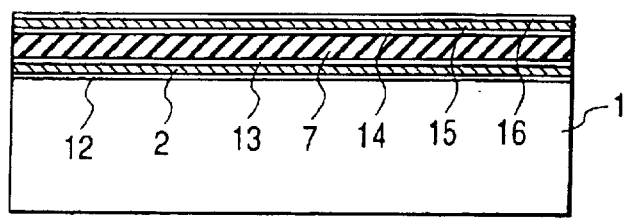
FIGS. 45 to 50 are sectional views of a device at respective stages in a manufacturing process of memory cells of the second embodiment.

FIG. 45 shows up to a step at which a tunnel oxide film 12 having a thickness of 1.8 nm or 5 nm is formed on a silicon semiconductor substrate 1 to form the memory transistor thereon first, a gate insulating film 2 such as a silicon nitride film having discrete traps and a thickness of 15 nm is deposited, a dioxide film 13 having a thickness of 3 nm is formed, the poly-silicon material, which has a thickness of 300 nm, of the memory gate electrode 7 is deposited, and further a thin dioxide film 14, a silicon nitride film 15 and a thin oxide film 16, which will be required in processing later, are formed.

Figure 46:
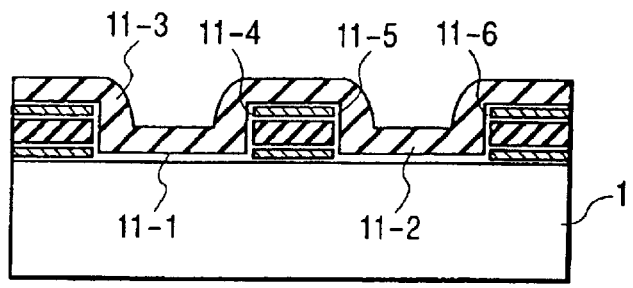

In FIG. 46, anisotropic etch is carried out along a gate lengthwise direction to form the memory transistor Trmc, and gate insulations 11-1 and 11-2, which have a thickness of 20 nm and are used for the switch transistors Trsw, and thermal oxide films 11-3, 11-4, 11-5, and 11-6, which constitute the side surfaces of the memory transistor Trmc and have a thickness of about 100 nm, are formed simultaneously on the exposed silicon semiconductor substrate 1. Further, a poly-silicon having a thickness of 400 nm, which is used for the side wall gate electrodes 6-1, 6-2, . . . of the switch transistors Trsw, are deposited and further bit lines are formed by doping arsenic (As) and phosphorous (P) to high density impurity diffusion layers 4-1 and 4-2 by ion implantation. A thickness of the side surfaces of the memory transistor Trmc is partially increased by a coverage effect of the deposited poly-silicon.

Figure 47:
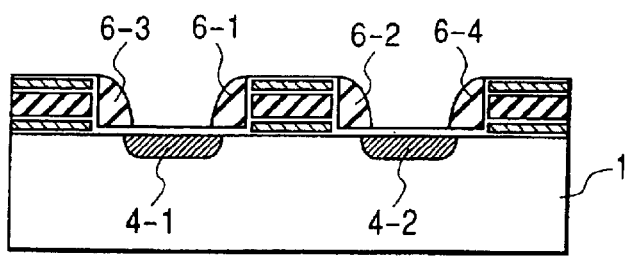

FIG. 47 shows up to a step at which the poly-silicon films, which are deposited to a thickness of 400 nm, of the side wall gate electrode materials 6-1 and 6-2 are removed by a thickness of 400 nm by approximately vertical anisotropic etch. However, the partially thick portions, which are shown in FIG. 46, of the side walls of the memory transistor Trmc are left without being etched. The poly-silicon films 6-1, 6-2, 6-3, and 6-4 which are left on the side walls of the memory transistor are arranged as the side wall gate electrodes.

Figure 48:
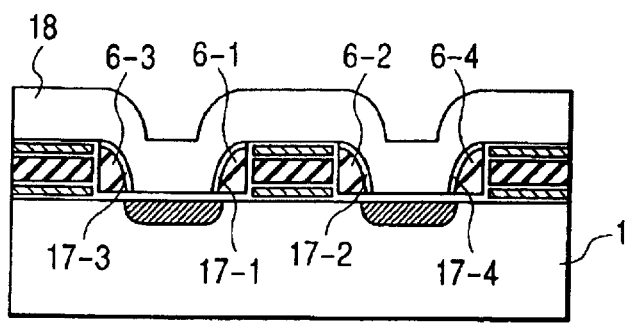

FIG. 48 shows up to a step at which an oxide film 18 having a thickness of 400 nm is formed by CVD after thermal oxide films 17-1, 17-2, 17-3, and 17-4 each having a thickness of 50 nm are formed by subjecting the peripheries of the side wall gate electrodes 6-1, 6-2, 6-3, and 6-4 including the poly-silicon films to thermal oxidation. The CVD oxide film 18 is unevenly formed by the influence of shapes of the base materials such as the memory transistor Trmc, the side wall gate electrodes 6-1, 6-2 and the like.

Figure 49:
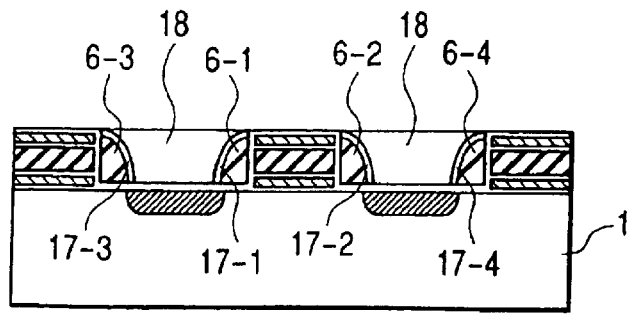

FIG. 49 shows up to a step at which the projecting portions of the uneven CVD oxide film previously deposited and having the thickness of 400 nm are removed by chemical mechanical polishing. At the time, it is necessary that the thermal oxide films 17-1, 17-2, 17-3, and 17-4 formed around the peripheries of the side wall gate electrodes be left and that the side wall gate electrodes 6-1, 6-2, 6-3, and 6-4 be protected by insulation.

Figure 50:
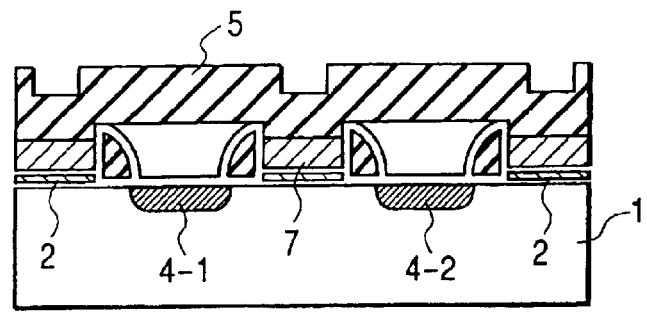

FIG. 50 shows up to a step at which a thin oxide film 14, a nitride film 15, and the an oxide film 16 are chemically removed from the upper portion of the memory transistor Trmc after the state shown in FIG. 49 is achieved, and subsequently a material of word lines 5 is deposited so that the word lines 5 are electrically connected to the memory gate electrode of the memory transistor Trmc. Since it is preferable that the material of the word lines 5 has a low resistance, a metal electrode including tungsten or the like is used as the material.

Figure 51:
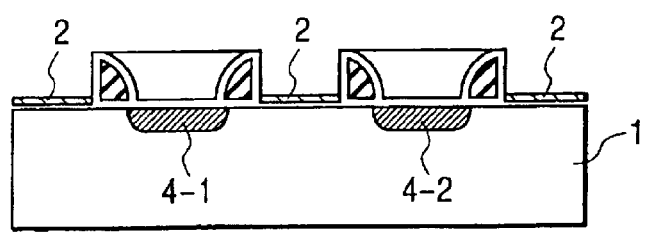
FIG. 51 is a sectional view of another device at a stage similar to that shown in FIG. 49 in the manufacturing process of the memory cell of the second embodiment.

FIG. 50 shows the cross section of the device after the material of the word lines 5 is processed, that is, the cross section taken along line A–A' of FIG. 43. FIG. 51 shows the cross section of the areas between the word lines 5, that is, the cross section taken along line B–B' of FIG. 43. The material of the word lines 5 and the material of the memory gate electrode 7 of the memory transistor Trmc are removed in the areas between the word lines 5 and the gate insulating film 2 having the discrete traps such as the silicon nitride film having the discrete traps is left. This is because that since the charge stored under the memory gate electrode 7 is not transferred laterally, the charge need not be removed. After the structures shown in FIGS. 50 and 51 are formed, interlayer insulating films, the metal lines of upper layers, and the like are formed according to an ordinary semiconductor integrated circuit manufacturing method.

<Third Embodiment of Memory Cell>

Figure 52:
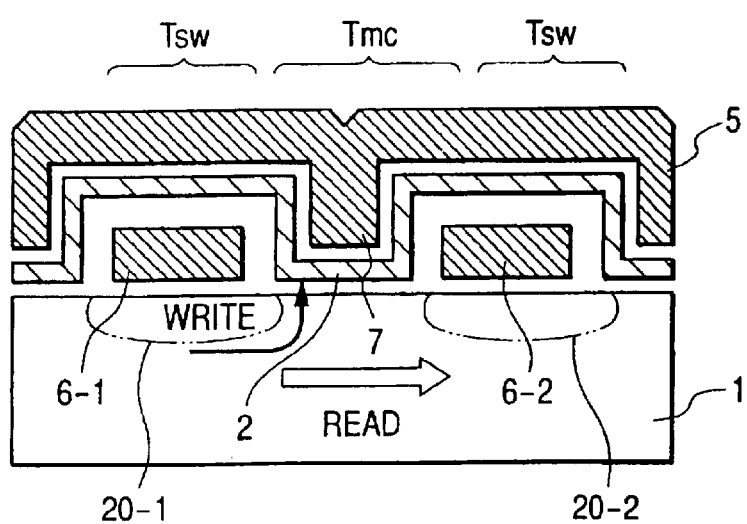
FIG. 52 is a sectional view showing a nonvolatile memory cell of a third embodiment according to the present invention.

FIG. 52 exemplifies a cross section of a memory cell of a third embodiment and FIG. 53 exemplifies a layout thereof. The memory cell of the third embodiment is arranged such that the MOS inversion layers of switch transistors Trsw are used as lines in place of the lines of the diffusion layers 4-1 and 4-2 in the memory cell of the first embodiment. That is, one memory cell has a memory cell structure including one memory transistor Trmc, two switch transistors Trsw and two transistor inversion layer lines 20-1 and 20-2. The memory transistor Trmc includes a gate insulating film 2 having the discrete traps, the memory gate electrode 7 of the memory transistor Trmc is connected to word lines 5, the two transistor inversion layer lines 20-1 and 20-2 form source lines and bit lines as well as the two switch transistors Trsw and the two transistor inversion layer lines 20-1 and 20-2, which form the source lines and the bit lines, share gate electrodes 6-1 and 6-2, respectively.

As exemplified in FIGS. 52 and 53, the memory cell of the third embodiment employs hot-electron source side injection during program and detects a current in the same direction also during read. Since an operation in an opposite direction also is possible in the memory cell, one memory cell can carry out a 2-bit operation. As shown in the layout, one memory cell has a size of $4F^2$ and its size per 1 bit of data is $2F^2$, whereby high density can be realized.

The erase, program and read operations of the memory cell of the third embodiment will be described with reference to FIGS. 54 to 57. In the figures, the switch gate electrodes 6Li, 6Lj and 6Lk of the switch transistors Trsw and the inversion layer lines 20Li, 20Li and 20Lk of the switch transistors Trsw are illustrated as if they are the same lines. Voltages of a semiconductor region constituting the inversion layers are shown in the lower portions of the figures and voltages of the switch gate electrodes are shown in the upper portions thereof.

FIG. 54 shows page mode erase for carrying out simultaneous erase along one word line, and FIG. 55 shows chip (block) mode erase for carrying out simultaneous erase along a plurality of word lines, respectively. Since electrons are drawn out to a memory gate side in the erase operation, a high bias of such as 9 V is applied to a memory gate electrode, that is, on a selected word line 5Li, and a power supply voltage, for example, 3 V is applied to the gate electrodes of source lines/bit lines and a bias of a ground level is introduced to the surface of a substrate, that is, and then a zero bias is introduced to the inversion layers in order to that a high electric field occurs on the silicon nitride film having the discrete traps.

Figure 56:
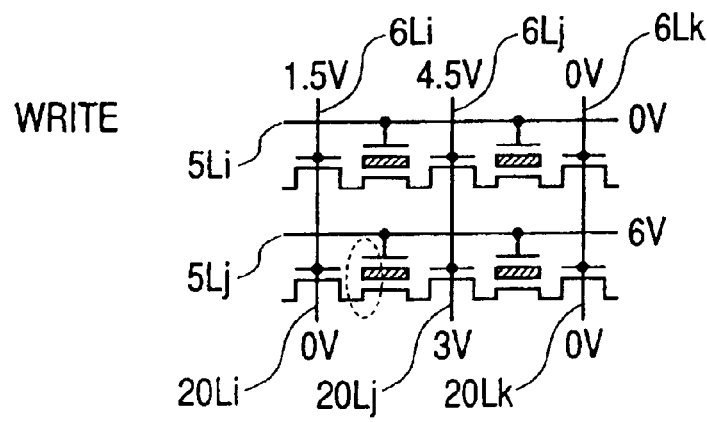
FIG. 56 is a circuit diagram showing bias conditions of a program operation of the memory cells of the third embodiment.

FIG. 56 exemplifies a bias relationship during program. As to a selected bit, a voltage of 1.5 V, which is slightly higher than a threshold voltage (0.5 V), is applied to the gate electrodes on a source side, and carriers, which have been made hot, are attracted to the memory gate electrode, to which a high bias (6 V) is applied, by the high electric field and captured in the gate insulating film having the discrete traps. A voltages 1.5 V, which is a somewhat high bias, is applied to the switch gate electrode of the switch transistor on the source line side, and a voltage 4.5 V, which is a somewhat high bias, is applied to the switch gate electrode of the switch transistor on the bit line side, so that a voltage 0 V is applied to the source line side and a voltage 3 V is applied to the bit line side.

Figure 57:
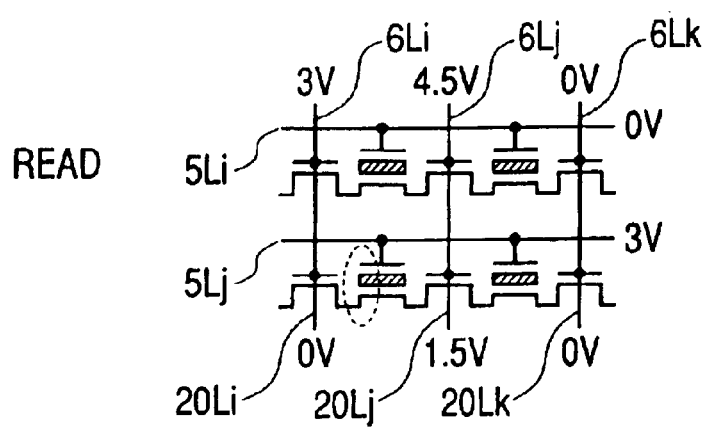
FIG. 57 is a circuit diagram showing bias conditions of a read operation of the memory cells of the third embodiment.
Figure 58:
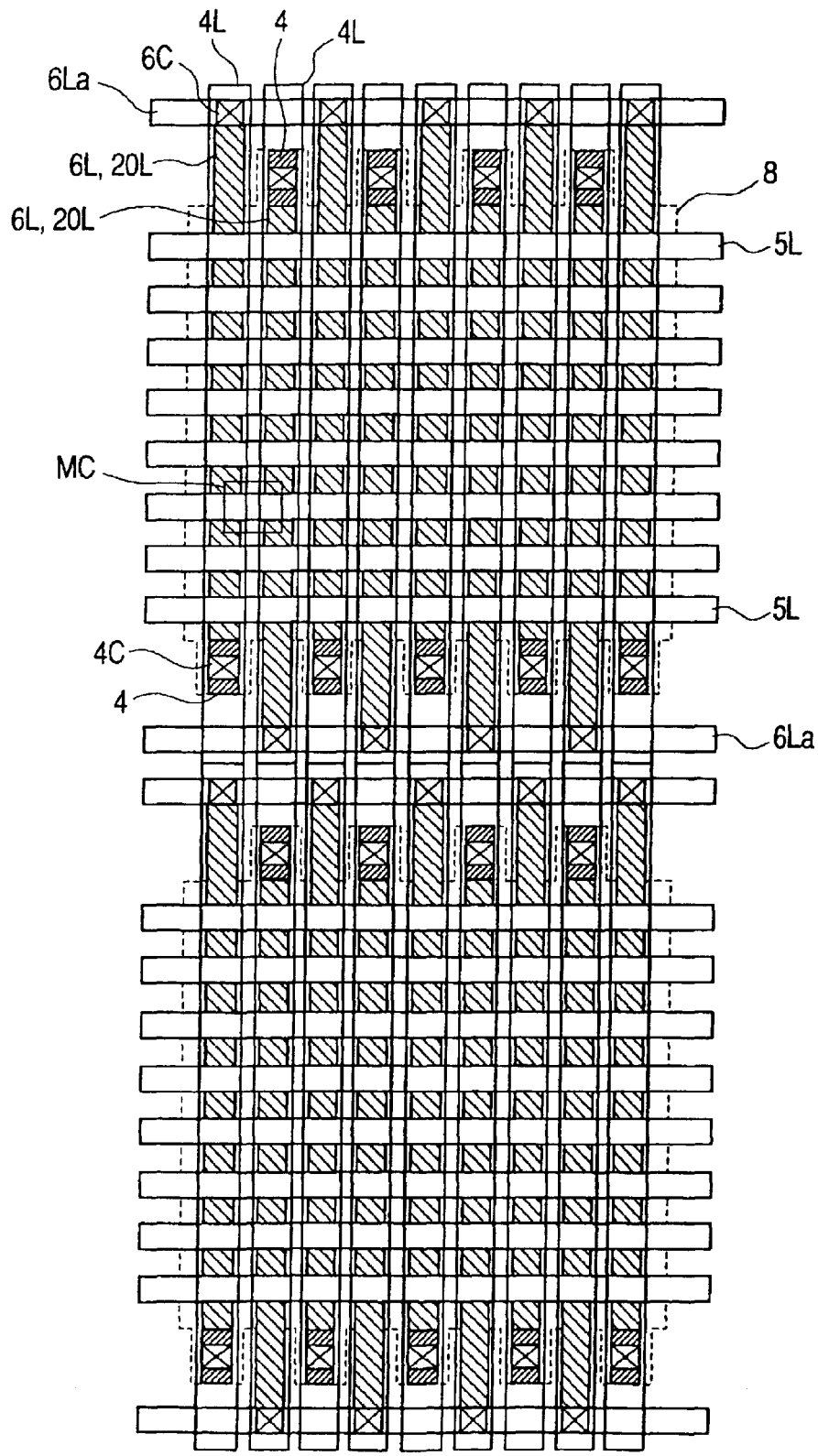
FIG. 58 shows a layout pattern showing a first arrangement example (A) of a memory cell array including memory cells of the third embodiment.
Figure 59:
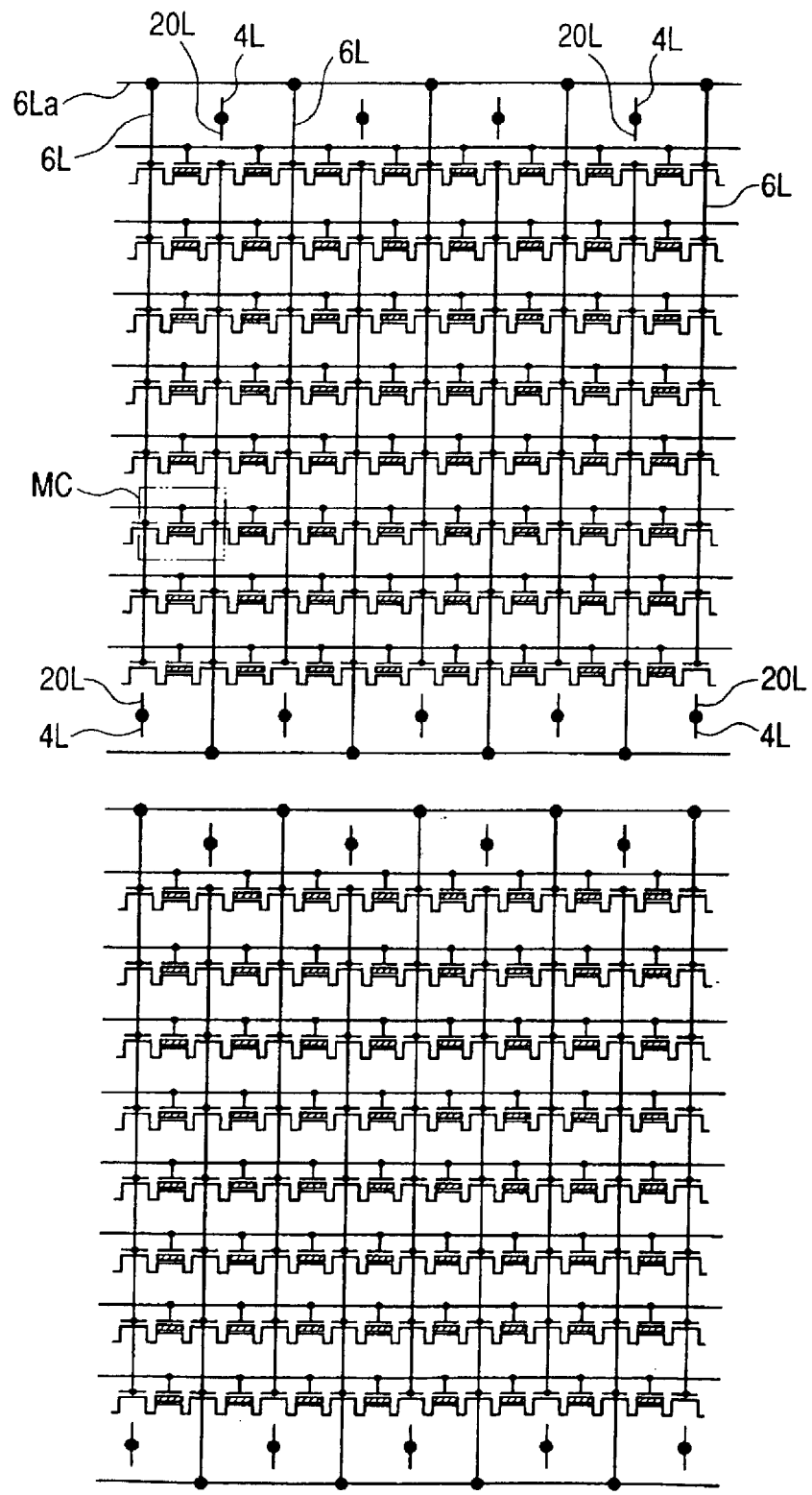
FIG. 59 is a circuit diagram showing the first arrangement example (A) of a memory cell array including memory cells of the third embodiment.
Figure 60:
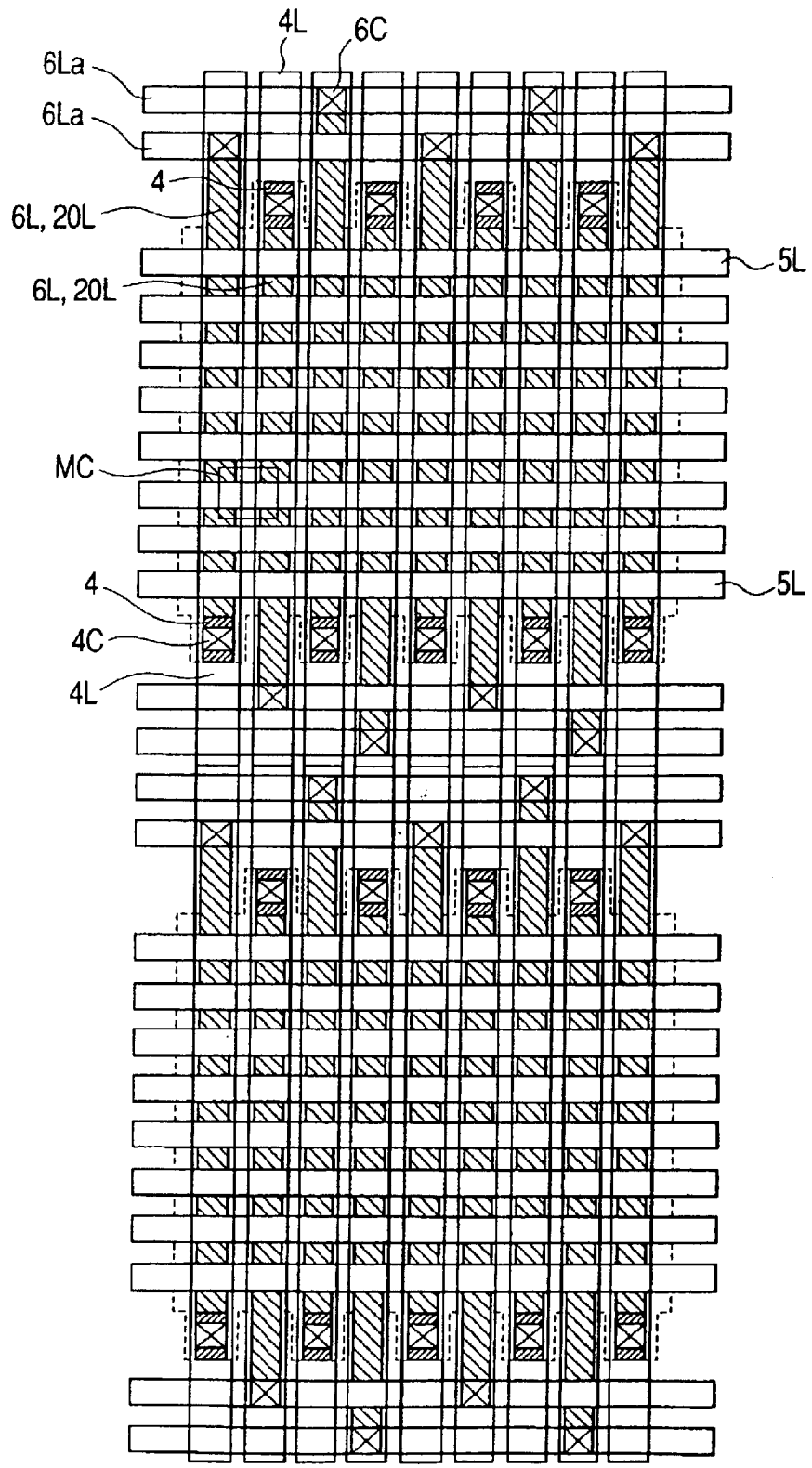
FIG. 60 shows a layout pattern showing a second arrangement example (B) of a memory cell array including memory cells of the third embodiment.
Figure 61:
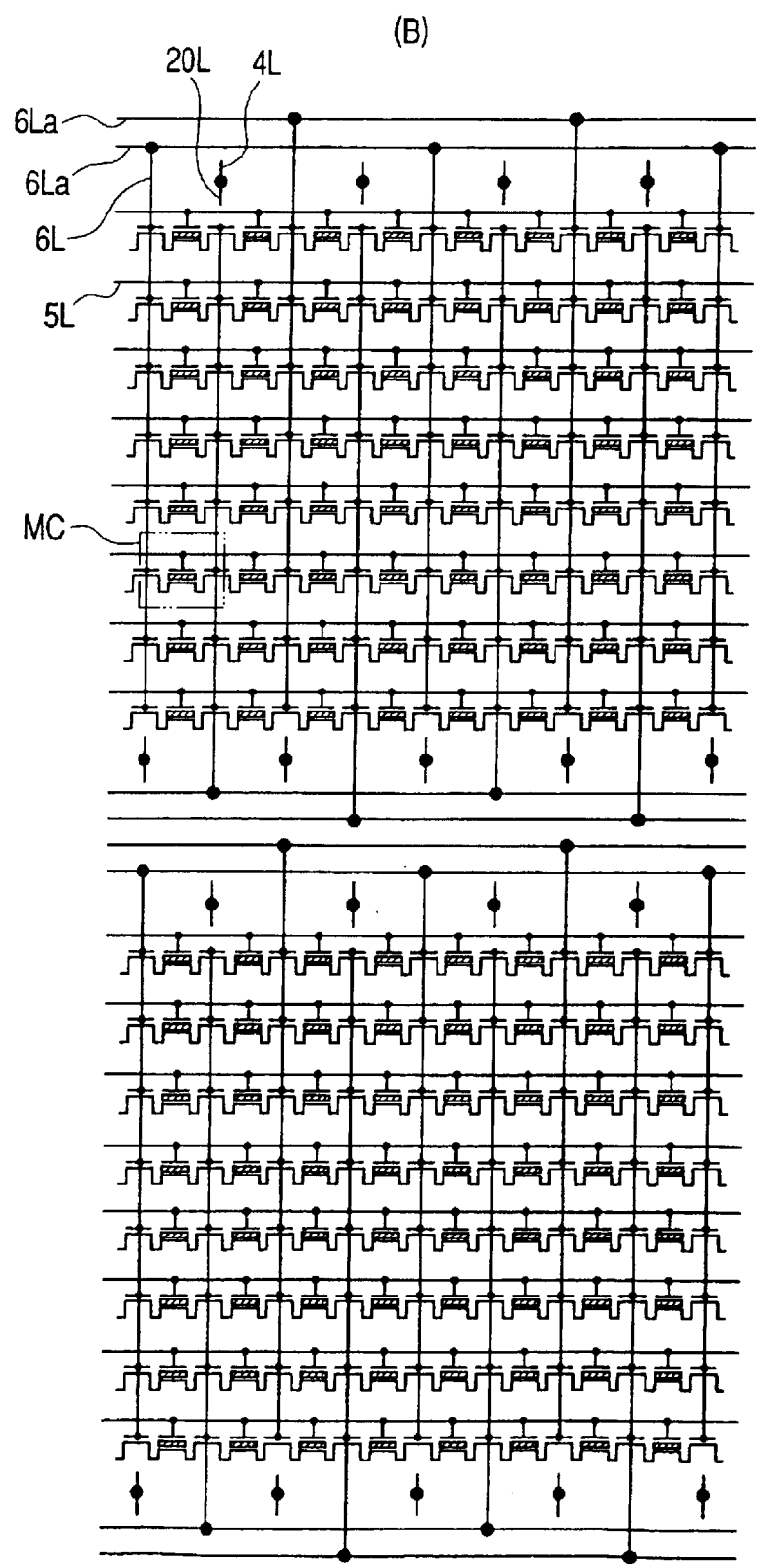
FIG. 61 a circuit diagram showing the second arrangement example (B) of a memory cell array including memory cells of the third embodiment.
Figure 62:
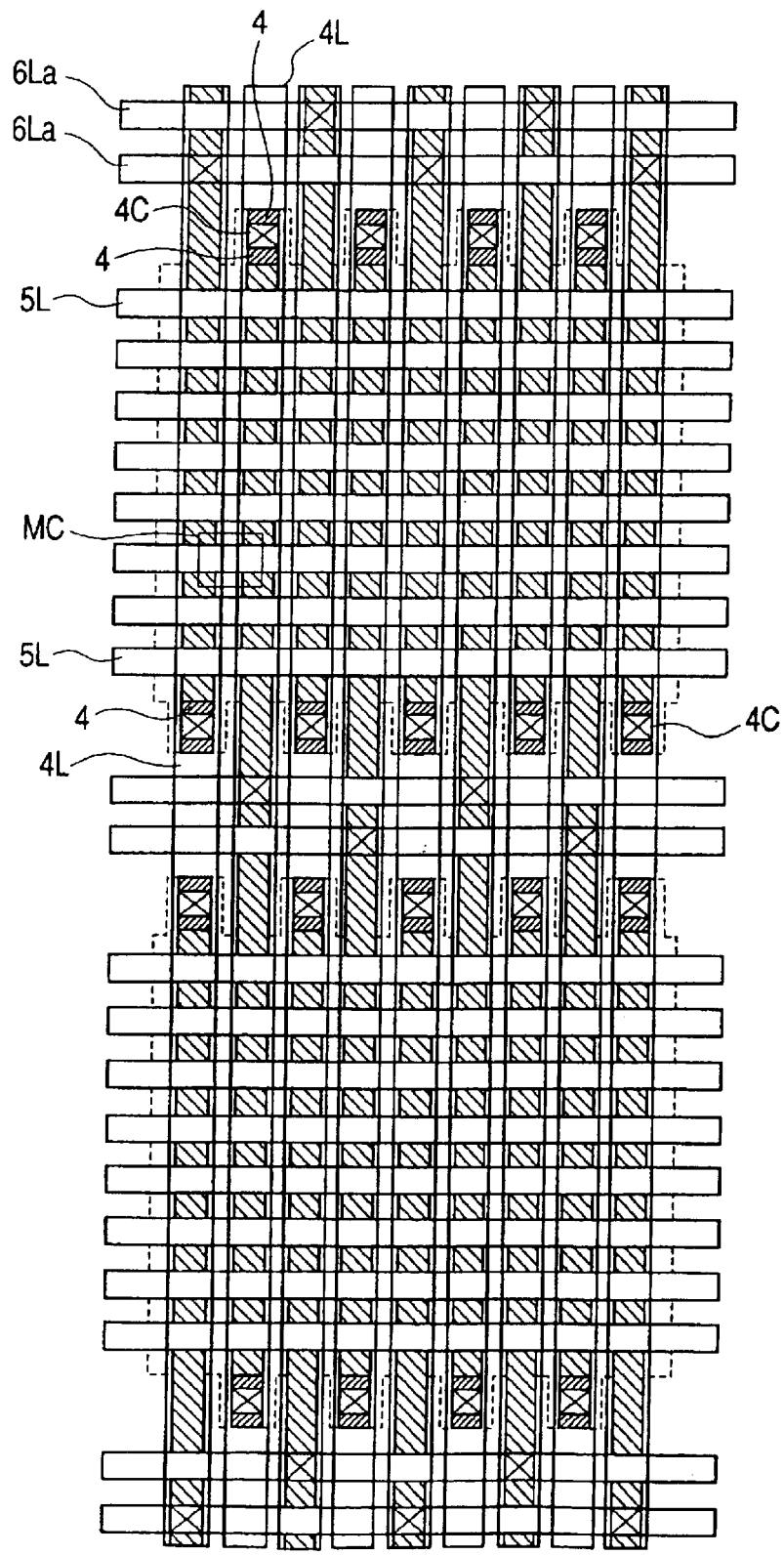
FIG. 62 shows a layout pattern showing a third arrangement example (C) of a memory cell array including memory cells of the third embodiment.
Figure 63:
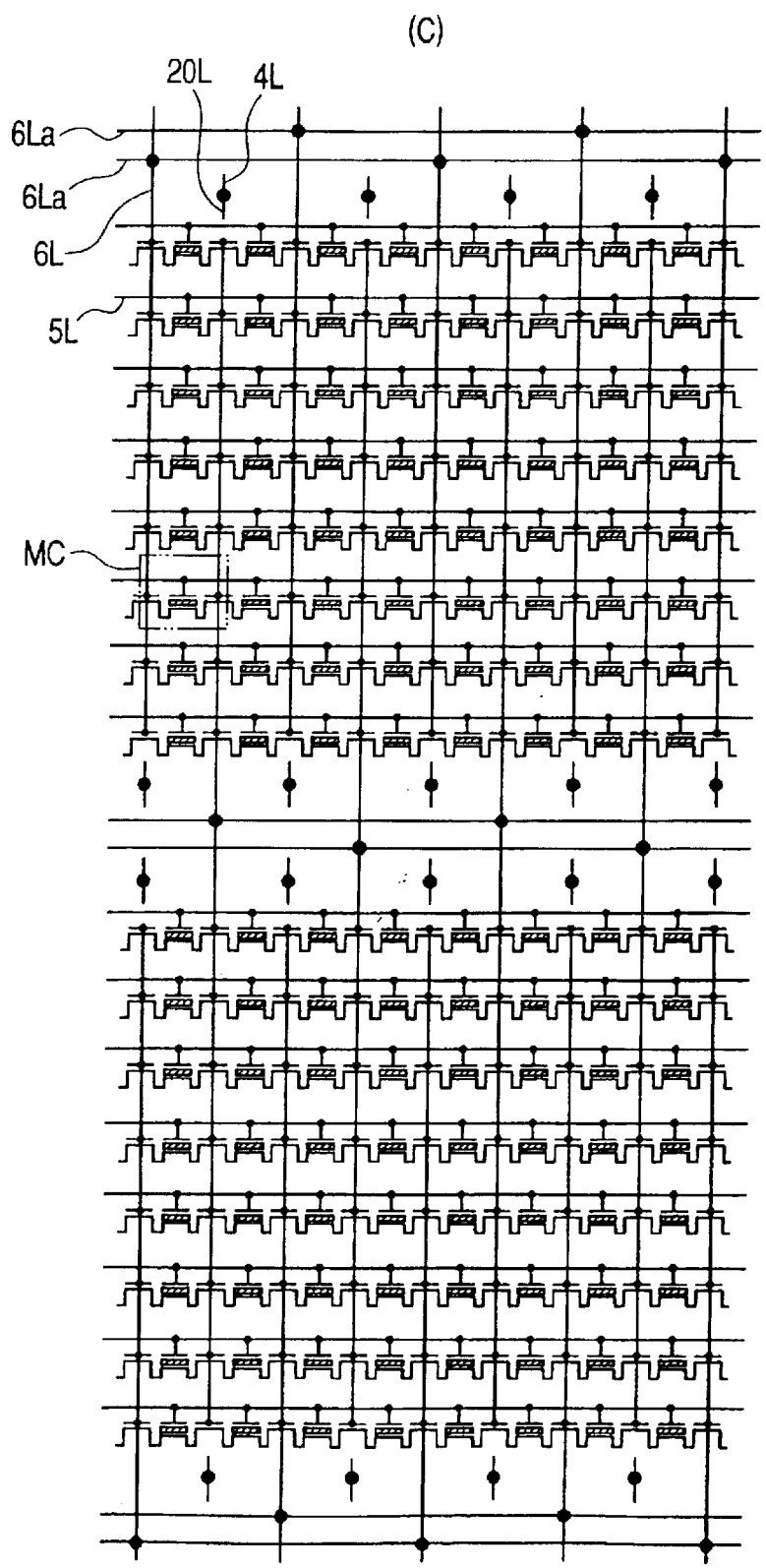
FIG. 63 is a circuit diagram showing the third arrangement example (C) of the memory cell array including the memory cells of the third embodiment.
Figure 64:
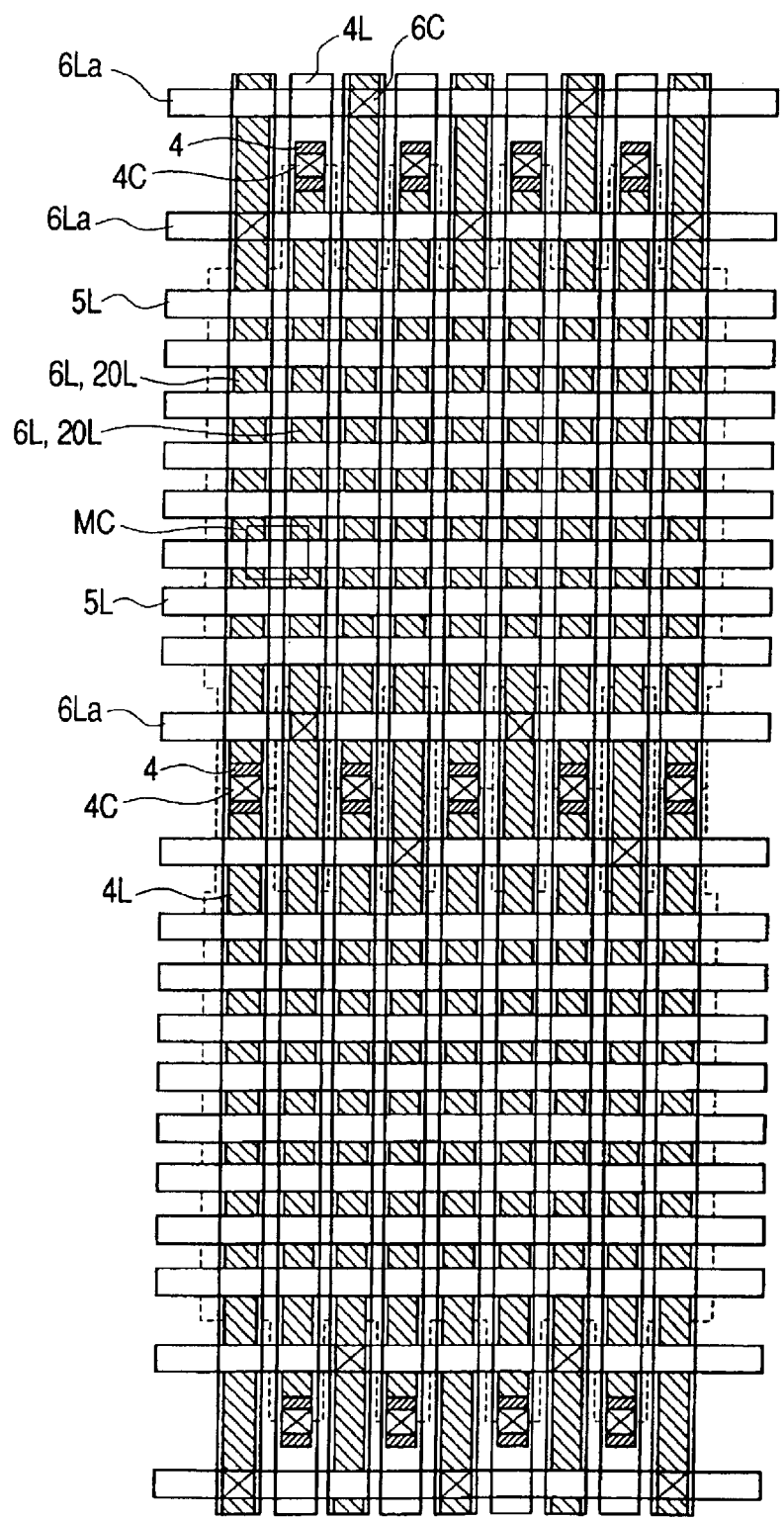
FIG. 64 shows a layout pattern showing a fourth arrangement example (D) of a memory cell array including memory cells of the third embodiment.
Figure 65:
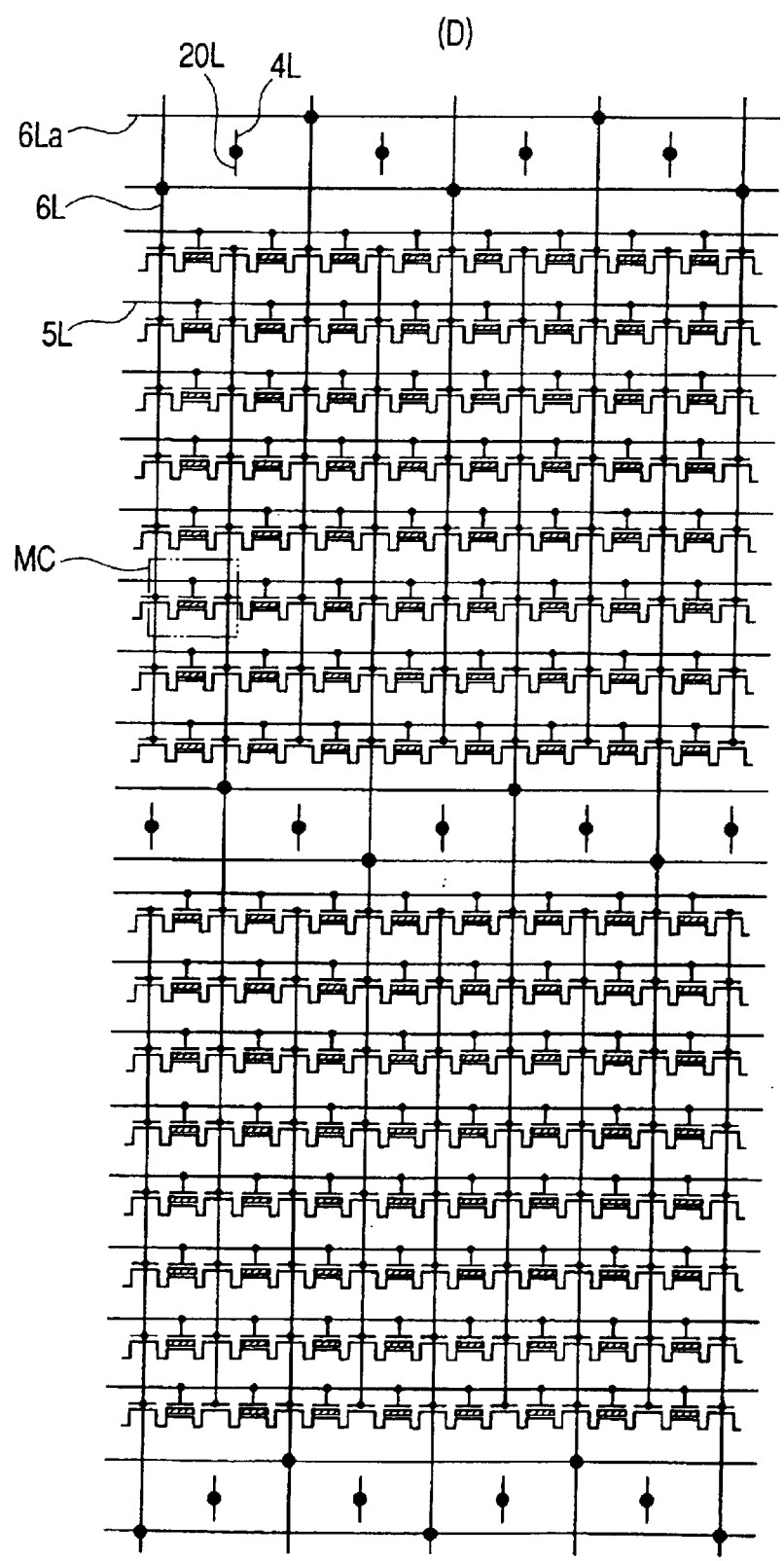
FIG. 65 is a circuit diagram showing the fourth arrangement example (D) of the memory cell array including the memory cells of the third embodiment.

FIG. 57 shows a bias relationship during read. As to the selected bit, a voltage 0 V is applied to the source line sides and a voltage 1.5 V is applied to the bit line side for read. However, biases similar to those during the program are used, that is, a voltage 3 V, which is somewhat higher, is applied to the switch gate electrode of the switch transistor of the source line side, and a voltage 4.5 V, which is somewhat higher, is applied to the switch gate electrode of the switch transistor on the bit line side so that a resistance applied on the inversion layer is made as small as possible.

FIGS. 58 to 65 exemplify various arrangements of a memory cell array 51 which employs the memory cell of the third embodiment. The arrangements are roughly divided into 4 types (A) to (D) and the layouts and equivalent circuits thereof are illustrated.

The arrangement of the memory cell array is different from the example of the memory cell array which employs the memory cell of the first embodiment described with reference to FIGS. 27 to 34 in that source lines/bit lines 4L fetch the voltages of diffusion layers 4, which are connected to inversion layer lines 20L through contact holes 4C, in the active regions 8 of the memory cell array. Other arrangements of the memory cell array is the same as those of the memory cell array shown in FIGS. 27 to 34.

FIGS. 66 to 70 schematically show the cross sections of a device at stages in a manufacturing process of memory cells according to the third embodiment described with reference to FIG. 52.

Figure 66:
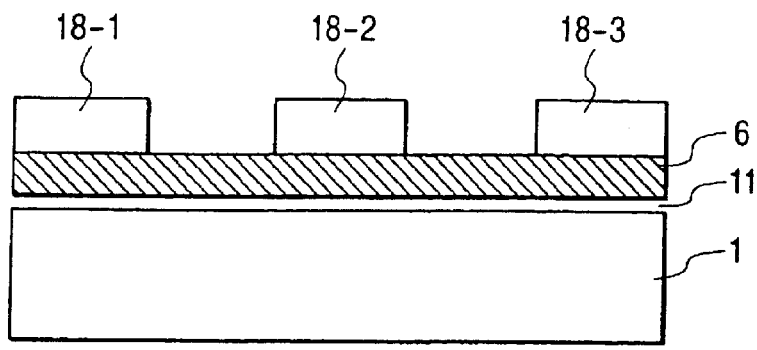
FIGS. 66 to 69 are sectional views of a device at respective stages in a manufacturing process of the memory cells of the third embodiment.

FIG. 66 shows a state in which a gate insulating film 11 is formed on a silicon semiconductor substrate 1 by subjecting the silicon semiconductor substrate 1 to high-temperature thermal oxidation, a material of the switch gate electrodes 6, for example, a poly-silicon film, is deposited, and hot resist films 18-1, 18-2 and 18-3 for processing gate lines, which are shared by the source lines/bit lines and the switch transistors Trsw, are subjected to an exposure/development process.

Figure 67:
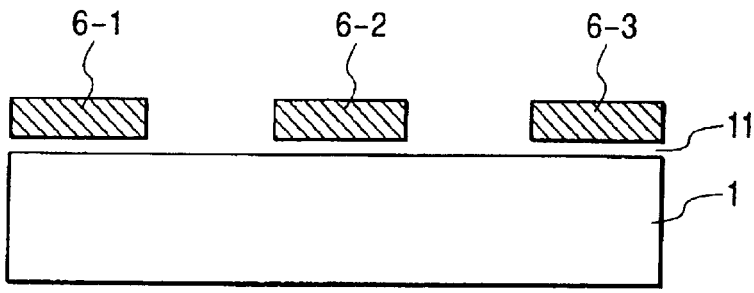

FIG. 67 shows a state in which the electrode material of the switch gate electrodes 6 is etched using photoresist films 18-1, 18-2 and 18-3, and the switch gate electrodes 6-1, 6-2, and 6-3 are formed.

Figure 68:
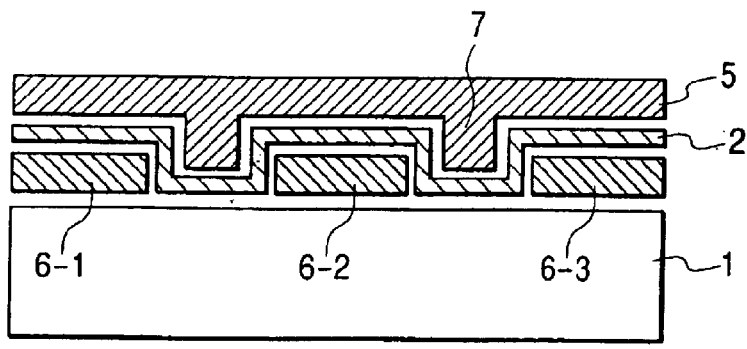

FIG. 68 shows up to a step at which the memory transistor Trmc and word lines 5 are processed. FIG. 68 shows such a structure that the memory transistor Trmc is subjected to thermal oxidation so that silicon thermal oxide films 12-1 and 12-2 each having a thickness of 5 nm are formed, a silicon nitride film is deposited in a thickness of about 10 nm as the gate insulating film 2 having the discrete traps, an oxide film 13 having a thickness of about 3 nm is formed on the gate insulating film 2 by thermal oxidation or chemical vapor deposition, and further, for example, a poly-silicon film, which constitutes the control gate electrode 7 of the memory transistor Trmc and the word lines 5, is deposited.

Figure 69:
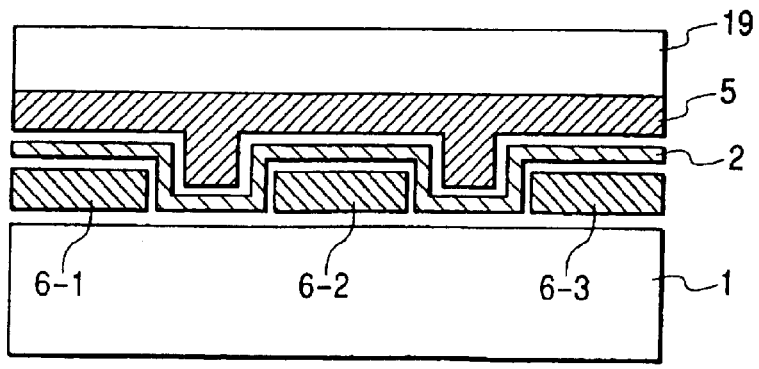
Figure 70:
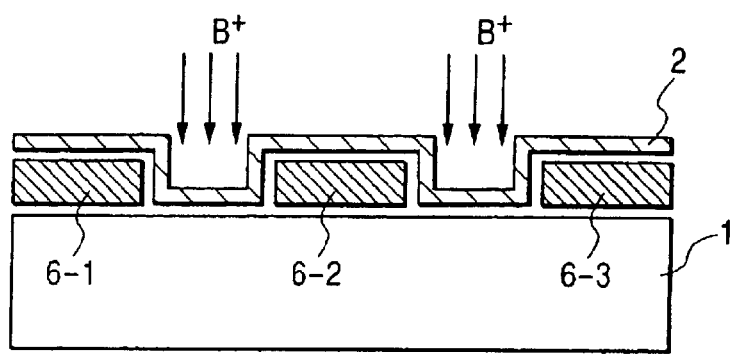
FIG. 70 is a sectional view of another device at a stage similar to that shown in FIG. 69 in the manufacturing process of the memory cell of the third embodiment.

In FIGS. 69 and 70, to further process the word lines 5, the poly-silicon film is molded to the portion where the poly silicon is left as the word lines 5 as shown in FIG. 69 and to the portion from which the poly-silicon is removed as shown in FIG. 70 using a photo resist film 19. In particular, in FIG. 70, boron ($B^+$) is injected to the silicon semiconductor substrate 1 between the word lines 5 in order to electrically isolate the word lines from each other.

<Fourth Embodiment of Memory Cell>

Figure 71:
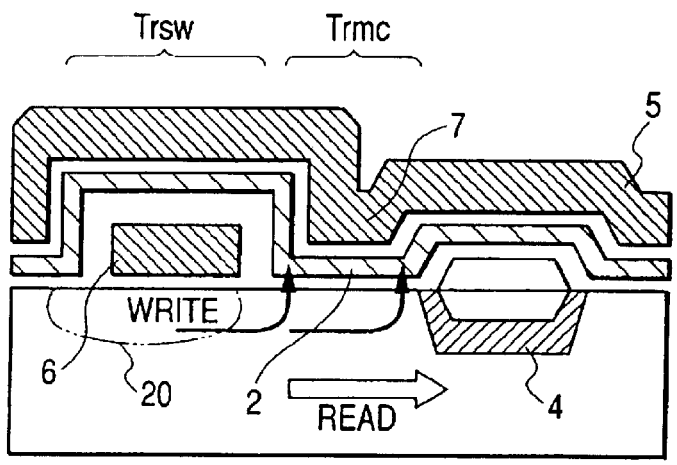
FIG. 71 is a sectional view showing a nonvolatile memory cell of a fourth embodiment according to the present invention.

FIG. 71 shows a cross section of a fourth embodiment of a memory cell. The memory cell shown in the figure and the inversion layer 20 of a switch transistor Trsw share source lines, and bit lines are formed of a diffusion layer 4. That is, one memory cell has a structure including one memory transistor Trmc, one switch transistor Trsw, the lines of one transistor inversion layer 20 and the lines of the one diffusion layer 4. A gate insulating film 2 having the discrete traps as the store area of the memory transistor Trmc may include, for example, a silicon nitride film. The control gate electrode 7 of the memory transistor Trmc is connected to word lines 5. The lines of the one transistor inversion layer 20 constitute source lines 20S and the lines of the one diffusion layer 4 constitutes bit lines 4B. The one switch transistor Trsw and the lines of the one transistor inversion layer 20, which constitute the source lines, share each gate electrode. In short, the memory cell of the fourth embodiment includes a part of the memory cell structure of the third embodiment on a source side and a part of the memory cell structure of the NROM on a drain side, the source and drain sides being opposite to each other with respect to the memory transistor Trmc.

Figure 72:
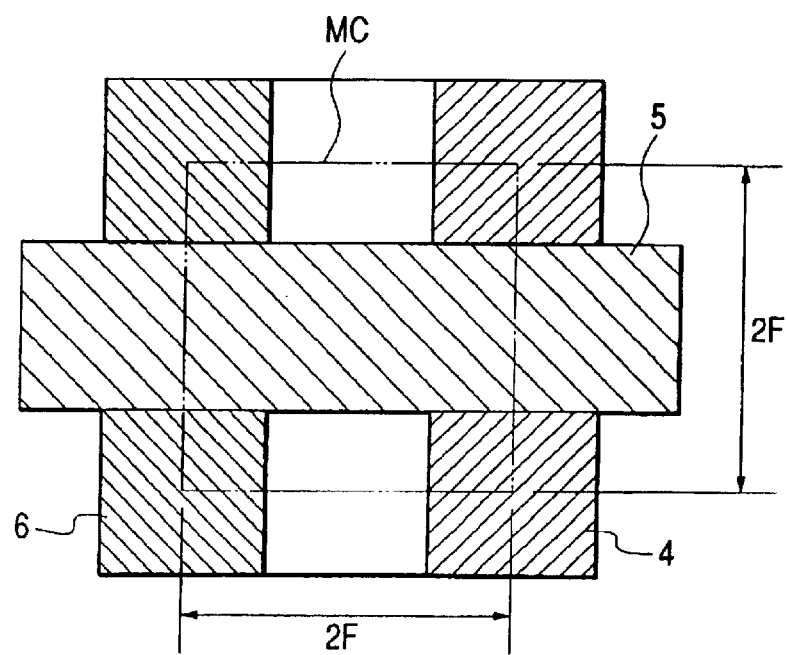
FIG. 72 shows a layout pattern showing a nonvolatile memory cell of a fourth embodiment according to the present invention.

As apparent from the cross section of the memory cell shown in FIG. 71, source side injection and drain side injection of hot electrons can be employed during program. Read is carried out only in one direction because the memory cell is asymmetric with respect to source lines/bit lines. Therefore, as shown in FIG. 72, when program is carried out only by the source side injection or the drain side injection to the area $4F^2$ of the memory cell, the area of the memory cell per bit will be $4F^2$. However, when 2-bit program is carried out by performing both the source side injection and the drain side injection, the area per bit is reduced to $2F^2$. In this case, since read is carried out only in one direction, the gate bias of the switch gate electrode 6 of the switch transistor on a source line side and the bias of the diffusion layer 4 on a bit line side must be controlled to separately read data programmed to a source edge/bit edge.

The erase, program and read operations of the memory cell of the fourth embodiment will be described with reference to FIGS. 73 to 78. In the figures, the switch gate electrodes 6Li and 6Lj of the switch transistor Trsw and the source lines 20Si and 20Sj which serve as the inversion layer lines of the switch transistor Trsw are illustrated as if they are the same lines. Voltages of a semiconductor region which constitutes the inversion layer are shown in the lower portions of the figures and voltages of the switch gate electrodes are shown in the upper portions thereof.

Figure 73:
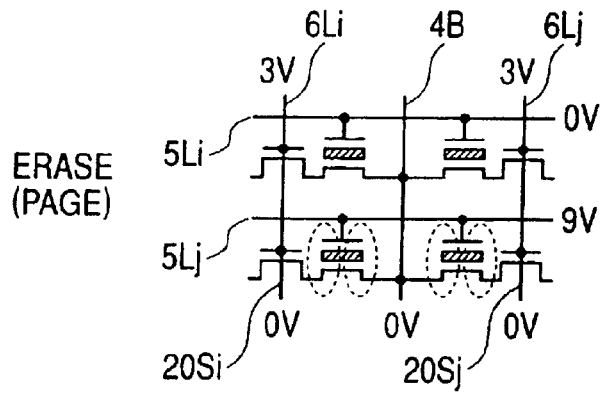
FIG. 73 is a circuit diagram showing bias conditions of a page erase operation of the memory cells of the fourth embodiment.
Figure 74:
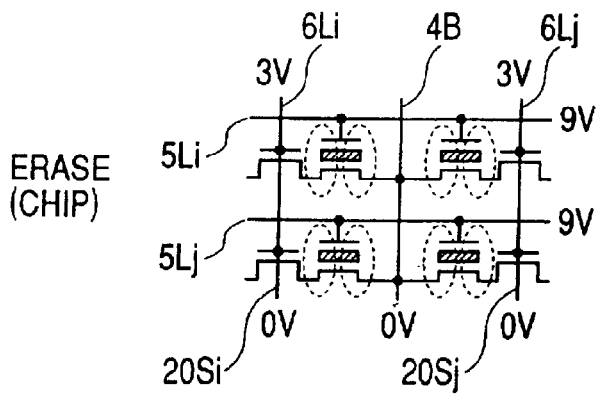
FIG. 74 is a circuit diagram showing bias conditions of a chip erase operation of the memory cells of the fourth embodiment.

FIG. 73 shows a page mode erase for carrying out simultaneous erase along one word line, and FIG. 74 shows a chip (block) mode erase for carrying out simultaneous erase along a plurality of word lines, respectively. Since electrons are drawn out to a memory gate side in the erase operation, a high bias voltage 9 V is applied to a memory gate electrode 7, that is, to a selected word line 5, a power supply voltage, for example, 3 V is applied to the gate electrodes 6Li and 6Lj of the source lines 20Si and 20Sj so that a bias of 0 V is applied to the surface of the inversion layer in order that a high electric field is applied to the gate insulating film 2 such as the silicon nitride film having the discrete traps.

Figure 75:
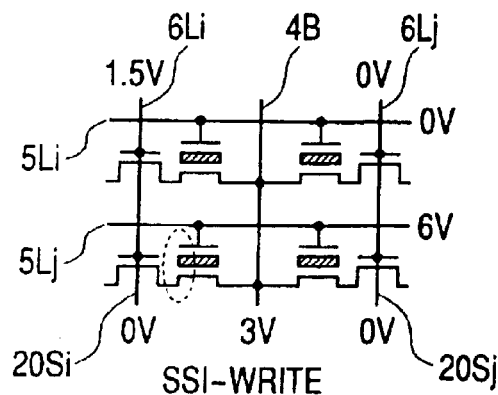
FIG. 75 is a circuit diagram showing bias conditions of a SSI (source side injection) program operation of the memory cells of the fourth embodiment.

FIG. 75 exemplifies a bias relationship during program performed by the source side injection. As to a selected bit, a voltage 1.5 V, which is slightly higher than a threshold value (0.5 V), is applied to the switch gate electrode 6 (6Li) on a source side, and carriers, which have been made hot, are attracted to the gate insulating film 2 having the discrete traps, to which the high bias 6 V is applied, by the high electric field and captured in the gate insulating film 2 having the discrete traps. A voltage 1.5 V is applied to the switch gate electrode 6Li of the switch transistor Trsw on the source line side so that a voltage applied to the source line 20Si side is made to 0 V. A diffusion voltage 3 V is applied to a bit line 4B side.

Figure 76:
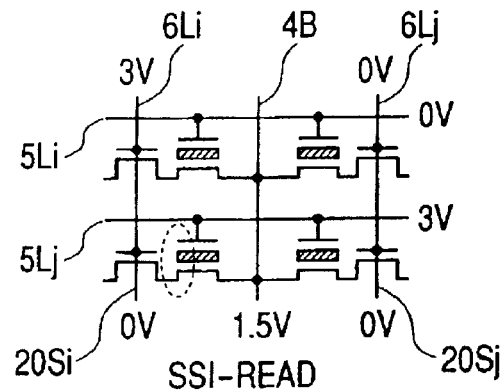
FIG. 76 is a circuit diagram showing bias conditions of a SSI read operation of the memory cells of the fourth embodiment.

FIG. 76 exemplifies a relationship of biases during read when program is carried out to the source side by the source side injection. As to the selected bit, a voltage 0 V is applied to the source line 20Si side and a voltage 1.5 V is applied to the bit line 4B side for the read. A voltage 3 V is applied to the switch gate electrode line 6Li of the switch transistor Trsw on the source line side using the same bias as that used in the program to make a resistance applied on the inversion layer 20 as small as possible.

Figure 77:
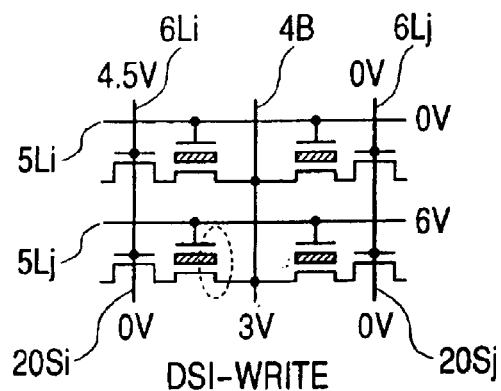
FIG. 77 is a circuit diagram showing bias conditions of a DSI (drain side injection) program operation of the memory cells of the fourth embodiment.

FIG. 77 exemplifies a relationship of biases when program is carried out to a drain side by the drain side injection. As to a selected bit, a voltage 4.5 V, which is higher than the threshold value (0.5 V), is applied to the switch gate electrode line 6Li on the source side, and carriers, which have been made hot in a channel, are attracted to the memory gate electrode 7, to which a high bias 6V is applied, at a drain edge by the high electric field and captured in the gate insulating film 2 having the discrete traps. A voltage 4.5 V is applied to the switch gate electrode line 6Li of the switch transistor Trsw on the source line side so that a voltage applied to the source line 20Si side is made to 0 V. A voltage 3 V is imposed on the bit line 4B side as a voltage of the diffusion layer 4.

Figure 78:
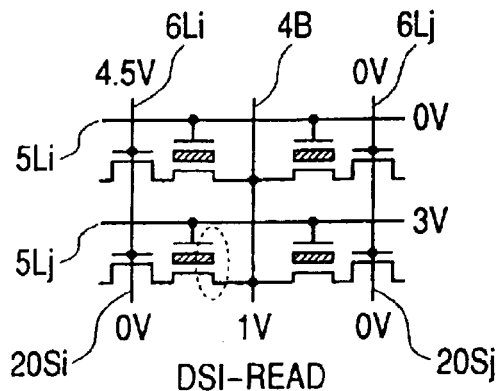
FIG. 78 is a circuit diagram showing bias conditions of a DSI read operation of the memory cells of the fourth embodiment.
Figure 79:
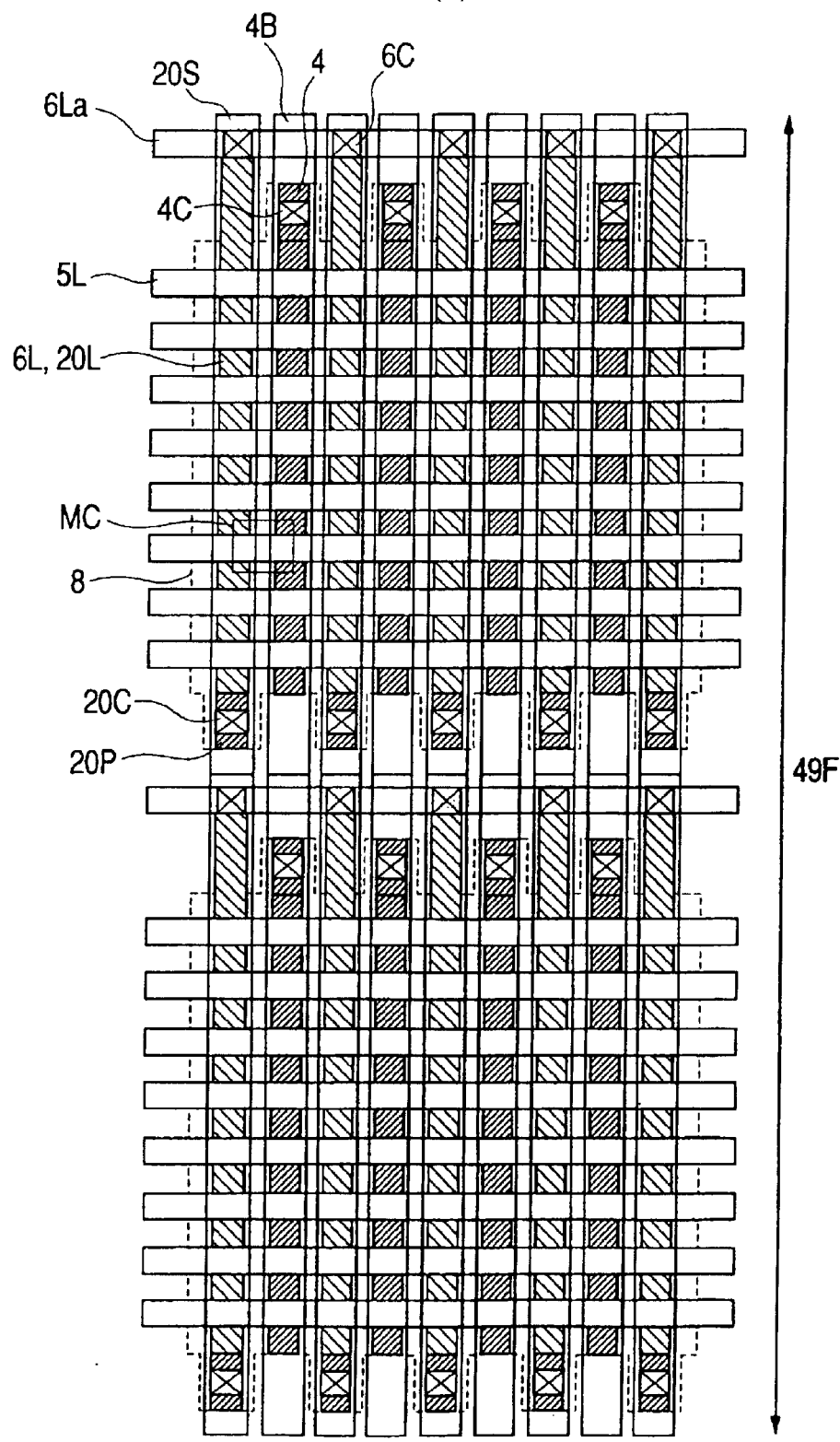
FIG. 79 shows a layout pattern showing a first arrangement example (A) of a memory cell array including the memory cells of the fourth embodiment.
Figure 80:
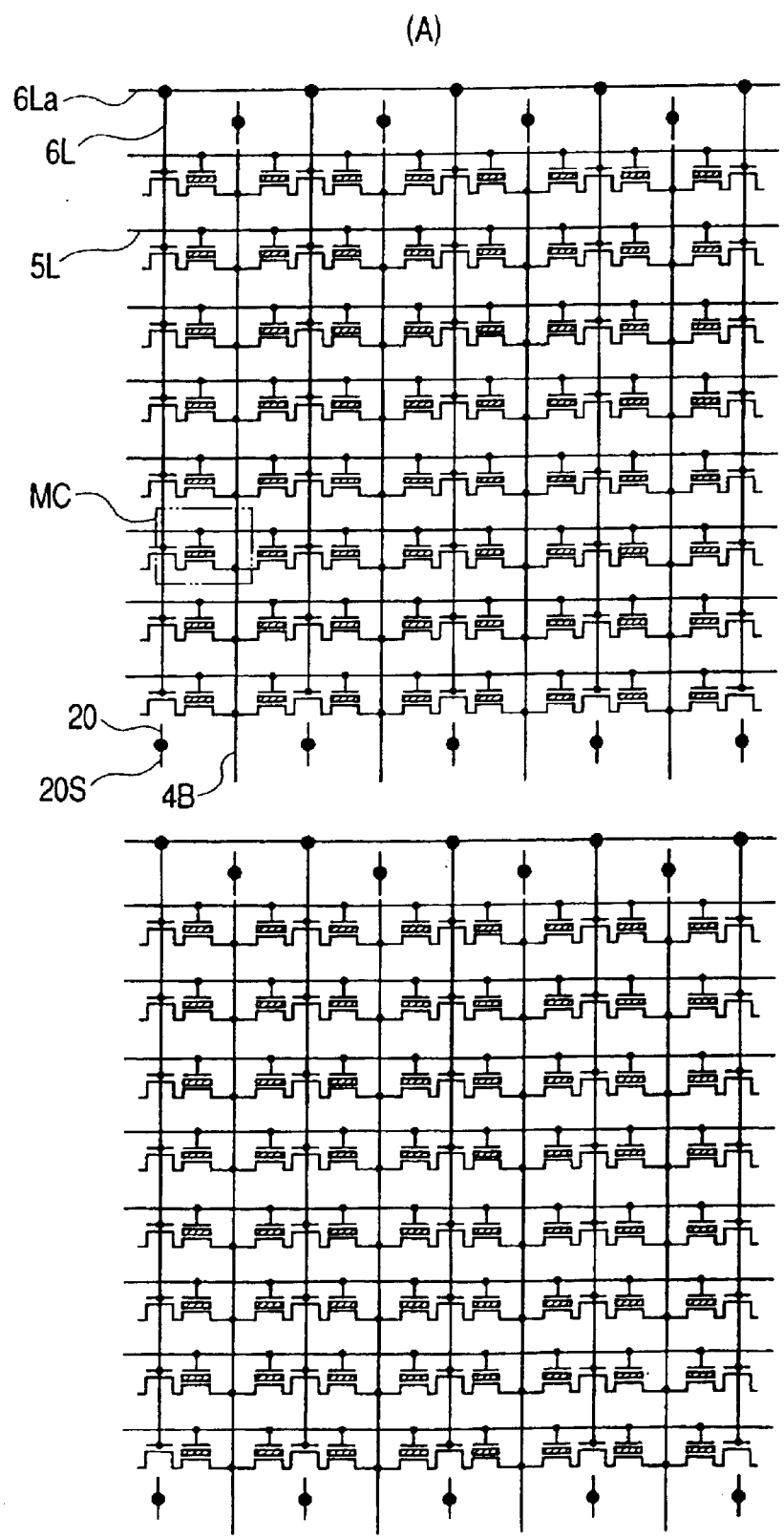
FIG. 80 is a circuit diagram showing the first arrangement example (A) of the memory cell array including the memory cells of the fourth embodiment.
Figure 81:
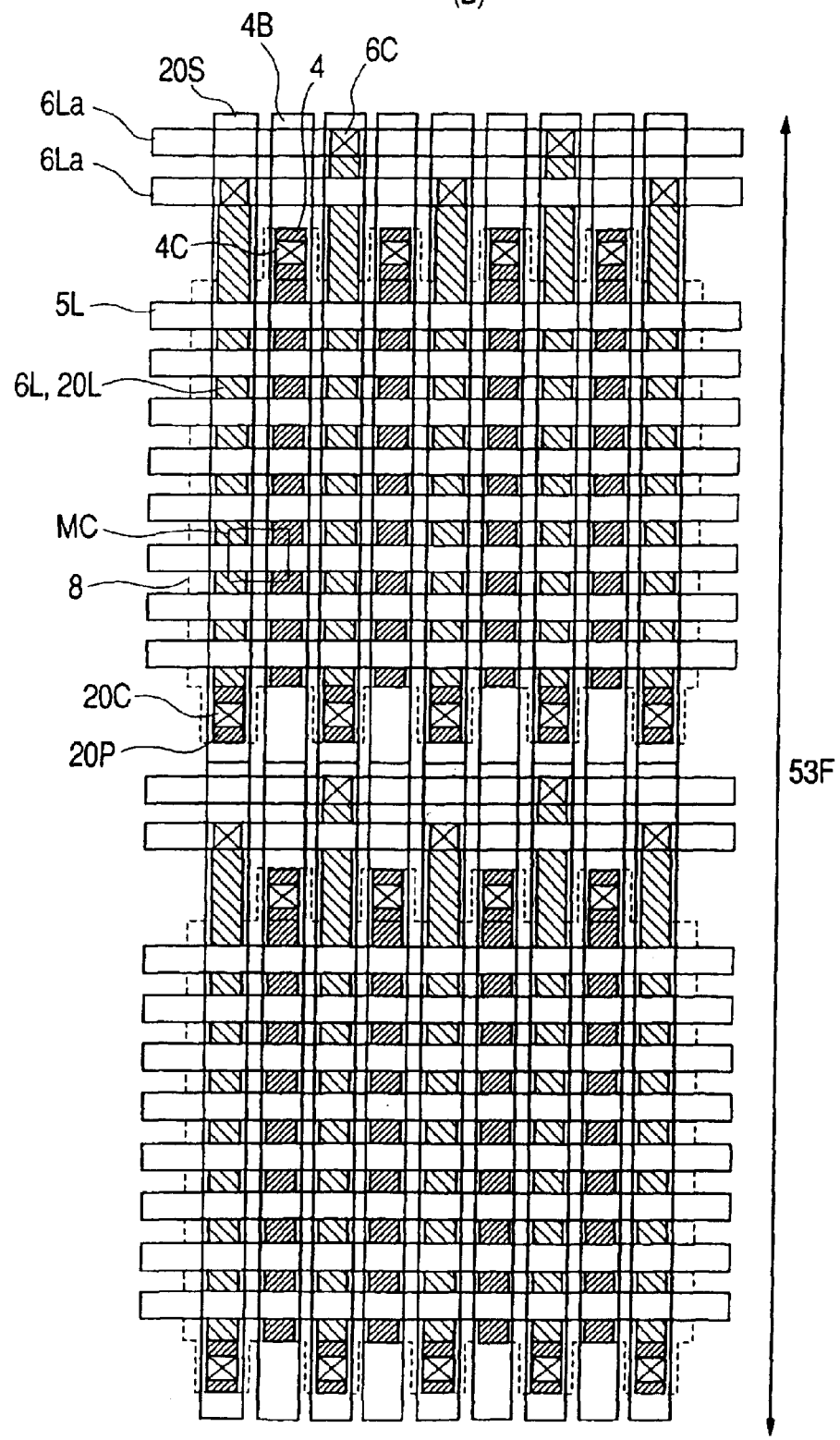
FIG. 81 shows a layout pattern showing a second arrangement example (B) of a memory cell array including the memory cells of the fourth embodiment.
Figure 82:
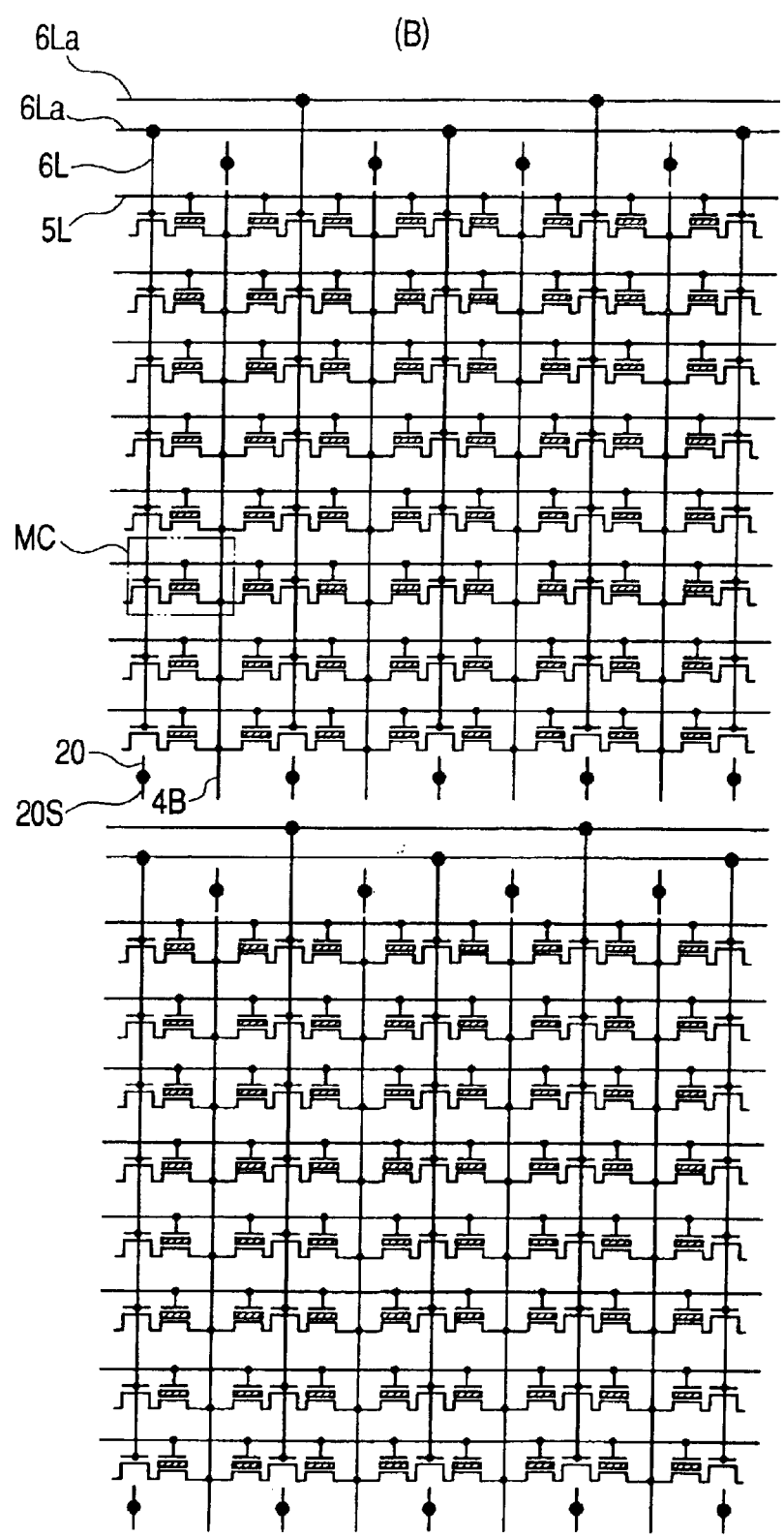
FIG. 82 a circuit showing the second arrangement example (B) of the memory cell array including the memory cells of the fourth embodiment.
Figure 83:
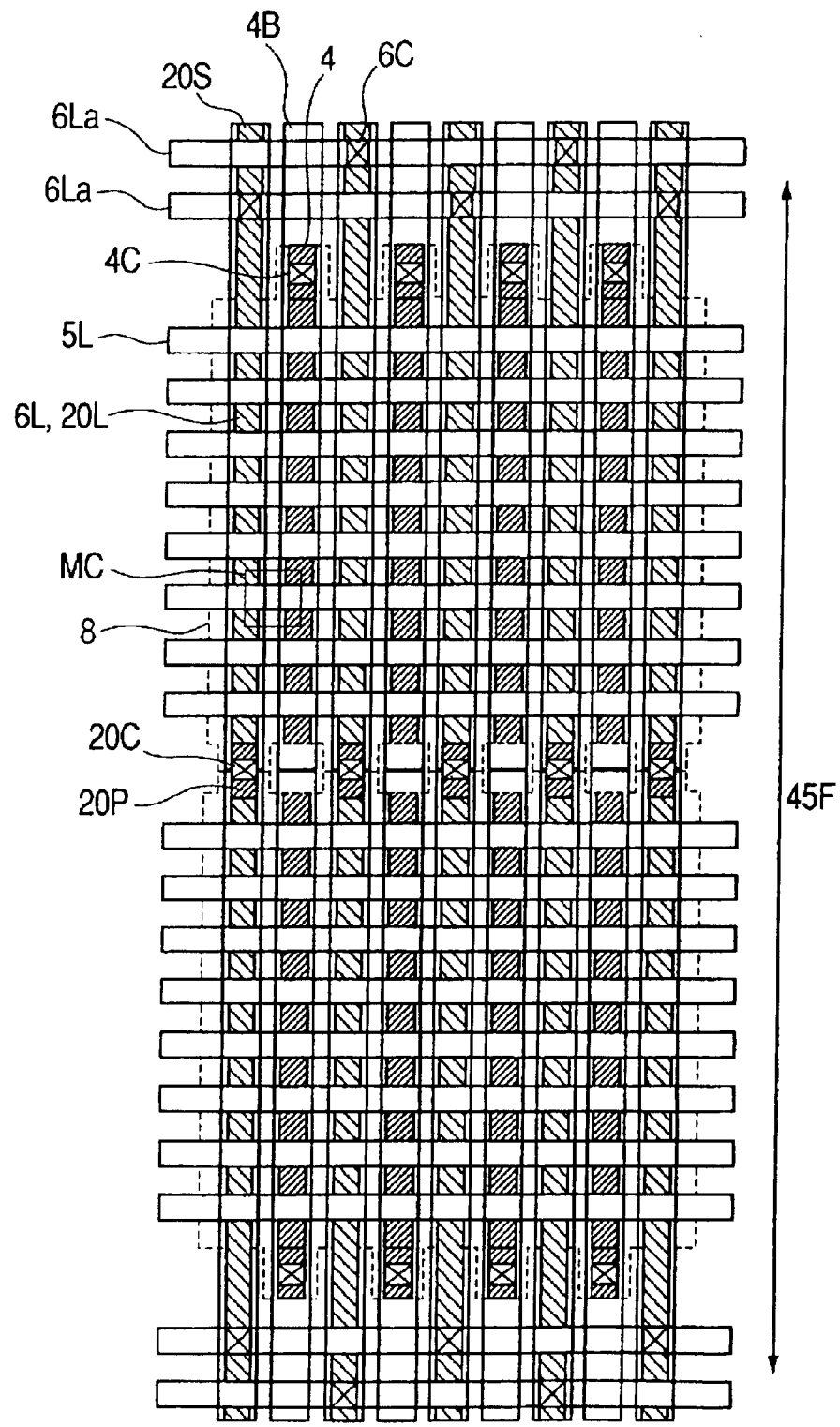
FIG. 83 shows a layout pattern showing a third arrangement example (C) of a memory cell array including the memory cells of the fourth embodiment.
Figure 84:
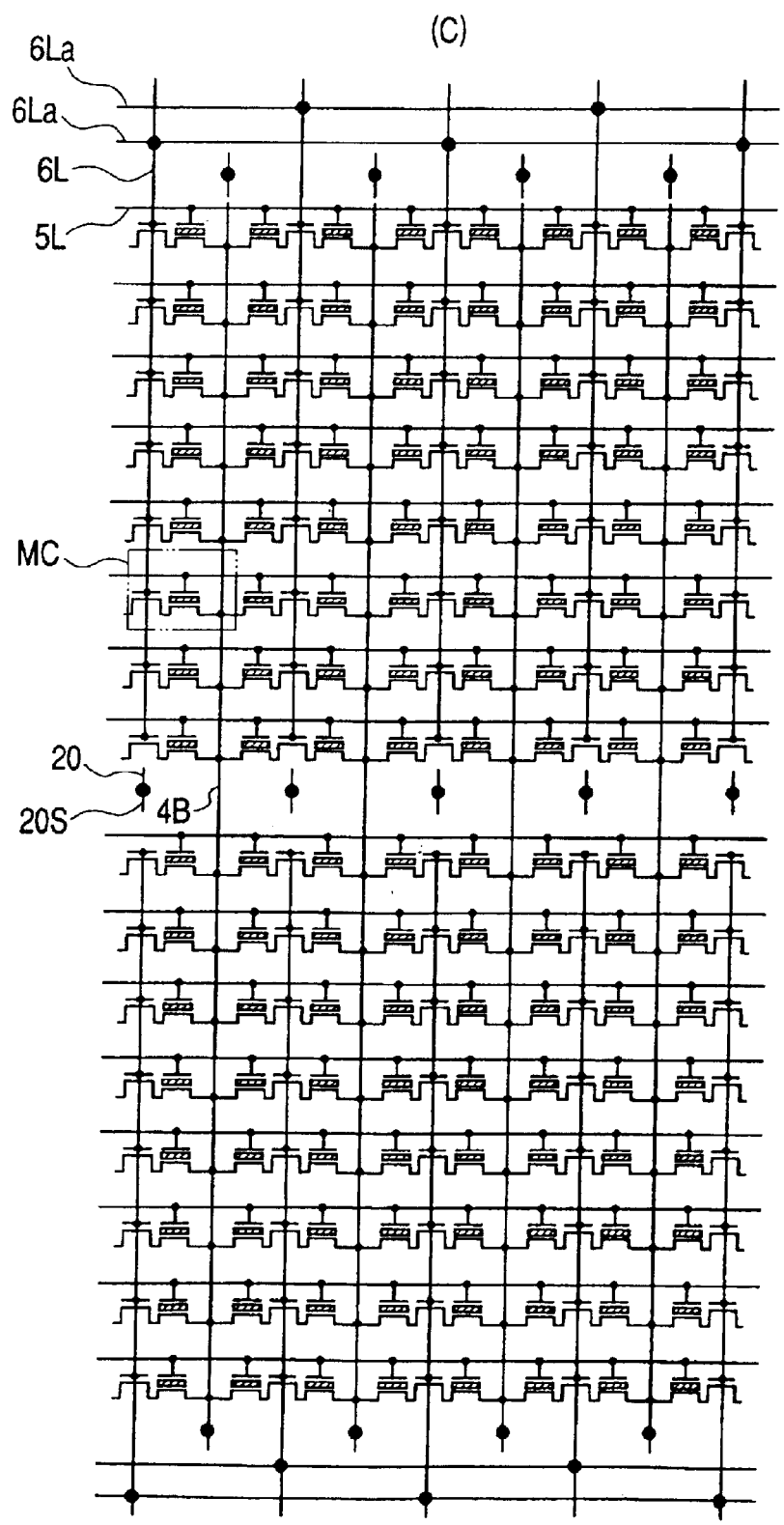
FIG. 84 is a circuit diagram showing the third arrangement example (C) of the memory cell array including the memory cells of the fourth embodiment.
Figure 85:
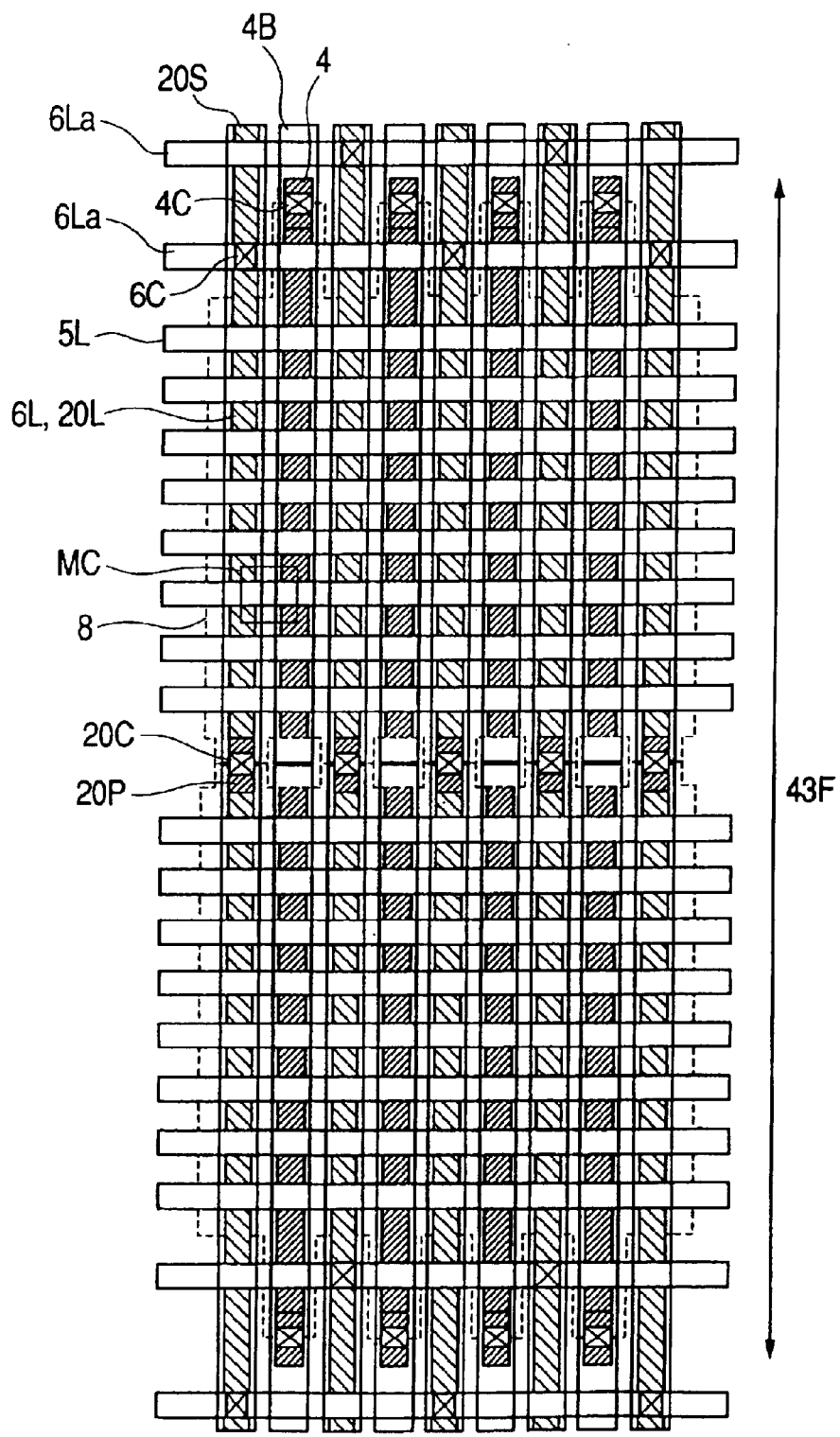
FIG. 85 shows a layout pattern showing a fourth arrangement example (D) of a memory cell array including the memory cells of the fourth embodiment.
Figure 86:
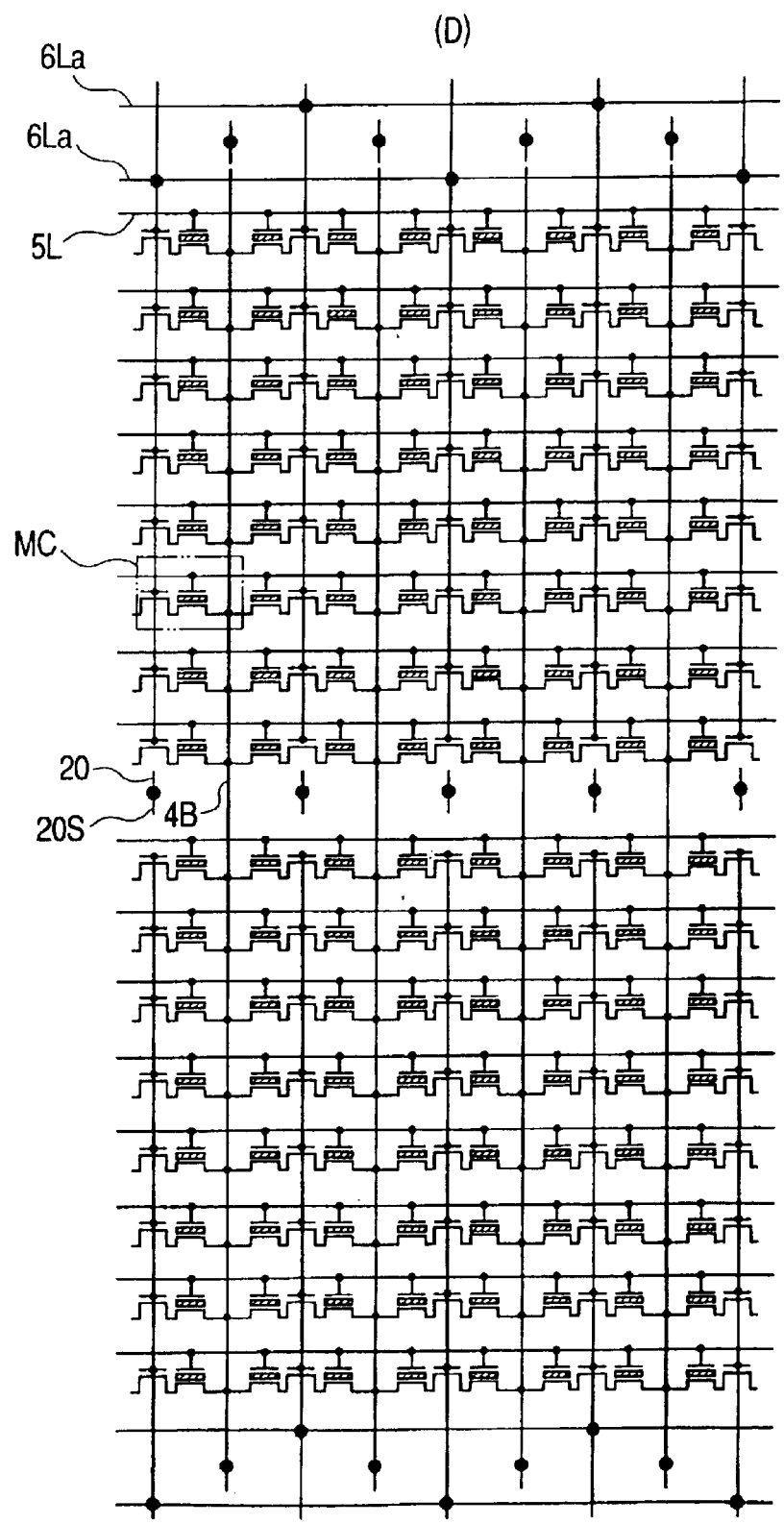
FIG. 86 is a circuit diagram showing the fourth arrangement example (D) of the memory cell array including the memory cells of the fourth embodiment.

FIG. 78 exemplifies a relationship of biases during read when program is carried out to a drain side by the drain side injection. As to the selected bit, a voltage 0 V is applied to the source line 20Si for the read, and a voltage 1 V is applied to the bit line 4B side. A voltage 4.5 V is applied to the switch gate electrode line 6 of the switch transistor Trsw on the source line side similarly to the program to make a resistance applied on the inversion layer 20 as small as possible. As described above, the data programmed to the source side and the data programmed to the drain side can be separately read by the bias conditions of FIGS. 76 and 78.

Figure 121:
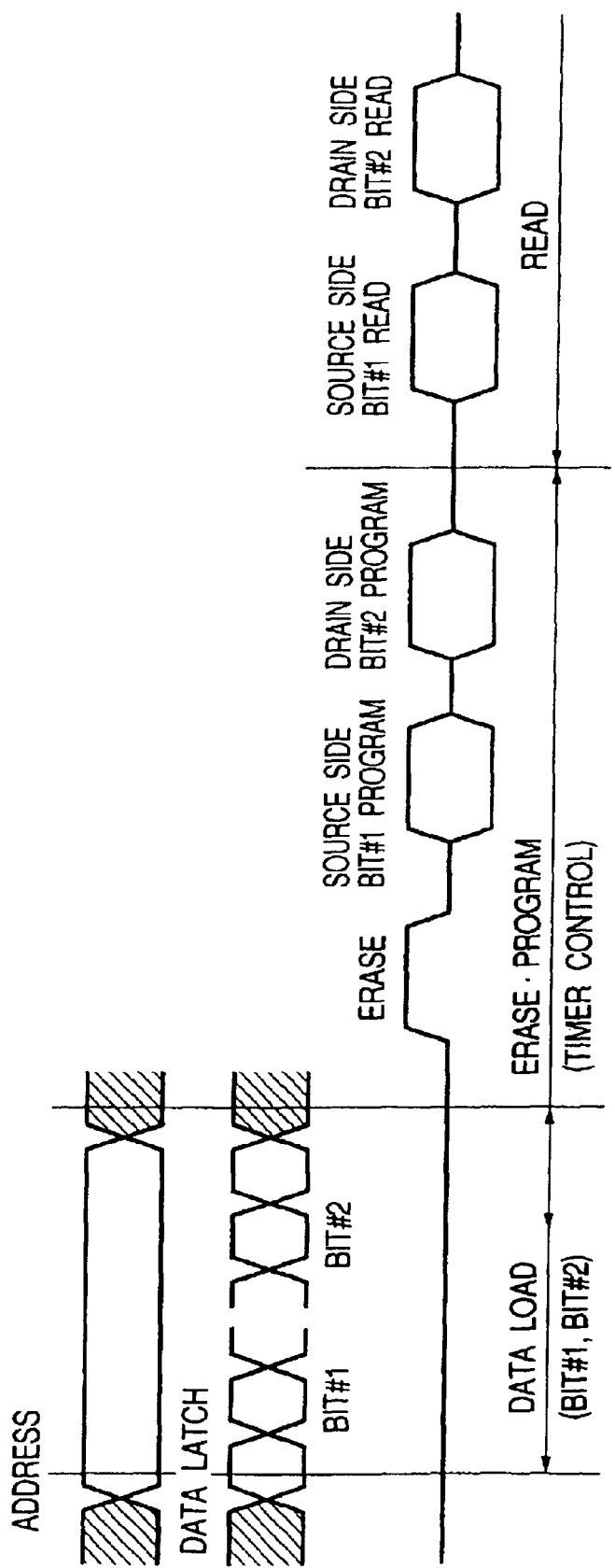
FIG. 121 is a first timing chart of erase, SSI and DSI program and read operations to the memory cells of the fourth and fifth embodiments.
Figure 122:
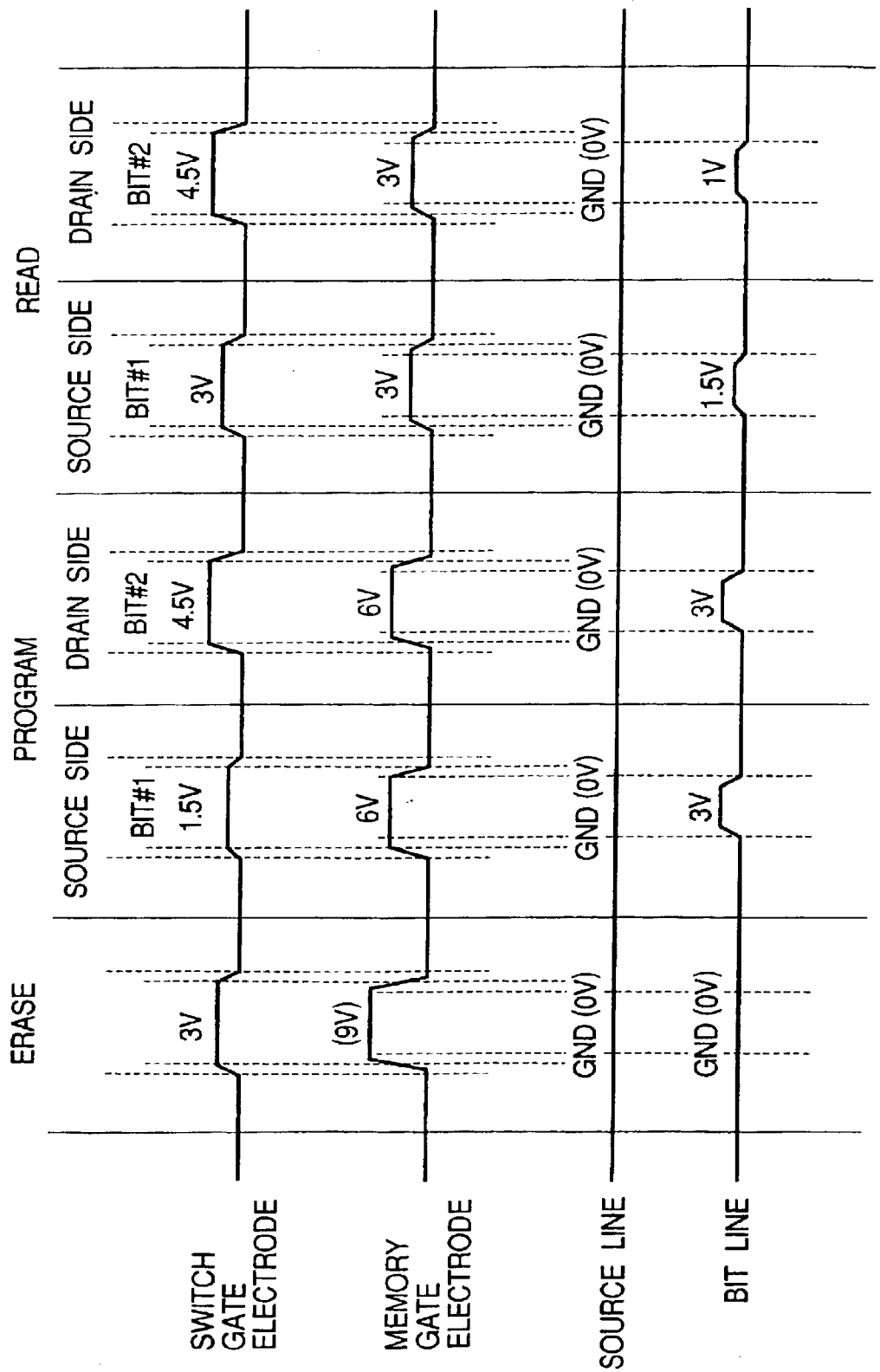
FIG. 122 is a second timing chart of the erase, SSI and DSI program and read operations of the memory cells of the fourth and fifth embodiments.

FIGS. 121 and 122 show timing charts of operations which are carried out when information of 2 bits is stored in the one memory cell. The operations shown in the figures correspond to the operations in FIGS. 73 to 78. In the respective figures, bit #1 and bit #2 mean information of 2 bits in one memory cell. As exemplified in FIG. 121, one memory cell is specified by one address, and data of 2 bits, that is, the data bit #1 and the data bit #2 are latched by a data latch 52 with respect to the one memory cell. After erase, the data bit #1 is programmed to the gate insulating film having the discrete traps on the source side by the source side injection and subsequently the data bit #2 is programmed to the gate insulating film having the discrete traps on the drain side by the drain side injection. It is sufficient that read is carried out by detecting a bit line voltage as exemplified in FIG. 122 and determining a data logic value.

Figure 123:
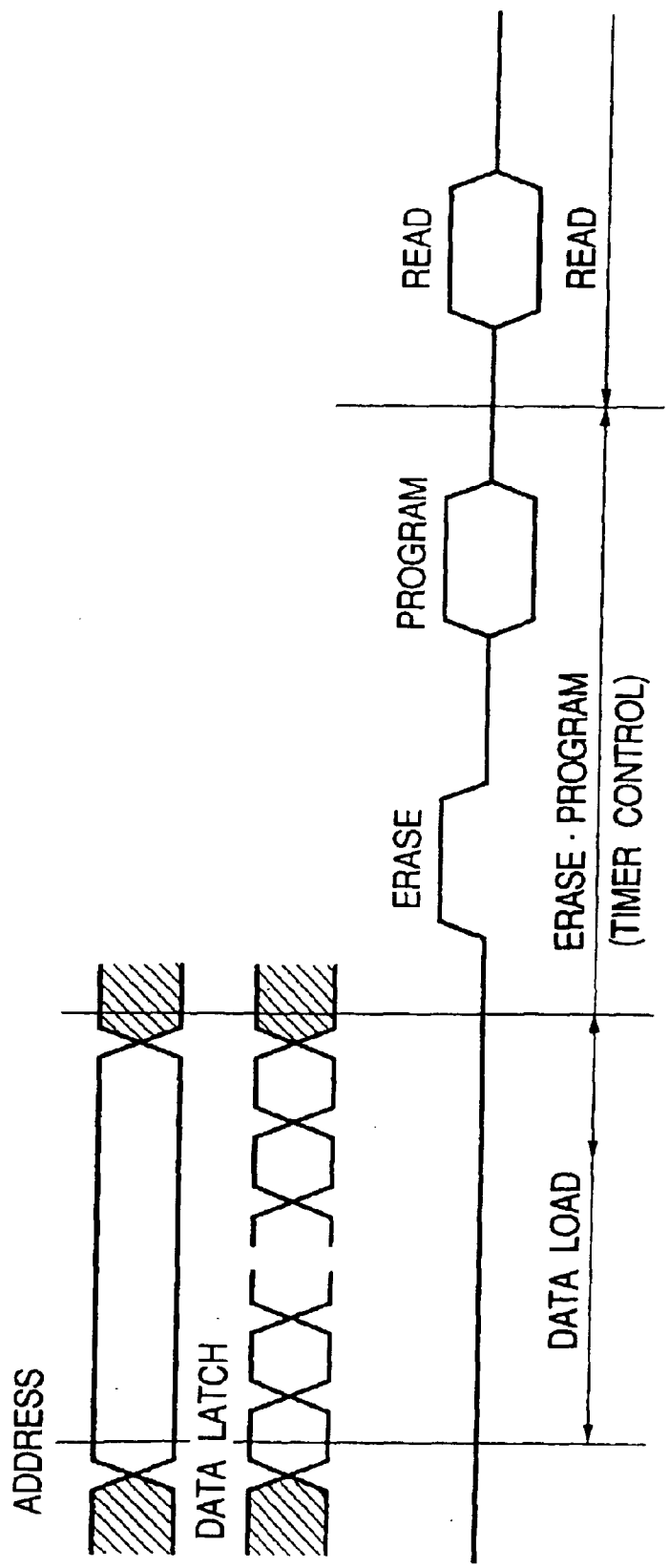
FIG. 123 is a first timing chart of erase, SSI program and read operations of the memory cells of the fourth and fifth embodiments.
Figure 124:
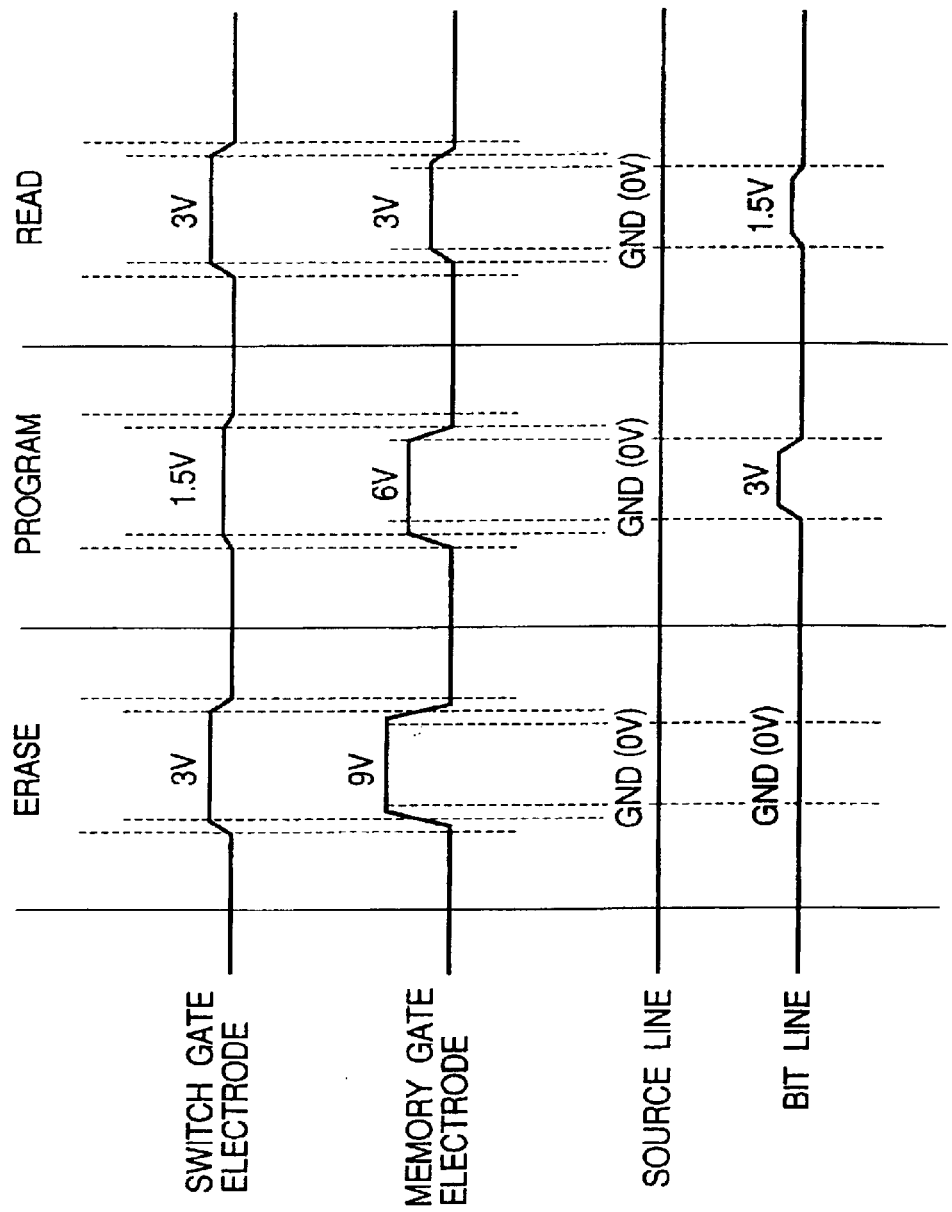
FIG. 124 is a second timing chart of the erase, SSI program and read operations of the memory cells of the fourth and fifth embodiments.

FIGS. 123 and 124 show timing charts of operations which are carried out when program is performed only by the source side injection. The operations shown in the figures correspond to the operations in FIGS. 73 to 76. The program is performed only by the source side injection.

FIGS. 79 to 86 exemplify various arrangements of a memory cell array 51 which employs memory cells of the fourth embodiment. The arrangements are roughly divided into 4 types (A) to (D) and the layouts and equivalent circuits thereof are illustrated.

The arrangement of the memory cell array is different from that of the example which employs the memory cells of the first embodiment described with reference to FIGS. 27 to 34 in the following points. That is, the region of each memory transistor is defined in each active region 8 of the memory cell array by the source lines 20S including the inversion layer 20 of each switch transistor Trsw, the switch gate line 6 of each switch transistor Trsw, the bit lines 4B including each diffusion layer 4 and the word lines 5. Each source line 20S fetches the voltage of each diffusion layer 20P connected to each inversion layer 20 through each contact hole 20C. Each bit line 4B fetches the voltage of each bit line diffusion layer 4 through each contact hole 4C. The switch gate line 6L of each switch transistor is connected to each switch line 6La through each contact hole 6C.

FIGS. 87 to 91 schematically show the cross sections of a device at stages in a manufacturing process of memory cells according to the fourth embodiment described with reference to FIG. 71.

Figure 87:
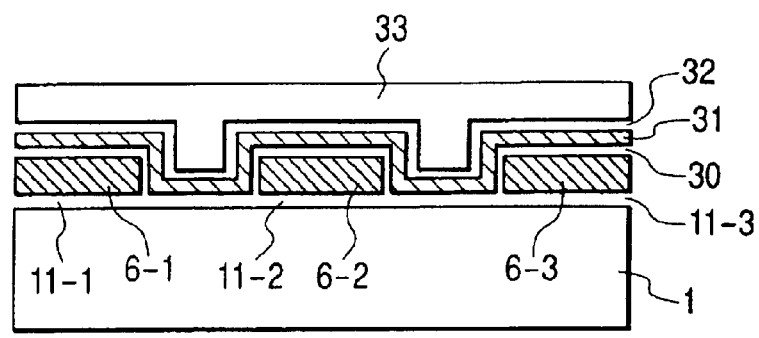
FIGS. 87 to 91 are sectional views of a device at respective stages in a manufacturing process of memory cells of the fourth embodiment.

In FIG. 87, gate insulating films 11-1, 11-2, and 11-3 are formed on a silicon semiconductor substrate 1 by subjecting the silicon semiconductor substrate 1 to high-temperature thermal oxidation and switch gate electrodes 6-1, 6-2, and 6-3 are formed by depositing a gate electrode material, for example, a poly-silicon film. Further, an oxide film 30 is formed by thermal oxidation or chemical vapor deposition and further a silicon nitride film 31 is formed on the oxide film 30 and further an oxide film 32 is formed on the silicon nitride film 31. Then, a thick oxide film 33 is deposited by chemical vapor deposition.

Figure 88:
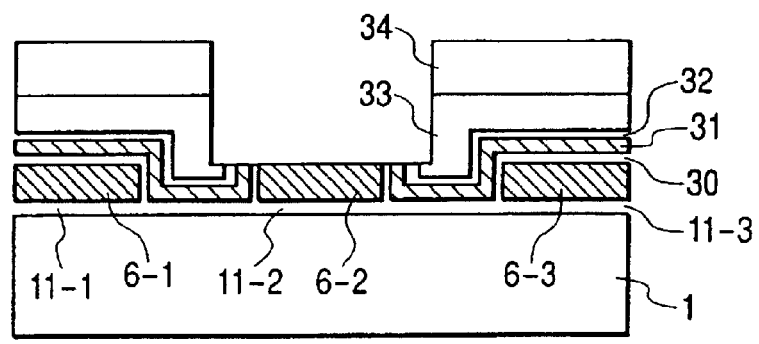

In FIG. 88, a photo resist film 34 is applied and exposed and the insulating films 33, 32, 31, and 30 on the bit lines are successively etched and opened.

Figure 89:
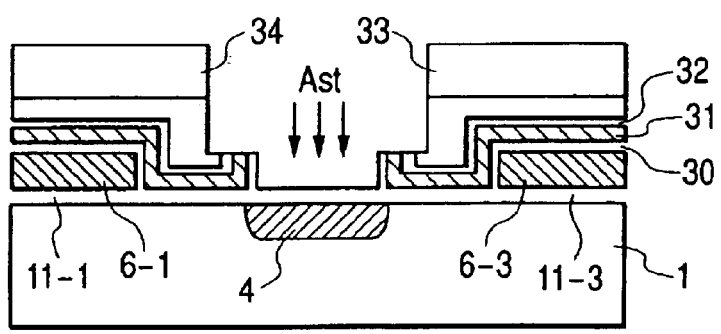

In FIG. 89, the switch gate line 6-2 is removed, impurities As⁺ are selectively applied onto the silicon substrate 1 by ion implantation, thereby forming the bit line diffusion layer 4.

Figure 90:
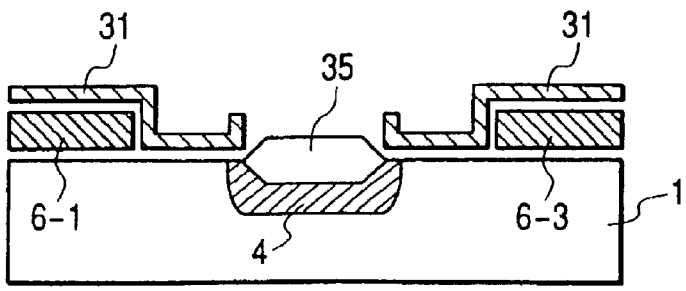

In FIG. 90, the insulating films 33 and 32 are entirely removed, the region other than the bit line diffusion layer 4 is covered with the silicon nitride film 31, and a thick thermal oxide film 35 is formed on the bit line diffusion layer 4.

Figure 91:
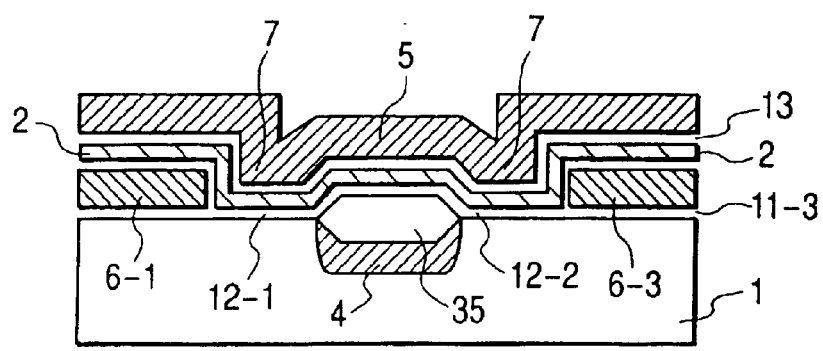

In FIG. 91, the silicon nitride film 31 and the oxide film 30, which is located on the silicon substrate 1, also are removed, gate oxide films 12-1 and 12-2 are newly formed on the silicon semiconductor substrate 1, further the silicon nitride film 2 having the discrete traps is formed by chemical vapor deposition, an oxide film 13 is formed by thermal oxidation or chemical vapor deposition, and further a material of a word line 5 and a control gate electrode 7 is deposited.

<Fifth Embodiment of Memory Cell>

A fifth embodiment of the memory cell is arranged in the memory cell structure of the fourth embodiment such that the channel region of a memory transistor is formed in a size one half a technology feature size by self-aligned diffusion with respect to the switch gate electrodes of switch transistors so that further high density can be achieved.

Figure 92:
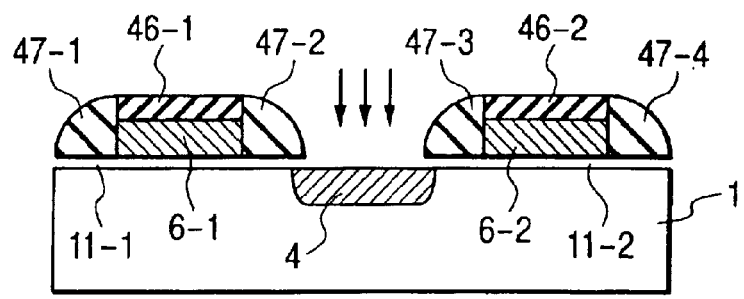
FIGS. 92 to 94 are sectional views of a device at respective stages in a manufacturing process of memory cells according to a fifth arrangement of the present invention.
Figure 93:
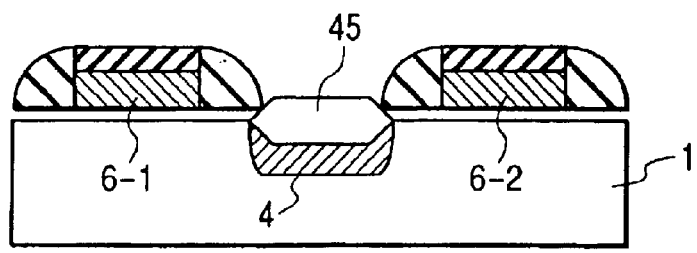
Figure 94:
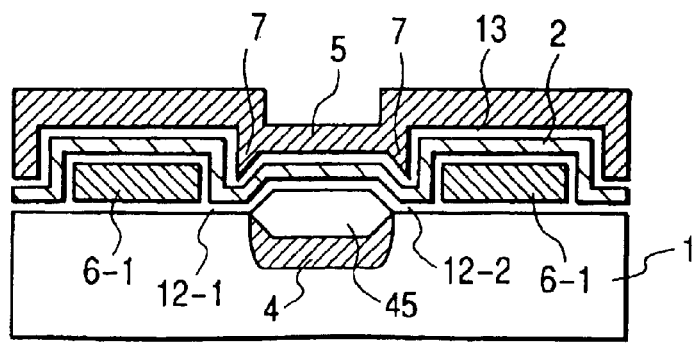

FIGS. 92 to 94 are cross sectional views schematically showing a manufacturing method of memory cells according to a fifth embodiment.

In FIG. 92, gate insulating films 11-1 and 11-2 are formed on a silicon semiconductor substrate 1, and then the gate electrodes 6-1 and 6-2 of the switch transistors Trsw are formed. At this time, insulating films 46-1 and 46-2 such as silicon nitride films or the like are deposited on the gate electrodes 6-1 and 6-2 to secure the height of a gate section. Further, side wall insulating films 47-1, 47-2, 47-3, and 47-4 such as silicon nitride films are formed based on the gate electrodes 6-1 and 6-2 and the insulating films 46- and 46-2 using a side wall technology. Further, diffusion layer impurities As+ are injected to the gate electrodes 6-1 and 6-2 and 47-1, 47-2, 47-3, and 47-4 by an ion implantation technology so as to form a bit line diffusion layer 4.

In FIG. 93, thermal oxidation is applied subsequently and a thick thermal oxidation film 45 is formed on the diffusion layer 4.

In FIG. 94, after the insulating films 46-1 and 46-2 and the side wall insulating films 47-1, 47-2, 47-3, and 47-4 are removed, the gate insulating films 12-1 and 12-2 of the memory transistor are formed by thermal oxidation, further a silicon nitride film 2 having discrete traps is deposited by chemical vapor deposition, an oxide film 13 is deposited by thermal deposition or chemical vapor deposition, and a material of a memory gate electrode 7 and a word line 5 is formed. The areas between the gate electrodes 6-1 and 6-2 of the switch transistor Trsw and the bit line diffusion layer 4 are used as the channel regions of the memory transistor Trmc, and the channel regions are regions defined by the side wall insulating films 27-1, 27-2, 27-3, and 27-4 such as the silicon nitride film 2 and the like.

<Sixth Embodiment of Memory Cell>

A sixth embodiment of the memory cell is arranged as a 2 memory transistor/2 bit type non-volatile memory cell structure which includes 2 memory cell transistors in one memory cell and can hold information of 2 bits to realize high density and a multi-function capable of carrying out erase in bit units by an self-aligned diffusion technology.

Figure 95:
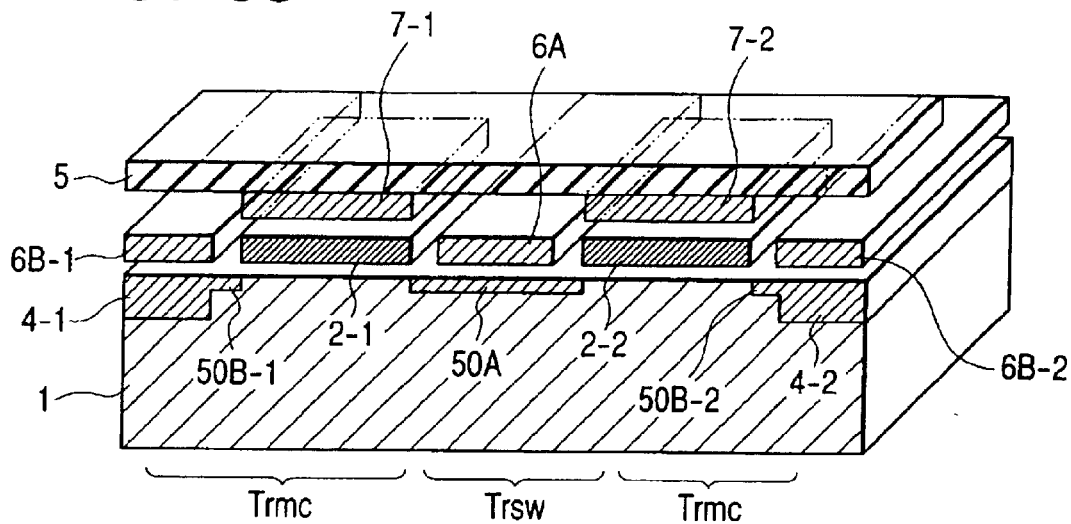
FIG. 95 is a perspective view of a memory cell according to a sixth embodiment of the present invention.
Figure 96:
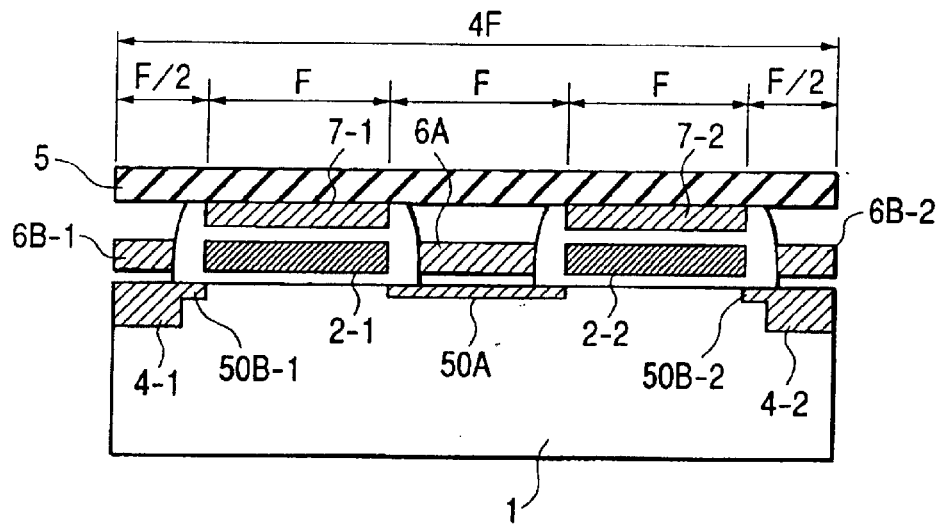
FIG. 96 is a cross sectional view of the memory cell of the sixth embodiment.

FIG. 95 shows a perspective view of a memory cell according to a sixth embodiment, and FIG. 96 shows a cross section thereof.

As shown in FIGS. 95 and 96, the memory gate electrodes 7-1 and 7-2 of memory transistors Trmc are directly connected to a word line 5. At this time, the switch gate electrode 6A of a switch transistor Trsw is formed by being buried between the gate insulating films 2-1 and 2-2 each having the discrete traps of the 2 memory transistors in self-aligned diffusion as shown in FIG. 96. Since a word line pitch is 2F, the area $4F^2$ of the memory cell per bit can be realized.

In FIGS. 95 and 96, it is effective to dope impurities of a type, which is opposite to the type of a substrate, to the channel 50A of the switch transistor Trsw and to arrange the channel 50A as a depletion type channel. This arrangement has an action for preventing the formation of the barrier of the channel under a gap between the memory gate electrodes 7-1 and 7-2 of the memory transistors Trmc and the switch gate electrode 6A of the switch transistor Trsw.

Note that it is important to recognize the conductivity of the store areas 2-1 and 2-2. In the conventional arrangement of FIG. 11, it is described only that the store areas 2'-1 and 2'-2 are the conductive floating electrodes. In the structure of the memory cell provided by the present invention, it is declared that the store areas 2-1 and 2-2 contain an aggregate body of discrete traps in place of the conductive floating electrodes. In a material having discrete traps, carriers captured by any of the discrete traps are restricted at the position there they are trapped and do not move in the aggregated body of the traps, that is, in floating electrodes. A typical floating electrode material as the aggregated body of the discrete traps is a silicon nitride thin film.

Figure 11:
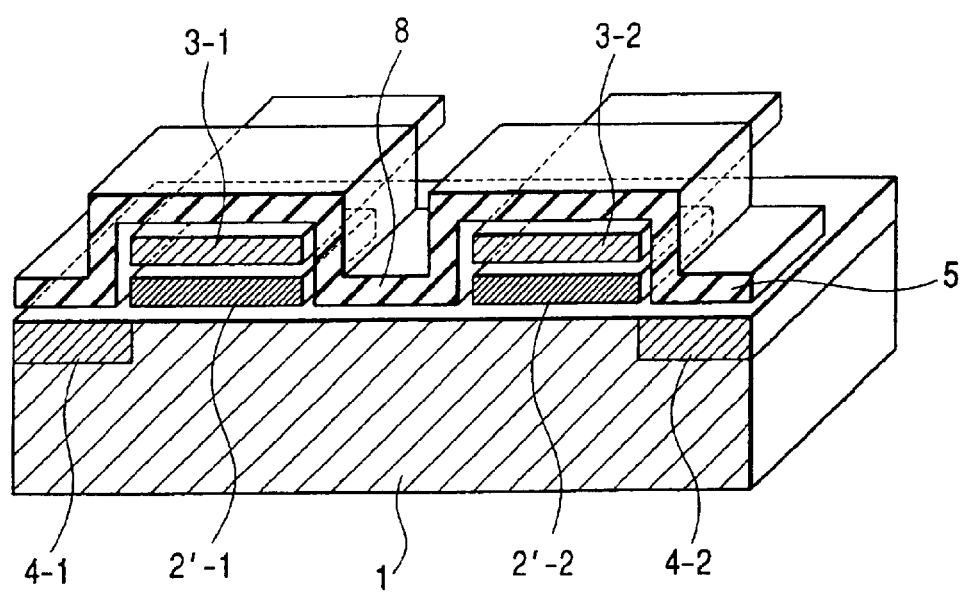
FIG. 11 is a view explaining sill another cell previously examined by the inventors.
Figure 12:
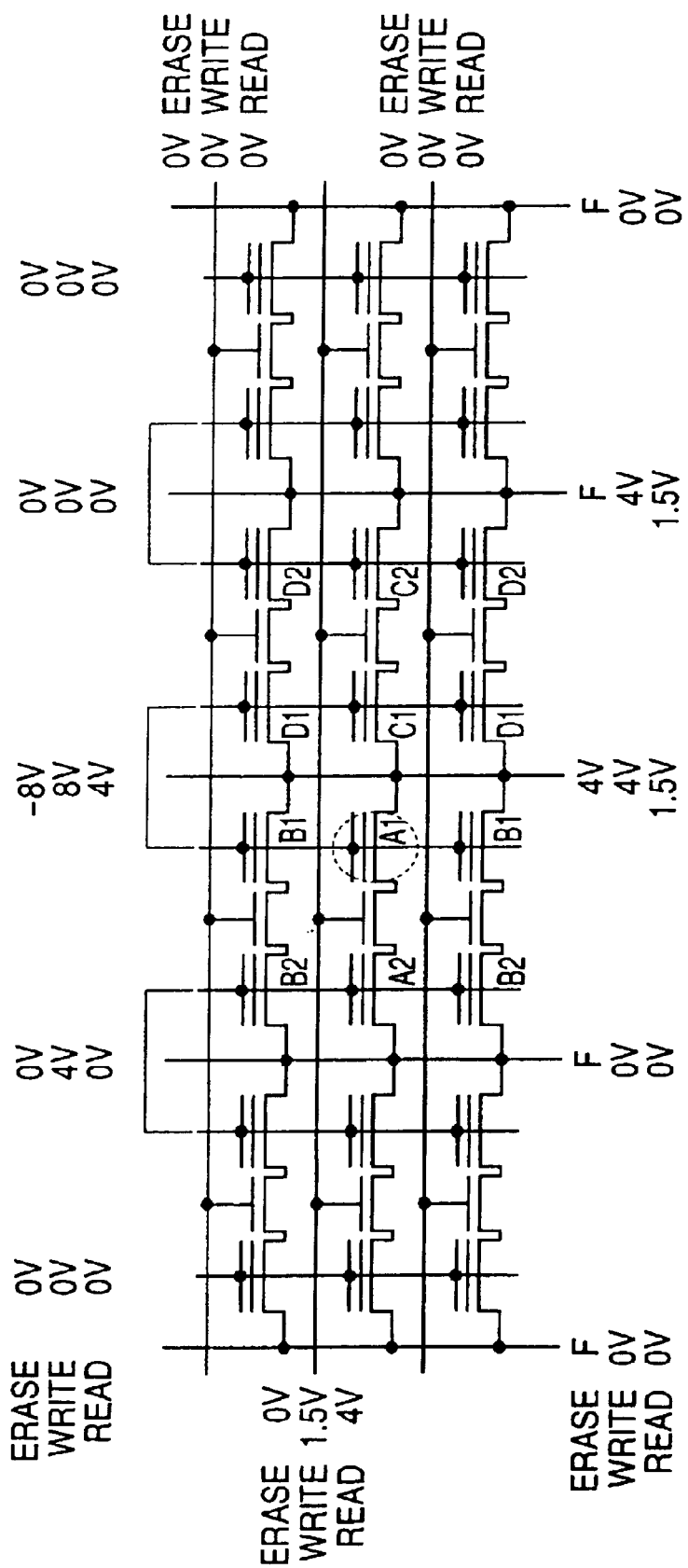
FIG. 12 is a view explaining a relationship between a selected bias and a non-selected bias with respect to a memory cell.
Figure 97:
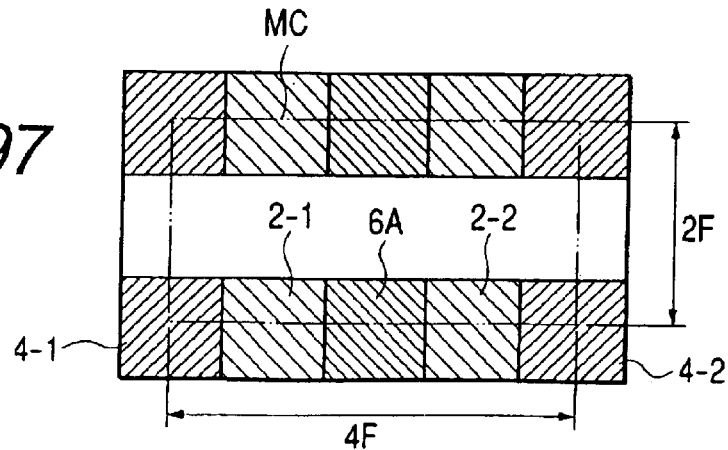
FIG. 97 shows a layout pattern of the memory cell of the sixth embodiment.

A relationship to the structure of FIG. 11 will be additionally described. In the structure of FIG. 11, it is shown that the material of the floating gate electrodes 2'-1 and 2'-2 are the conductor. However, the material is not limited to the conductor, and when the material includes the floating electrode material as the aggregated body of the discrete traps, it is not necessary to separate the floating electrode material in each bit. As a result, the word line, which is across on the gate electrode, need not be aligned with the floating electrode in fabrication process, whereby an area necessary to an alignment margin can be reduced. That is, when, for example, the silicon nitride thin film, which is the aggregated body of the discrete traps, is used as the floating electrode material in the memory cell structure shown in FIG. 11, an area of the memory cell is reduced from previous 5.4F2 to 4F2 as apparent from the plan view shown in FIG. 97 which shows a case in which no alignment is required in processing. As a result, density as high as that of the memory cell of the present invention shown in FIG. 96 can be obtained. Regardless of the thus obtained high density, erase of memory cells is still carried out in a block area, the structure provided by the present invention is advantageous in that erase can be carried out in a word-line.

Figure 98:
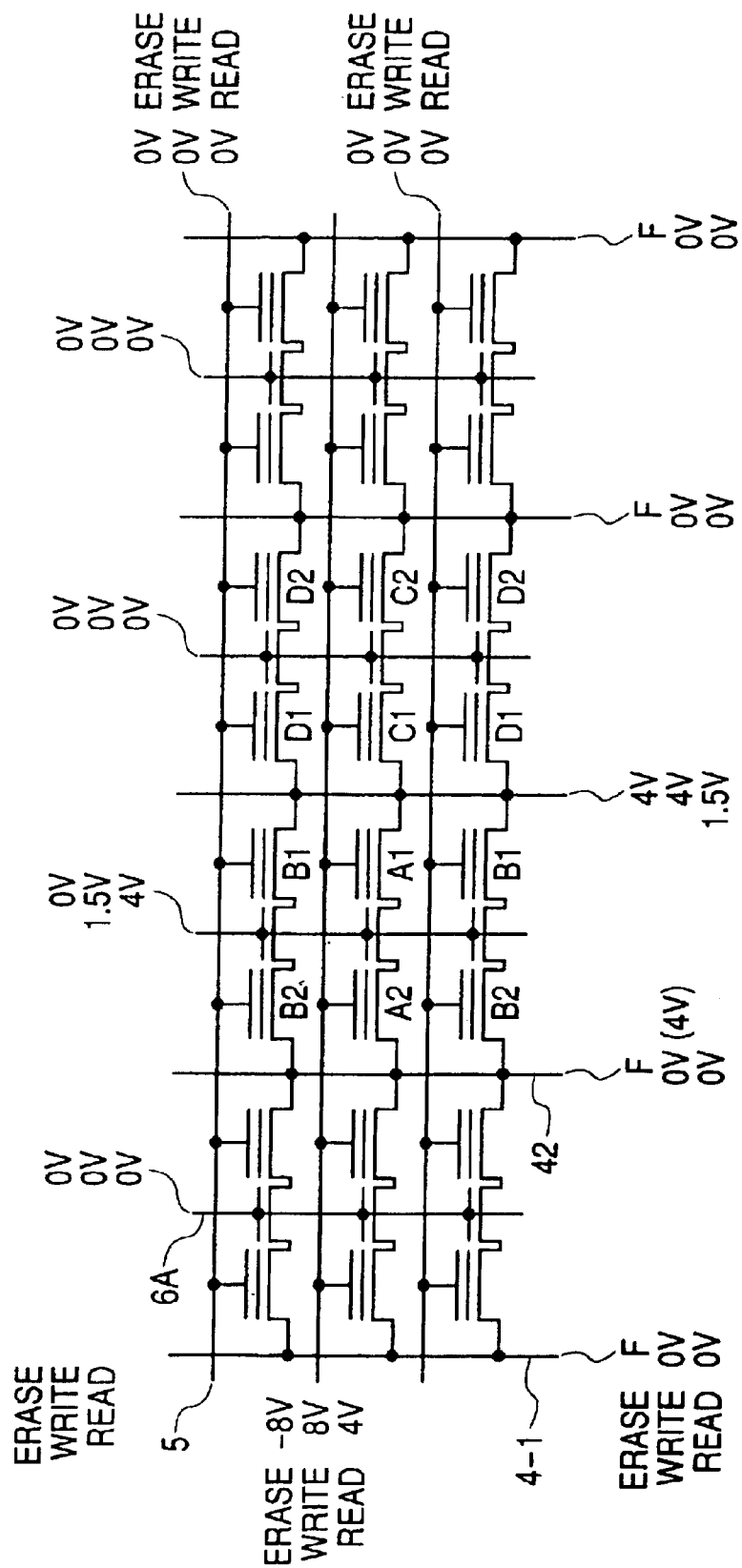
FIG. 98 is a circuit diagram showing voltage bias conditions of a memory operation of the memory cells of the sixth embodiment.
Figure 99:
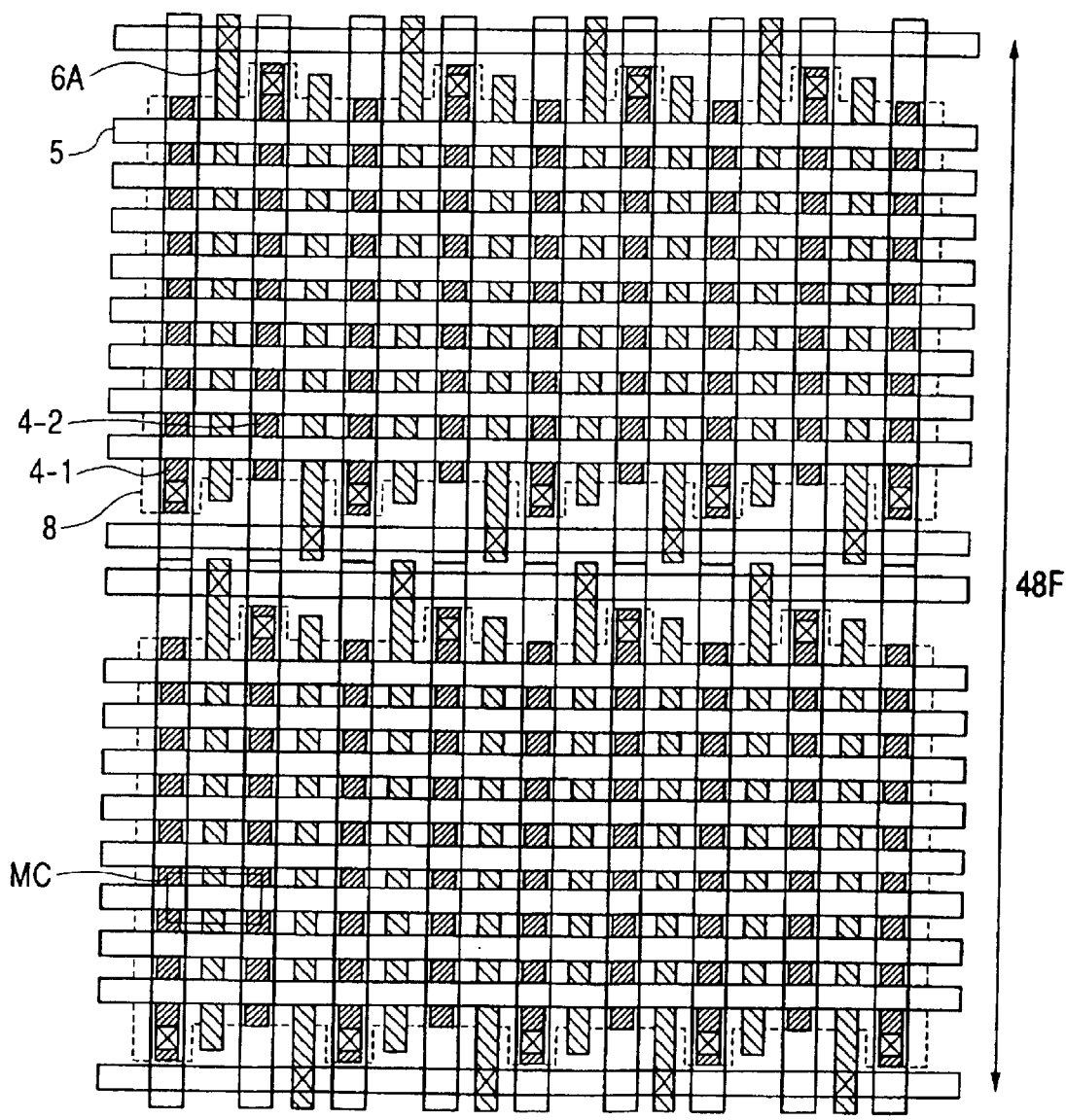
FIG. 99 shows a layout pattern showing a first arrangement example (A & B) of a memory cell array including memory cells of the sixth embodiment.
Figure 100:
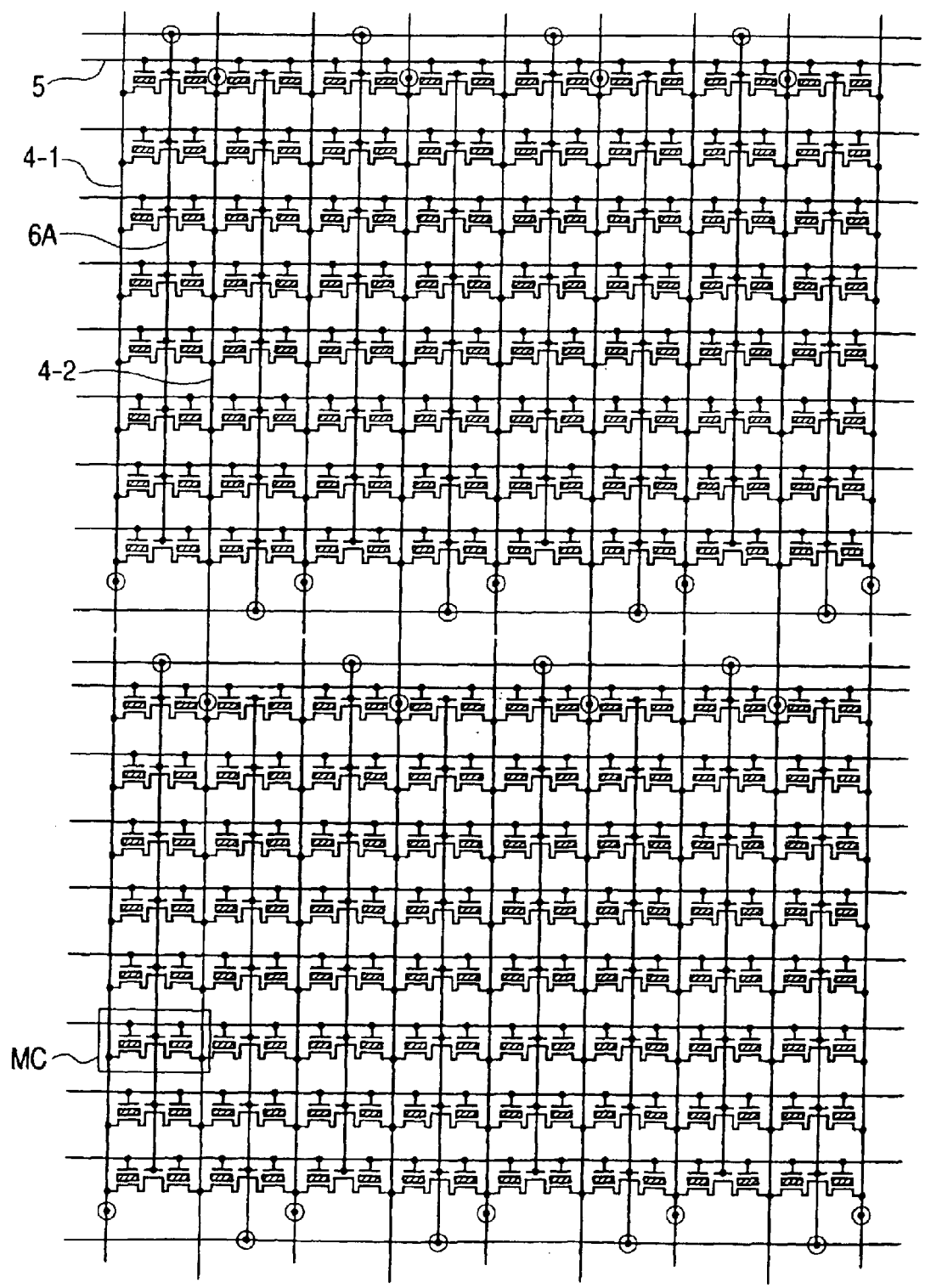
FIG. 100 shows a circuit diagram showing the first arrangement example (A & B) of the memory cell array including the memory cells of the sixth embodiment.
Figure 101:
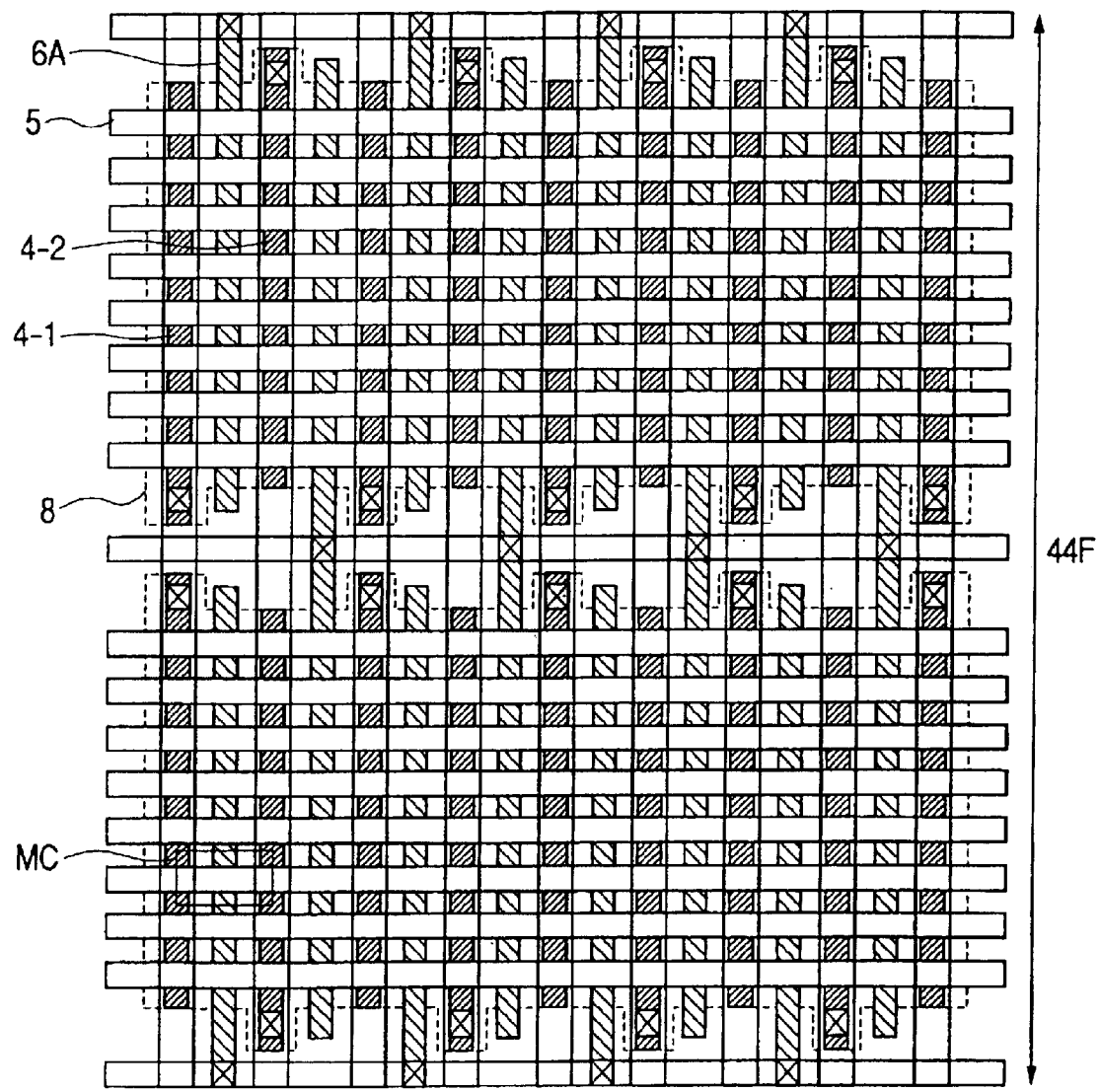
FIG. 101 shows a layout pattern showing a second arrangement example (C & D) of a memory cell array including the memory cells of the sixth embodiment.
Figure 102:
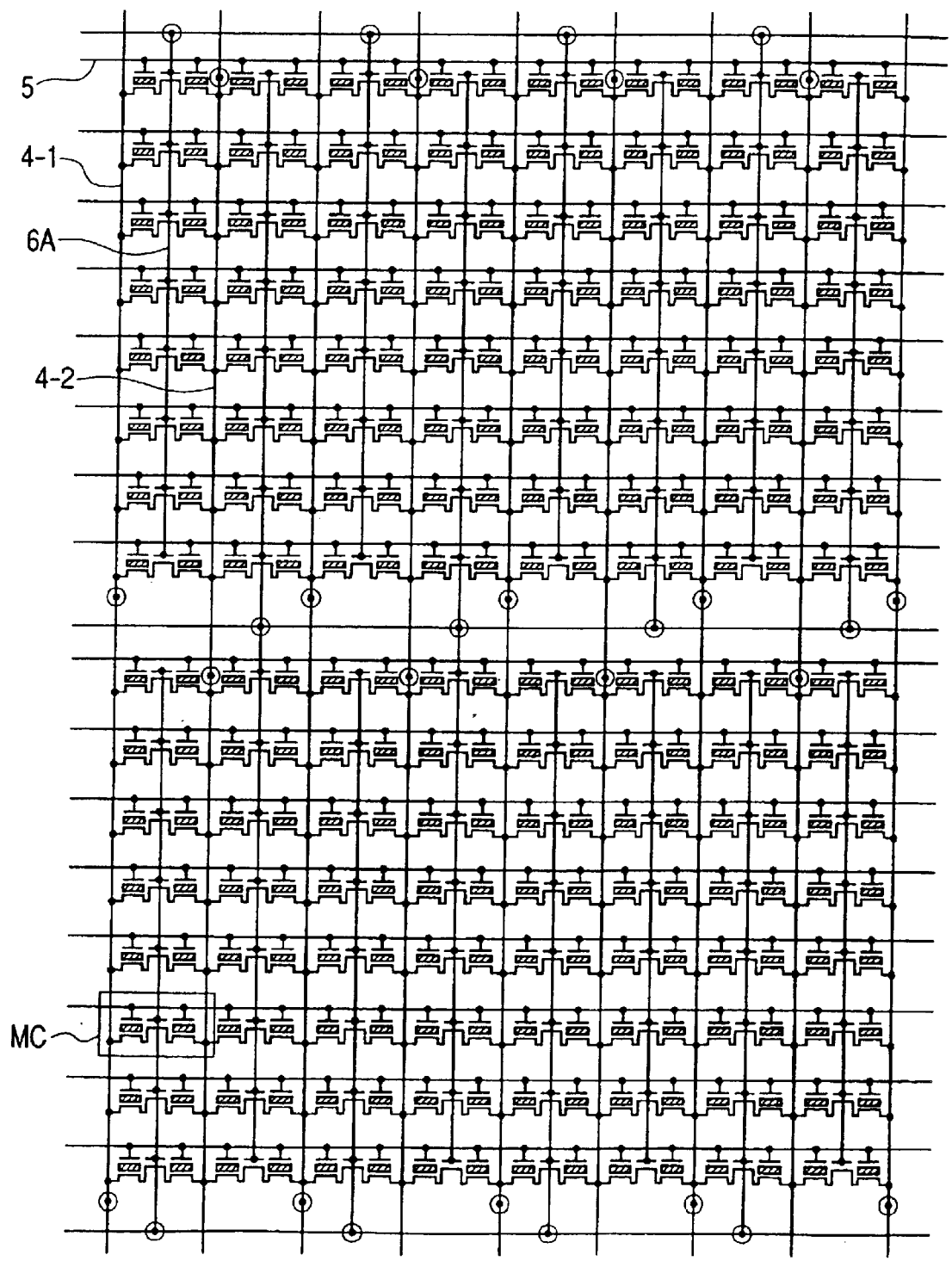
FIG. 102 shows a circuit diagram showing the second arrangement example (C & D) of the memory cell array including the memory cells of the sixth embodiment.

FIG. 98 shows voltage bias conditions of a memory operation of the memory cells shown in FIGS. 95 and 96. At least erase in the word-line is possible because the memory gate electrodes 7-1 and 7-2 of the memory transistors Trmc are connected to the word lines 5, and it can be said that the memory cells can be used in greatly improved convenience as compared with the memory structure shown in FIG. 11 in which erase is carried out in a block unit. In FIG. 98, F means a floating voltage.

FIGS. 99 to 102 exemplify various arrangements of a memory cell array 51 employing the memory cells of the sixth embodiment. The arrangements are roughly divided into an (A & B) system in which the above (A) and (B) systems, each of which is a minimum block unit, are combined and into a (C & D) system in which the (C) and (D) systems, which share a neighboring block and address, are combined, and the layouts and equivalent circuits thereof are illustrated, respectively.

FIGS. 103 to 108 schematically show the cross sections of a device at stages in a manufacturing process of memory cells according to the sixth embodiment described with reference to FIG. 95.

Figure 103:
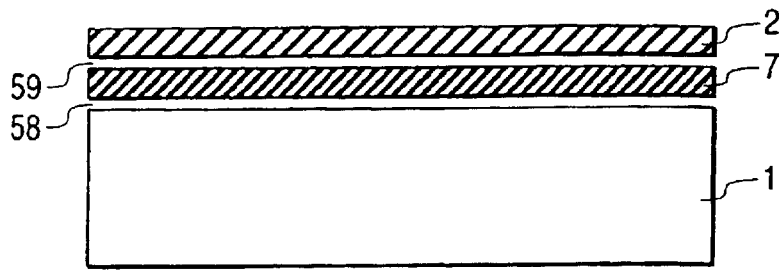
FIGS. 103 to 108 are sectional views of a device at respective stages in a manufacturing process of memory cells of the sixth embodiment.

FIG. 103 shows a cross section in which a gate insulating film 58 of the memory transistors Trmc, an electrode material of a gate insulating film 2 having discrete traps, an interlayer insulating film 59 and further an electrode material of a memory gate electrode 7 are deposited on a silicon semiconductor substrate 1. While a very thin silicon thermal dioxide film, which is formed by subjecting the silicon semiconductor substrate 1 to high-temperature thermal oxidation and has a thickness of 1.8 nm or 5 nm, is used as the gate insulating film 58, any other insulating film such as an oxynitride film and the like may be employed. A silicon nitride thin film having a thickness of 15 nm is used as the electrode material of the gate insulating film 2 having the discrete traps. While a thermal oxide film having a thickness of about 3 nm may be formed by thermally oxidizing the surface of the silicon nitride thin film at high temperature so as to be used as the interlayer insulating film 59, a CVD oxide film deposited by chemical vapor deposition is employed as the interlayer insulating film 59. A poly-silicon thin film having a thickness of 150 nm is used as the electrode material of the memory gate electrode 7.

Figure 104:
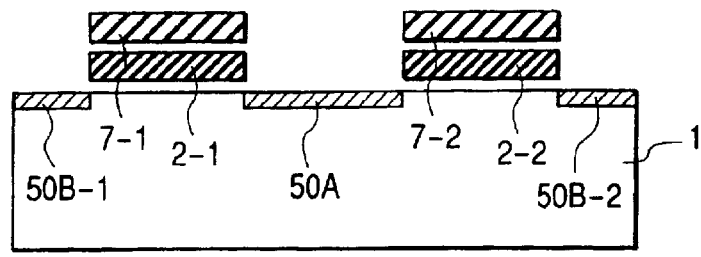

In FIG. 104, the electrode material of the memory gate electrode 7, the interlayer insulating film 59, the electrode material of the gate insulating film 2 having the discrete traps, and further the gate insulating film 58 are subjected to stacked film processing in a bit line direction by anisotropic etch, thereby forming gate the insulating films 2-1 and 2-2 and the memory gate electrodes 7-1 and 7-2, and arsenic (As) is doped to form both a doped channel 50A and low density diffusion layers 50B-1 and 50B-2 for permitting the memory transistors Trmc to withstand a high voltage.

Figure 105:
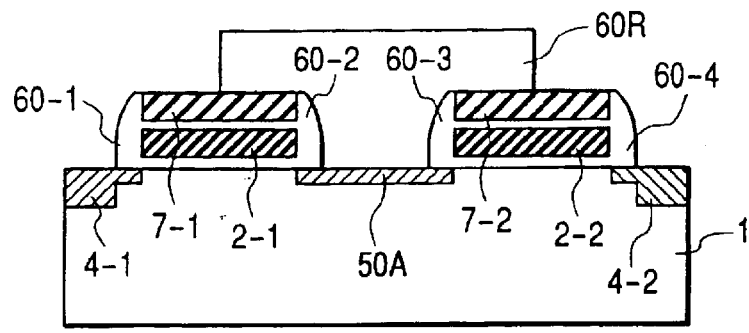

Then, in FIG. 105, side walls 60-1 to 60-4 are formed on side surfaces having been subjected to the stacked film processing, and high density diffusion layers 4-1 and 4-2 are formed on a bit line section by doping arsenic (As) and phosphorous (P) to the bit line section by ion implantation while masking the switch transistor Trsw with a resist 60R. The side walls are formed as residual etchback films making use of that the thick thermal oxide film deposited by CVD is more thickened at stepped portions, and the method of forming it is well known in the art at present.

Figure 106:
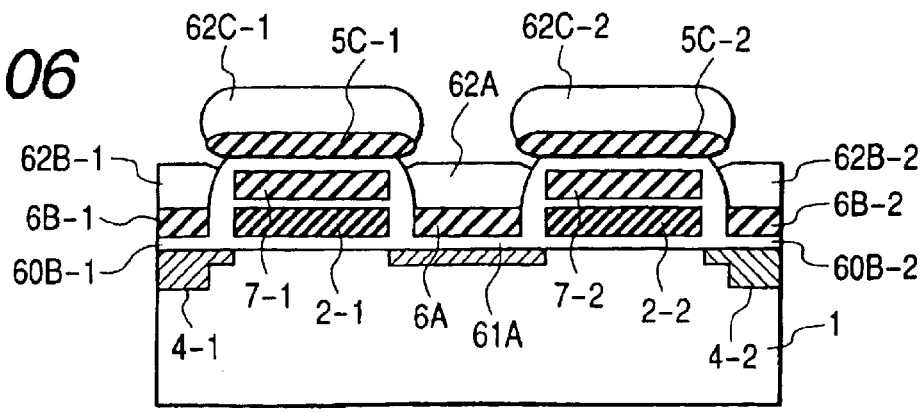

In FIG. 106, a gate oxide film 61A having a thickness of 10 nm and insulating films 61B-1 and 61B-2 for bit line diffusion layers 4-1 and 4-2 are simultaneously formed by thermal oxidation and the switch gate electrode 6A of the switch transistor Trsw and bit line resistance reducing metal lines 6B-1 and 6B-2 are deposited using poly-silicon. Further, insulating films 62A, 62B-1 and 62B-2 are deposited by CVD. At this time, poly-silicon members 5C-1 and 5C-2 and insulating films 62C-1 and 62C-2 formed by CVD are formed also on and protruded from the memory gate electrodes of the memory transistors Trmc.

Figure 107:
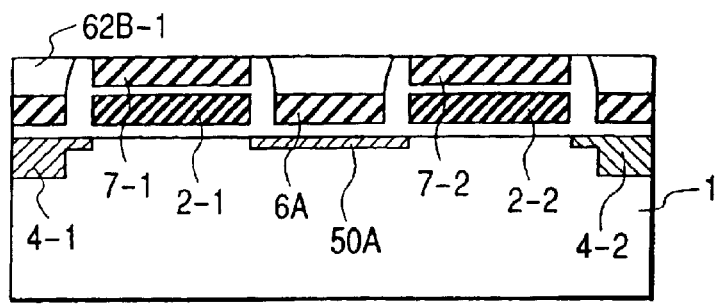

In FIG. 107, the unnecessary poly silicon members 5C-1 and 5C-2, which are shown in FIG. 106, on the memory gate electrodes 7-1 and 7-2 for the memory transistors Trmc and CVD insulating films 12C-1 and 12C-2 are removed. To remove only the films deposited on the memory gate electrodes 7-1 and 7-2 for the memory transistors Trmc, there may be employed a method of removing them by etch using a resist film having openings formed through only the films to be removed by a photo technology. There is also available CMP (chemical mechanical polishing) for chemically and mechanically polishing only protruding portions as a method of not using a photoresist mask. When the memory gate electrodes 7-1 and 7-2, for the memory transistors Trmc are across on a stepped section, the removing method by means of etch using the resist film as a mask is more reliable from a technical point of view.

Figure 108:
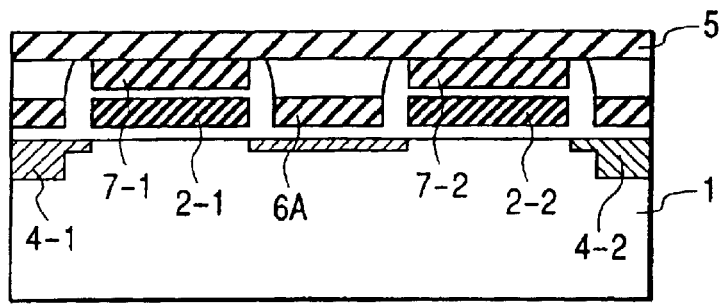

FIG. 108 shows up to a step at which an electrode material for the word line 5 is deposited. While poly-silicon is used as the electrode material for the word line 5, a polyside film, which is made by being overlapped with titanium, tungsten, cobalt or the like which is a high melting point metal, may be used. While it is not apparent here because the memory gate electrodes 7-1 and 7-2 are shown in cross sections, they are separated from each other by being subjected to stacked film processing when the word line is processed. The gate electrode 6A of the switch transistor Trsw and the bit line resistance reducing metal lines 6B-1 and 6B-2 are not subjected to the stacked film processing. Further, since the silicon nitride thin film which is the aggregated body of the discrete traps is used as the store areas 2-1 and 2-2 this time, it is not necessary for the store areas 2-1 and 2-2 to be subjected to stacked film processing from the word line 5. However, when the store areas 2-1 and 2-2 include a conductor such as poly-silicon, the store areas 2-1 and 2-2 also must be separated from the word line 5 by the stacked film processing.

The manufacturing process, which is shown in FIGS. 103 to 108, of the memory cells of FIG. 96 is a method which can easily be taken into an ordinary ultra high density integrated circuit (ULSI) manufacturing method.

<Seventh Embodiment of Memory Cell>

Figure 109:
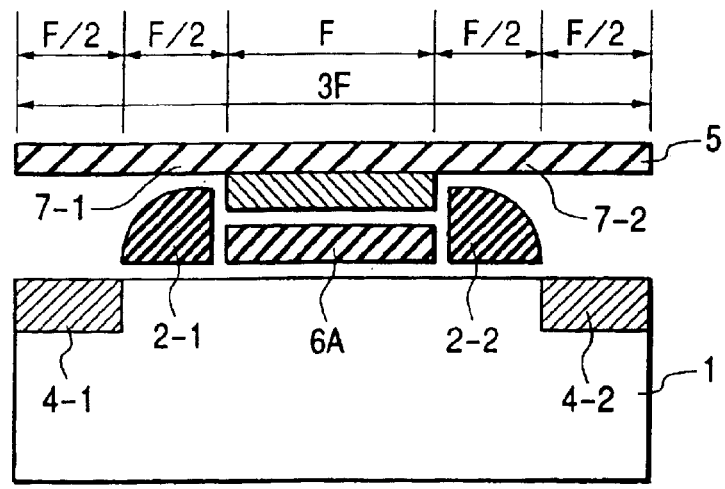
FIG. 109 is a cross-sectional view of a memory cell of a seventh embodiment according to the present invention.

FIG. 109 shows a cross section of a memory cell according to a seventh embodiment. The memory cell shown in the figure is arranged such that the memory gate electrodes 2-1 and 2-2 of memory transistors Trmc are connected to a word line 5, and the memory transistors Trmc are formed on both the side walls of the switch gate electrode 6A of a switch transistor Trsw using a side wall technology. With this arrangement, the memory cell having an area of about 3F2 can be realized.

FIGS. 110 to 114 schematically show the cross sections of a device at stages in a manufacturing process of memory cells according to the seventh embodiment described with reference to FIG. 109.

Figure 110:
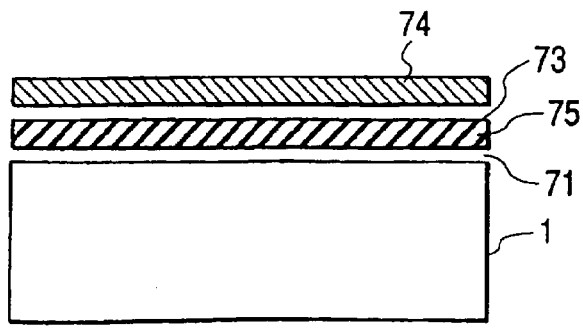
FIGS. 110 to 114 are cross sectional views showing a device at respective stages in a manufacturing process of memory cells of a seventh embodiment.

FIG. 110 shows a structure in which the gate insulating film 71 for the switch transistor Trsw, an electrode material 75 of the switch gate electrode 6A, an interlayer insulating film 73, and an interlayer protection film 74 are deposited. A silicon thermal oxide thin film having a thickness of 10 nm, which is formed by subjecting a silicon semiconductor substrate 1 to high-temperature thermal oxidation, is used as the gate insulating film 71. However, any other insulating film such as an oxynitride film and the like also may be employed. A poly-silicon thin film having a thickness of 150 nm is used as the gate electrode material 75. A CVD oxide film, which is deposited by CVD and has a thickness of about 150 nm, is employed as the interlayer insulating film 73. It is also effective to overlap the CVD oxide film with a silicon nitride film. Further, while a CVD oxide film, which is deposited by CVD and has a thickness of about 150 nm, is used as the interlayer protection film 74, a conductive material may be used in place of the insulating film.

Figure 111:
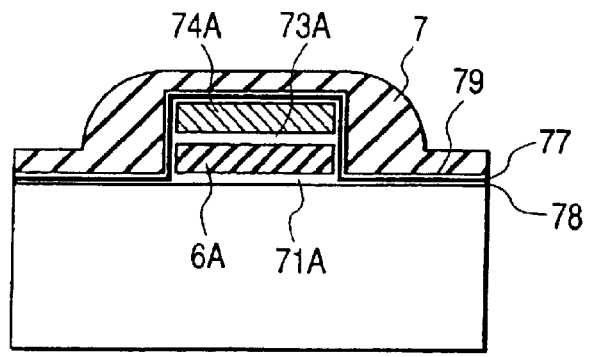

FIG. 111 shows that the interlayer protection film 74, the interlayer insulating film 73, the gate electrode material 75 and further the gate insulating film 71 are subjected to stacked film processing by anisotropic etch in a bit line direction, and the gate insulation film 78 for the memory transistors, a gate insulation film material 77 having discrete traps, an interlayer insulating film 79 and further a memory gate electrode material 7 are deposited on the silicon semiconductor substrate 1. While a very thin silicon thermal dioxide film, which is formed by subjecting the silicon semiconductor substrate 1 to high-temperature thermal oxidation and has a thickness of 1.8 nm or 5 nm, is used as the gate insulating film 78, any other insulating film such as an oxynitride film and the like may be employed. A silicon nitride thin film having a thickness of 15 nm is used as the floating electrode material 77. While a thermal oxide film having a thickness of about 3 nm may be formed by thermally oxidizing the surface of a silicon nitride thin film at high temperature so as to be used as the interlayer insulating film 79, a CVD oxide film deposited by CVD is employed as the interlayer insulation film 79. A poly-silicon thin film having a thickness of 150 nm is used as a memory gate electrode material 7. The poly-silicon thin film is formed on the stepped portions of the side walls of the switch transistor Trsw using a side wall gate technology so that the thin film is made selectively thick.

Figure 112:
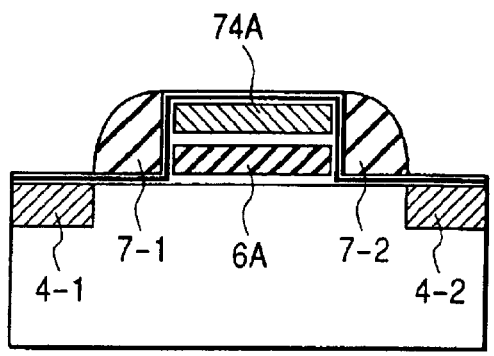

In FIG. 112, side wall gates 7-1 and 7-2 are formed as residual etchback films and high density diffusion layers 4-1 and 4-2 are formed on a bit line section by doping arsenic (As) to the bit line section by ion implantation. The etchback is stopped in front of the silicon nitride thin film 77. It should be noted that the side wall gates 7-1 and 7-2 achieve the role of the memory gate electrodes of the memory transistors Trmc, and the high density diffusion layers 4- and 4-2 of the bit line section correspond to a source and a drain, respectively. To cause the memory transistor Trmc to withstand a high voltage, it is useful to appropriately introduce impurities such as phosphorus (P) which eases an electric field and boron (B) and the like which suppress punch-through to the diffusion layers 4-1 and 4-2.

Figure 113:
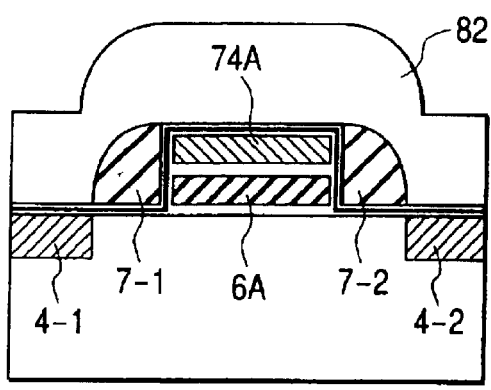
Figure 114:
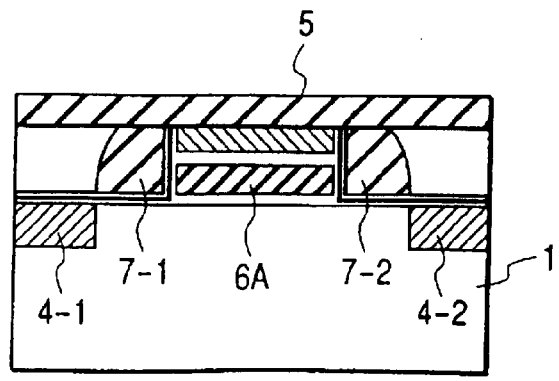

In FIG. 113, an oxide film 82 having a thickness of about 500 nm is deposited by CVD. As shown in FIG. 114, the oxide film 82 is processed by a chemical mechanical polishing technology so that the surface thereof is made flat. At the time, it is necessary that the upper portions of the electrode material of the side wall gates 7-1 and 7-2 be exposed. Thereafter, an electrode material of the word line 5 is deposited. While poly-silicon is used as the electrode material for the word line 5 similarly to the memory cell described with reference to FIG. 96, a polyside film, which is made by being overlapped with titanium, tungsten, cobalt or the like which is a high melting point metal, may be used. While it is not definitely shown here, the memory gate electrodes 7-1 and 7-2 are separated from each other by being subjected to stacked film processing when the word line is processed. At this time, the gate electrode 6A of the switch transistor Trsw is not subjected to stacked film processing. For this purpose, the interlayer protection film 74 includes a material which acts as a stopper of stacked film processing. While it is described previously that a conductive material may be used for the interlayer protection film 74, when the conductive material is used, attention must be paid to the resistance of the material of the side wall gate electrodes against anisotropic etching.

FIGS. 115 to 118 summarize characteristic points when a signal is read from the memory cells of the first to seventh embodiments.

Figure 115:
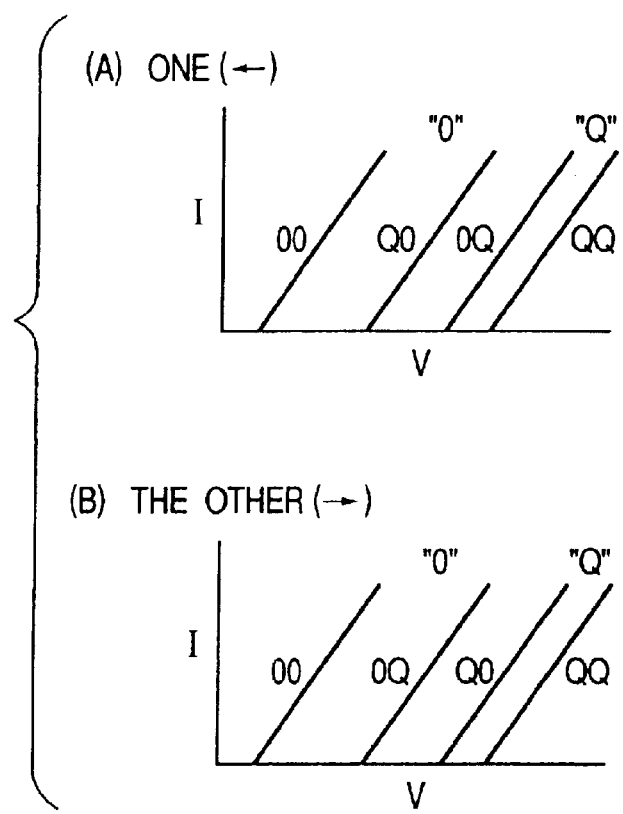
FIG. 115 is a characteristic view showing a relationship between a read memory current and a memory gate voltage of the NROM shown in FIGS. 3 and 4.
Figure 117:
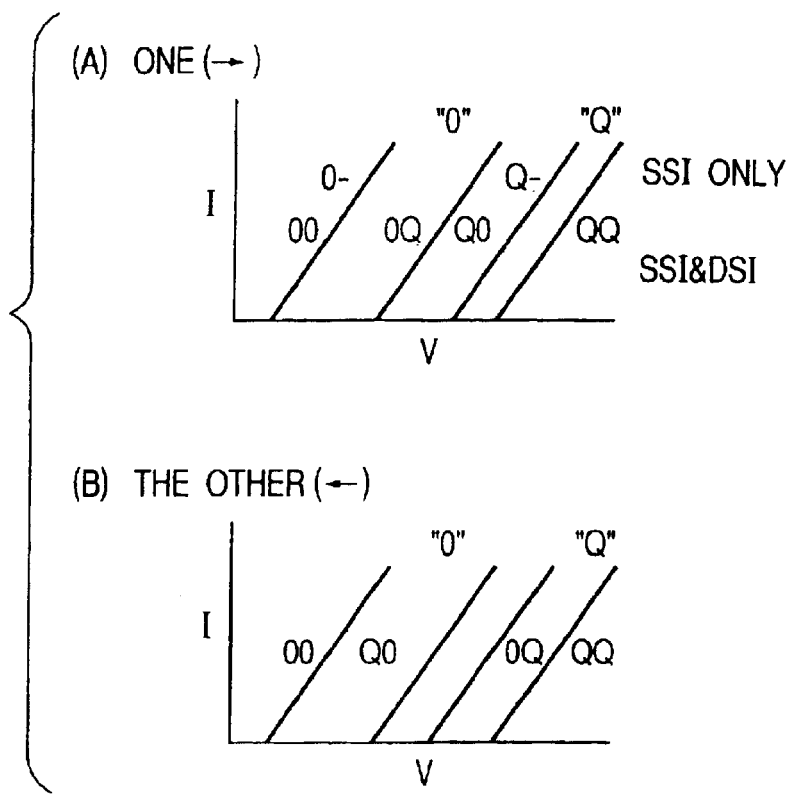
FIG. 117 is a characteristic view showing a relationship between a read memory current and a memory gate voltage of the memory cells of the fourth and fifth embodiments.
Figure 118:
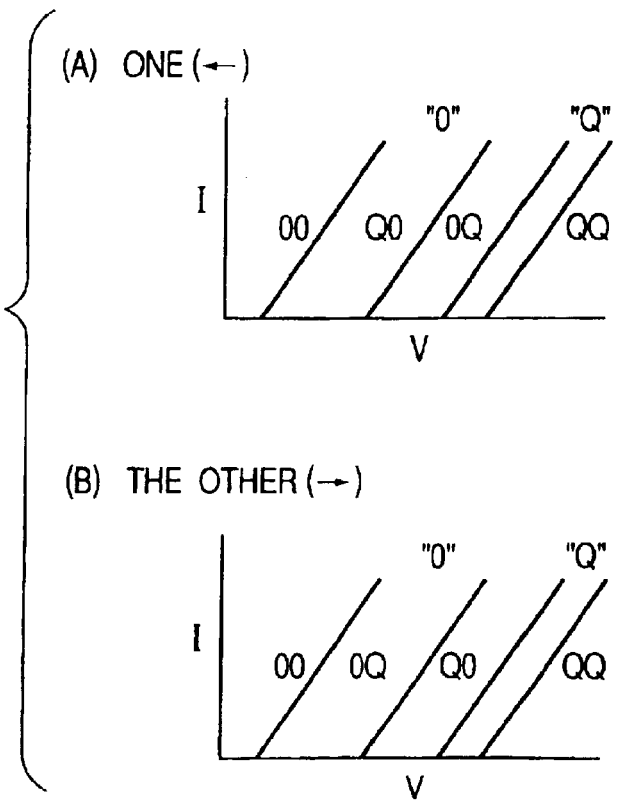
FIG. 118 is a characteristic view showing a relationship between a read memory current and a memory gate voltage of the memory cells of the sixth and seventh embodiments.

When information of 2 bits stored in one memory cell is read by operating the memory cell in a dual-way, even if the information of 2 bits is read by interchanging a read direction, the information of one of the bits influences the information of the other bit when the information of the other bit is read. FIGS. 115 to 118 show a relationship between a memory current and a memory gate voltage when information is read. FIG. 115 shows a relationship between a memory current and a memory gate voltage of the NROM shown in FIG. 4 when information is read, FIG. 116 shows a relationship between a memory current and a memory gate voltage in the memory cells of the first, second and third embodiments when information is read, FIG. 117 shows a relationship between a memory current and a memory gate voltage in the memory cells of the fourth and fifth embodiments when information is read, and FIG. 118 shows a relationship between a memory current and a memory gate voltage in the memory cells of the sixth and seventh embodiments when information is read. The meaning of the respective figures is to be understood according to the conditions described with reference to FIG. 116. The term "One (→)" shows current and voltage characteristics when the information stored on the left side of each memory cell is mainly read, whereas the term "The other (←)" shows current and voltage characteristics when the information stored on the right side of each memory cell is mainly read. The directions of arrows in parentheses show the direction of the carriers of a read current, a symbol "←" means that the carriers of the read current flow from the right side to the left side of each memory cell, whereas a symbol "→" means that the carriers of the read current flow from the left side to the right side of each memory cell.

While a side where program is carried out is determined depending upon whether source side injection is performed or drain side injection is performed, it is a principle that read is carried out using a programmed side as a source side at all times. However, in the memory cells of the fourth and fifth embodiments shown in FIG. 117, even if program is carried out to a drain side, it is devised to carry out read using the programmed side as a drain side because the source lines/bit lines are arranged asymmetrically. Further, in the memory cells of the sixth and seventh embodiments shown in FIG. 118, while one memory cell includes the two memory transistors Trmc and a site where program is carried out is locally set in the gate insulating films, it is intended in the memory cell to carry out read by a current whose direction is opposite to a direction of a current during program.

While the present invention achieved by the inventors has been specifically described with reference to the embodiments, the present invention is by no means limited thereto and it is needless to say that the present invention can be variously modified within the range which does not depart from the gist of the invention.

For example, the gate insulating film having the discrete traps used as the store area is not limited to the silicon nitride film and may include an alumina film and further of conductor particles, for example, poly-silicon or tungsten metal particles discretely buried in an insulating film. It should be noted that while poly-silicon is exemplified as a practically used conductive floating gate material, a metal material such as titanium, nickel, cobalt, tungsten, and the like is promising in the future.

Further, bias voltages during program, erase and read are not limited to the voltages described above and may be appropriately changed. The present invention can widely be applied not only to the nonvolatile memory but also to a semiconductor integrated circuit such as a microcomputer or a data processor having an on-chip nonvolatile memory, which is used as a program memory and a data memory, together with an on-chip CPU and further a system LSI on which a nonvolatile memory cell is mounted together with various types of logic circuits.

What is provided by the above-mentioned embodiments is as shown below.

That is, there can be provided a semiconductor integrated circuit having a nonvolatile memory which has less possibility of detecting a surface current other than a channel current which is detected through a predetermined channel.

It is possible to carry out word-line erase of a multi-storage nonvolatile memory cells.

There can be provided a semiconductor integrated circuit capable of realizing multi-storage nonvolatile memory cells while suppressing an increase in chip area.

There can be realized a semiconductor integrated circuit having a nonvolatile semiconductor memory of high density, high speed and high reliability.

What is claimed is:

1. A semiconductor integrated circuit having nonvolatile memory cells each of which comprises one memory transistor, two switch transistors and two diffusion-layer lines, wherein said memory transistor includes a gate insulating film having discrete traps and a memory gate electrode connected to a word line, said two diffusion-layer lines constitute a source line and a bit line, the switch gate electrodes of said two switch transistors are extended along said source line and said bit line, said two switch transistors are formed between said two diffusion-layer lines, said memory transistor is formed between said two switch transistors and each channel of said one memory transistor and said two switch transistors is formed continuously at the portion between said two diffusion-layer lines.

2. A semiconductor integrated circuit having a memory cell array comprising:

a semiconductor substrate having a main surface;

a plurality of word line formed over said main surface and extending in a first direction;

a plurality of bit line/source line formed in said semiconductor substrate and extending in a second direction, perpendicular to said first direction; and a plurality of nonvolatile memory cells each of which is formed between adjacent two of said bit line/source line and below said word line, and comprises two diffusion layers connected to the corresponding bit line/source line, first and second switch transistors and one memory transistor formed between said first and second switch transistors, wherein said memory transistor includes a gate insulating film having discrete traps and a memory gate electrode connected to said word line, wherein said first switch transistor includes first switch gate electrode, wherein said second switch transistor includes second switch gate electrode, wherein one nonvolatile memory cell shares said bit line/source line with the other nonvolatile memory cell which is neighboring to one nonvolatile memory cell in said first direction, wherein said first switch gate electrode of one nonvolatile memory cell is extended along said bit line/source line and connected to said first switch gate electrode of the other nonvolatile memory cell which is neighboring to one nonvolatile memory cell in said second direction, wherein said second switch gate electrode of one nonvolatile memory cell is extended along said bit line/source and connected to said second switch gate electrode of the other nonvolatile memory cell which is neighboring to one nonvolatile memory cell in said second direction, and, wherein first channel of said first switch transistor, second channel of said memory transistor and third channel of said second switch transistor are formed continuously at the portion of said semiconductor substrate between said two diffusion layers.

3. A semiconductor integrated circuit according to claim 2, wherein said gate insulating film having discrete traps includes a silicon nitride film.

4. A semiconductor integrated circuit according to claim 2, wherein two edges of said gate insulating film having discrete traps memorize one bit information respectively, and wherein said nonvolatile memory cell memorizes two bit information.

5. A semiconductor integrated circuit according to claim 4, wherein said nonvolatile memory cell has an area of $8F^2$, and an area for one bit information is $4F^2$.

6. A semiconductor integrated circuit according to claim 4, wherein each of said first and second switch gate electrodes consists of side wall gate electrode, and said nonvolatile memory cell has an area smaller than $8F^2$.

* * * * *